United States Patent
Mauck et al.

(10) Patent No.: US 10,214,037 B2
(45) Date of Patent: Feb. 26, 2019

(54) GAS ENCLOSURE SYSTEMS AND METHODS UTILIZING MULTI-ZONE CIRCULATION AND FILTRATION

(71) Applicant: Kateeva, Inc., Newark, CA (US)

(72) Inventors: Justin Mauck, Belmont, CA (US); Alexander Sou-Kang Ko, Santa Clara, CA (US); Eliyahu Vronsky, Los Altos, CA (US); Prahallad Iyengar, Santa Clara, CA (US); Digby Pun, San Jose, CA (US)

(73) Assignee: Kateeva, Inc., Newark, CA (US)

( * ) Notice: Subject to any disclaimer, the term of this patent is extended or adjusted under 35 U.S.C. 154(b) by 0 days.

(21) Appl. No.: 15/839,942

(22) Filed: Dec. 13, 2017

(65) Prior Publication Data

US 2018/0162151 A1   Jun. 14, 2018

Related U.S. Application Data

(63) Continuation of application No. 15/046,381, filed on Feb. 17, 2016, now Pat. No. 9,873,273, which is a
(Continued)

(51) Int. Cl.
*B41J 29/377* (2006.01)
*B41J 29/06* (2006.01)
(Continued)

(52) U.S. Cl.
CPC .......... *B41J 29/06* (2013.01); *B01D 46/0039* (2013.01); *B41J 2/01* (2013.01); *B41J 29/02* (2013.01);
(Continued)

(58) Field of Classification Search
CPC . B41J 29/06; B41J 2/01; B41J 29/377; B01D 46/0039; H01L 51/56; H01L 51/0004
See application file for complete search history.

(56) References Cited

U.S. PATENT DOCUMENTS 6,340,225 B1   1/2002   Szlucha
6,390,618 B1   5/2002   Wotton et al.
(Continued)

FOREIGN PATENT DOCUMENTS

CN   100573929        12/2009
CN   102245339 A     11/2011
(Continued)

OTHER PUBLICATIONS

International Search Report and Written Opinion dated Oct. 8, 2015, to PCT Application PCT/US15/40810.
(Continued)

*Primary Examiner* — Sharon A Polk
(74) *Attorney, Agent, or Firm* — Paula J. Tostado

(57) ABSTRACT

The present teachings relate to various embodiments of a gas enclosure system that can have a particle control system that can include a multi-zone gas circulation and filtration system, a low-particle-generating X-axis linear bearing system for moving a printhead assembly relative to a substrate, a service bundle housing exhaust system, and a printhead assembly exhaust system. Various components of a particle control system can include a tunnel circulation and filtration system that can be in flow communication with bridge circulation and filtration system. Various embodiments of a tunnel circulation and filtration system can provide cross-flow circulation and filtration of gas about a floatation table of a printing system. Various embodiments of a gas enclosure system can have a bridge circulation and filtration system that can provide circulation and filtration of gas about a printing system bridge and related apparatuses and devices. Accordingly, various embodiments of a gas circulation and filtration system as disclosed herein can effectively remove both airborne particulate matter, as well as particulate matter generated proximal to a substrate during a
(Continued)

printing process. As such, various embodiments of a gas circulation and filtration system in conjunction with various embodiments of a gas purification system of the present teachings can provide for a controlled manufacturing environment resulting in a high-yield of OLED various devices.

31 Claims, 24 Drawing Sheets

Related U.S. Application Data continuation of application No. 14/801,653, filed on Jul. 16, 2015, now Pat. No. 9,278,564.

(60) Provisional application No. 62/034,718, filed on Aug. 7, 2014, provisional application No. 62/026,242, filed on Jul. 18, 2014.

(51) Int. Cl.
  *B41J 29/02* (2006.01)
  *B01D 46/00* (2006.01)
  *B41J 2/01* (2006.01)
  *H01L 51/00* (2006.01)
  *H01L 51/56* (2006.01)

(52) U.S. Cl.
  CPC ........ *B41J 29/377* (2013.01); *H01L 51/0004* (2013.01); *H01L 51/56* (2013.01)

(56) References Cited

U.S. PATENT DOCUMENTS

| | | |
|---|---|---|
| 9,278,564 B2 | 3/2016 | Mauck et al. |
| 9,873,273 B2 | 1/2018 | Mauck et al. |
| 2004/0003738 A1 | 1/2004 | Imiolek et al. |
| 2006/0103694 A1 | 5/2006 | Nguyen |
| 2008/0012189 A1 | 1/2008 | Manz |
| 2010/0089880 A1 | 4/2010 | Sercel et al. |
| 2010/0201749 A1 | 8/2010 | Somekh et al. |
| 2012/0171873 A1 | 7/2012 | Chung et al. |
| 2013/0206058 A1 | 8/2013 | Mauck et al. |
| 2014/0253616 A1 | 9/2014 | Tremel |
| 2015/0373305 A1 | 12/2015 | Hauf et al. |

FOREIGN PATENT DOCUMENTS

| | | |
|---|---|---|
| CN | 103828085 B | 8/2016 |
| TW | 550183 B | 9/2003 |
| TW | 200807739 A | 2/2008 |
| TW | 201029780 B | 2/2016 |

OTHER PUBLICATIONS

Non-Final Office Action dated Apr. 24, 2017 for U.S. Appl. No. 15/046,381.
Non-Final Office Action dated Sep. 8, 2016 for U.S. Appl. No. 15/046,381.
Notice of Allowance dated Jan. 20, 2016, to U.S. Appl. No. 14/801,653.
Notice of Allowance dated Sep. 18, 2017, to U.S. Appl. No. 15/046,381.
EP Extended Search Report dated Mar. 1, 2018, to EP Patent Application No. 15821581.4.
Examination report dated Jul. 18, 2018, to TW patent application No. 104123217.
Office action dated Oct. 8, 2018, to CN Patent Application No. 201580039000.5.

GAS ENCLOSURE SYSTEMS AND METHODS UTILIZING MULTI-ZONE CIRCULATION AND FILTRATION

CROSS REFERENCE TO RELATED CASES

This application is a continuation of U.S. application Ser. No. 15/046,381, filed Feb. 2, 2017. U.S. application Ser. No. 15/046,381 is a continuation of Ser. No. 14/801,653, filed Jul. 16, 2015. U.S. application Ser. No. 14/801,653 claims benefit to U.S. Provisional Application No. 62/026,242, filed Jul. 18, 2014 and to U.S. Provisional Application No. 62/034,718, filed Aug. 7, 2014. All applications identified in this section are incorporated herein by reference; each in its entirety.

OVERVIEW

Interest in the potential of organic light-emitting diode (OLED) display technology has been driven by OLED display technology attributes that include demonstration of display panels that have highly saturated colors, are high-contrast, ultrathin, fast-responding, and energy efficient. Additionally, a variety of substrate materials, including flexible polymeric materials, can be used in the fabrication of OLED display technology. Though the demonstration of displays for small screen applications, primarily for cell phones, has served to emphasize the potential of the technology, challenges remain in scaling high volume manufacturing across a range of substrate formats in high yield.

With respect to scaling of formats, a Gen 5.5 substrate has dimensions of about 130 cm×150 cm and can yield about eight 26" flat panel displays. In comparison, larger format substrates can include using Gen 7.5 and Gen 8.5 mother glass substrate sizes. A Gen 7.5 mother glass has dimensions of about 195 cm×225 cm, and can be cut into eight 42" or six 47" flat panel displays per substrate. The mother glass used in Gen 8.5 is approximately 220 cm×250 cm, and can be cut to six 55" or eight 46" flat panel displays per substrate. One indication of the challenges that remain in scaling of OLED display manufacturing to larger formats is that the high-volume manufacture of OLED displays in high yield on substrates larger than Gen 5.5 substrates has proven to be substantially challenging.

In principle, an OLED device may be manufactured by the printing of various organic thin films, as well as other materials, on a substrate using an OLED printing system. Such organic materials can be susceptible to damage by oxidation and other chemical processes. Housing an OLED printing system in a fashion that can be scaled for various substrate sizes and can be done in an inert, substantially low-particle printing environment can present a variety of engineering challenges. Manufacturing tools for high throughput large-format substrate printing, for example, such as printing of Gen 7.5 and Gen 8.5 substrates, require substantially large facilities. Accordingly, maintaining a large facility under an inert atmosphere, requiring gas purification to remove reactive atmospheric species, such as water vapor, oxygen and ozone, as well as organic solvent vapors, as well as maintaining a substantially low-particle printing environment, has proven to be significantly challenging.

As such, challenges remain in scaling high volume manufacturing of OLED display technology across a range of substrate formats in high yield. Accordingly, there exists a need for various embodiments a gas enclosure system of the present teachings that can house an OLED printing system, in an inert, substantially low-particle environment, and can be readily scaled to provide for fabrication of OLED panels on a variety of substrates sizes and substrate materials. Additionally, various gas enclosure systems of the present teachings can provide for ready access to an OLED printing system from the exterior during processing and ready access to the interior for maintenance with minimal downtime.

BRIEF DESCRIPTION OF THE DRAWINGS

A better understanding of the features and advantages of the present disclosure will be obtained by reference to the accompanying drawings, which are intended to illustrate, not limit, the present teachings.

DETAILED DESCRIPTION OF THE DISCLOSURE

Figure 1A:
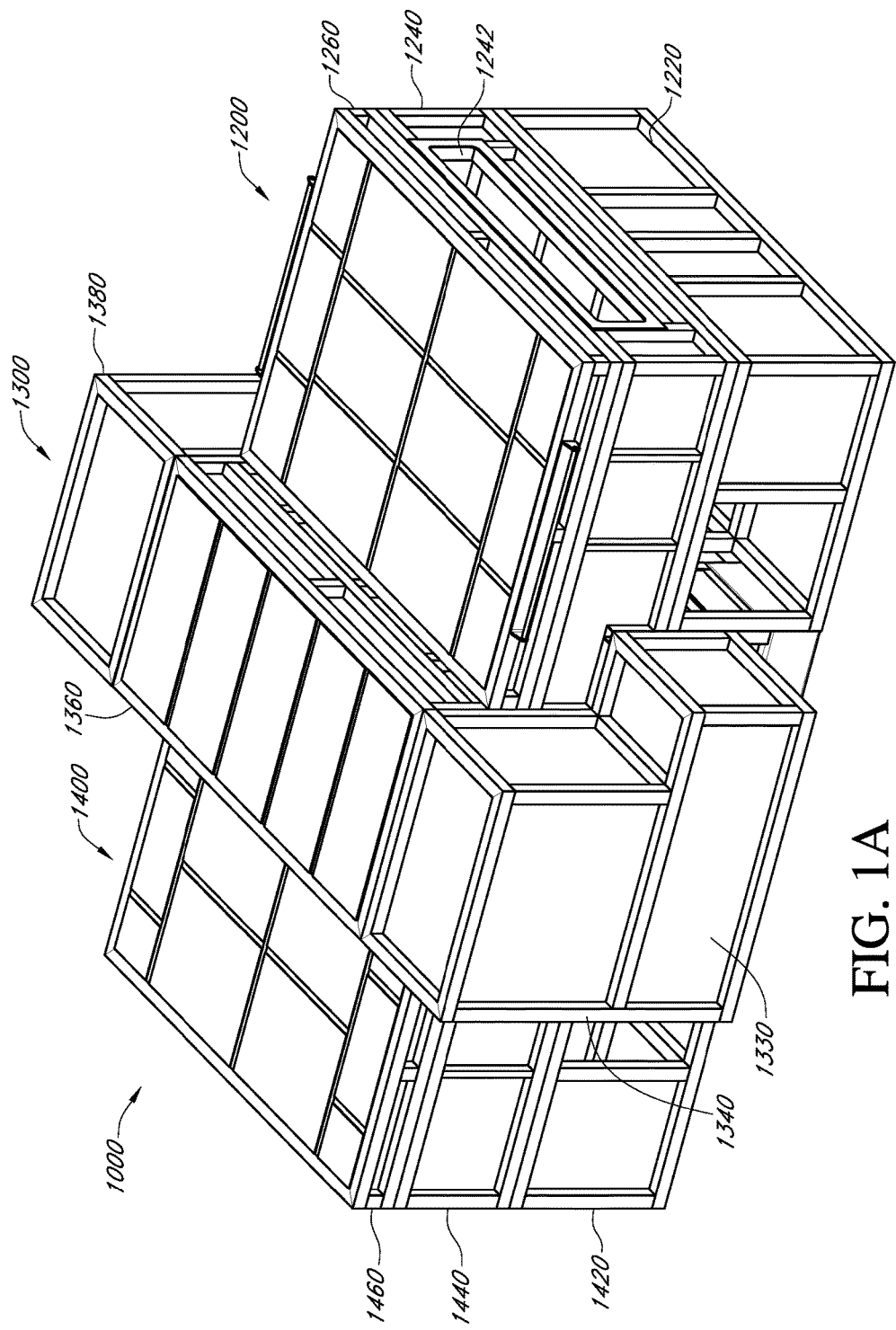
FIG. 1A is a front perspective view of view of a gas enclosure assembly in accordance with various embodiments of the present teachings.

The present teachings disclose various embodiments of a gas enclosure assembly that can house, for example, an OLED printing system for printing an OLED substrate. Various embodiments of a gas enclosure assembly can be sealably constructed and integrated with various components that provide a gas circulation and filtration system, a particle control system, a gas purification system, and a thermal regulation system and the like to form various embodiments of a gas enclosure system with a controlled environment that can provide an inert gas environment that is substantially low-particle for processes requiring such an environment. Various embodiments of a gas enclosure can have a printing system enclosure and an auxiliary enclosure constructed as a section of a gas enclosure assembly, which can be sealably isolated from the printing system enclosure of a gas enclosure.

According to systems and methods of the present teachings, various embodiments of a gas enclosure system can have a gas circulation and filtration system in which gas can be circulated and filtered in various zones. In various embodiments of gas enclosure systems and methods, a gas circulation and filtration system can have a tunnel circulation and filtration zone that provides, for example, but not limited by, a cross-flow of gas across a substrate support apparatus. According to systems and methods of the present teachings, various embodiments of a multi-zone gas circulation and filtration system can have a printing system baffle assembly that is configured to circulate gas across a substrate support apparatus to provide a cross-flow circulation path that is across the direction of substrate travel. In various embodiments of systems and methods of the present teachings, the cross-flow of gas across a substrate support apparatus in a tunnel circulation and filtration zone can be substantially laminar, thereby providing for a low-particle environment throughout a tunnel enclosure section. Additionally, for systems and methods of the present teachings, the cross flow of gas in a printing region proximal to a substrate can remove particles that may be generated by various printing system devices and apparatuses. As such, in addition to providing a low-particle environment throughout a tunnel enclosure section, the cross flow of gas in a printing region proximal to a substrate provides for a low-particle environment in a printing area proximal to a substrate.

Various embodiments of a multi-zone circulation and filtration system of the present teachings can have a bridge circulation and filtration zone that can provide circulation and filtration of gas through a printing system bridge and related apparatuses and devices and away from a substrate in a printing region. For various embodiments of a gas enclosure, a tunnel baffle plate can be used to direct gas flow through an opening in the tunnel baffle plate that creates a transition-flow zone into a bridge circulation and filtration zone of gas enclosure. As such, the flow of gas from a transition-flow zone through a bridge circulation and filtration zone provides for moving particles away from a substrate in a printing region, thereby providing for a low-particle printing environment. Various embodiments of a multi-zone circulation and filtration system according to the present teachings can have a bridge baffle plate and a bridge circulation and filtration output plenum with a differ that can circulate gas about a printing system bridge and related apparatuses and devices. As such, the flow of gas from a bridge circulation and filtration output plenum through a bridge circulation and filtration zone provides for moving particles away from a substrate in a printing region, thereby providing for a low-particle printing environment.

Accordingly, various embodiments of a multi-zone gas circulation and filtration system of the present teachings can effectively remove both airborne particulate matter in various sections of a gas enclosure, as well as particulate matter generated proximal to a substrate during a printing process.

For clearer perspective regarding substrate sizes that can be used in manufacturing of various OLED devises, generations of mother glass substrate sizes have been undergoing evolution for flat panel displays fabricated by other-than OLED printing since about the early 1990's. The first generation of mother glass substrates, designated as Gen 1, is approximately 30 cm×40 cm, and therefore could produce a 15" panel. Around the mid-1990's, the existing technology for producing flat panel displays had evolved to a mother glass substrate size of Gen 3.5, which has dimensions of about 60 cm×72 cm. In comparison, a Gen 5.5 substrate has dimensions of about 130 cm×150 cm.

As generations have advanced, mother glass sizes for Gen 7.5 and Gen 8.5 are in production for other-than OLED printing fabrication processes. A Gen 7.5 mother glass has dimensions of about 195 cm×225 cm, and can be cut into eight 42" or six 47" flat panels per substrate. The mother glass used in Gen 8.5 is approximately 220×250 cm, and can be cut to six 55" or eight 46" flat panels per substrate. The promise of OLED flat panel display for qualities such as truer color, higher contrast, thinness, flexibility, transparency, and energy efficiency have been realized, at the same time that OLED manufacturing is practically limited to G 3.5 and smaller. Currently, OLED printing is believed to be the optimal manufacturing technology to break this limitation and enable OLED panel manufacturing for not only mother glass sizes of Gen 3.5 and smaller, but at the largest mother glass sizes, such as Gen 5.5, Gen 7.5, and Gen 8.5. One of the features of OLED panel display technology includes that a variety of substrate materials can be used, for example, but not limited by, a variety of glass substrate materials, as well as a variety of polymeric substrate materials. In that regard, sizes recited from the terminology arising from the use of glass-based substrates can be applied to substrates of any material suitable for use in OLED printing.

Manufacturing tools that in principle can allow for the printing of a variety of substrate sizes that includes large-format substrate sizes, can require substantially large facilities for housing such OLED manufacturing tools. Accordingly, maintaining an entire large facility under an inert atmosphere presents engineering challenges, such as continual purification of a large volume of an inert gas. Various embodiments of a gas enclosure system can have a circulation and filtration system internal a gas enclosure assembly in conjunction with a gas purification system external a gas enclosure that together can provide continuous circulation of a substantially low-particulate inert gas having substantially low levels of reactive species throughout a gas enclosure system. According to the present teachings, an inert gas may be any gas that does not undergo a chemical reaction under a defined set of conditions. Some commonly used non-limiting examples of an inert gas can include nitrogen, any of the noble gases, and any combination thereof. Additionally, providing a large facility that is essentially hermetically sealed to prevent contamination of various reactive atmospheric gases, such as water vapor, oxygen and ozone, as well as organic solvent vapors generated from various printing process poses an engineering challenge. According to the present teachings, an OLED printing facility would maintain levels for each species of various reactive species, including various reactive atmospheric gases, such as water vapor, oxygen and ozone, as well as organic solvent vapors at 100 ppm or lower, for example, at 10 ppm or lower, at 1.0 ppm or lower, or at 0.1 ppm or lower.

The need for printing an OLED panel in a facility in which the levels of each of a reactive species should be maintained at targeted low levels can be illustrated in reviewing the information summarized in Table 1. The data summarized on Table 1 resulted from the testing of each of a test coupon comprising organic thin film compositions for each of red, green, and blue, fabricated in a large-pixel, spin-coated device format. Such test coupons are substantially easier to fabricate and test for the purpose of rapid evaluation of various formulations and processes. Though test coupon testing should not be confused with lifetime testing of a printed panel, it can be indicative of the impact of various formulations and processes on lifetime. The results shown in the table below represent variation in the process step in the fabrication of test coupons in which only the spin-coating environment varied for test coupons fabricated in a nitrogen environment where reactive species were less than 1 ppm compared to test coupons similarly fabricated but in air instead of a nitrogen environment.

It is evident through the inspection of the data in Table 1 shown below for test coupons fabricated under different processing environments, particularly in the case of red and blue, that printing in an environment that effectively reduces exposure of organic thin film compositions to reactive species may have a substantial impact on the stability of various ELs, and hence on lifetime. The lifetime specification is of particular significance for OLED panel technology, as this correlates directly to display product longevity; a product specification for all panel technologies, which has been challenging for OLED panel technology to meet. In order to provide panels meeting requisite lifetime specifications, levels of each of a reactive species, such as water vapor, oxygen, and ozone, as well as organic solvent vapors, can be maintained at 100 ppm or lower, for example, at 10 ppm or lower, at 1.0 ppm or lower, or at 0.1 ppm or lower with various embodiments of a gas enclosure system of the present teachings.

TABLE 1

Impact of inert gas processing on lifetime for OLED panels

| Color | Process Environment | V @ 10 mA/cm² | Cd/A | CIE (x, y) @ 1000 Cd/m² | T95 | T80 | T50 |
|---|---|---|---|---|---|---|---|
| Red | Nitrogen | 6 | 9 | (0.61, 0.38) | 200 | 1750 | 10400 |
| | Air | 6 | 8 | (0.60, 0.39) | 30 | 700 | 5600 |
| Green | Nitrogen | 7 | 66 | (0.32, 0.63) | 250 | 3700 | 32000 |
| | Air | 7 | 61 | (0.32, 0.62) | 250 | 2450 | 19700 |
| Blue | Nitrogen | 4 | 5 | (0.14, 0.10) | 150 | 750 | 3200 |
| | Air | 4 | 5 | (0.14, 0.10) | 15 | 250 | 1800 |

In addition to providing an inert environment, maintaining a substantially low-particle environment for OLED printing is of particular importance, as even very small particles can lead to a visible defect on an OLED panel. Particle control in a gas enclosure system can present significant challenges not presented for processes that can be done, for example, in atmospheric conditions under open air, high flow laminar flow filtration hoods. For example, of a manufacturing facility can require a substantial length of various service bundles that can be operatively connected from various systems and assemblies to provide optical, electrical, mechanical, and fluidic connections required to operate, for example, but not limited by, a printing system. Such service bundles used in the operation of a printing system and located proximal to a substrate positioned for printing can be an ongoing source of particulate matter. Additionally, components used in a printing system, such as fans or linear motion systems that use friction bearing, can be particle generating components. Various embodiments of a gas circulation and filtration system of the present teachings can be used in conjunction with particle control components to contain and exhaust particulate matter. Additionally, by using a variety of intrinsically low-particle generating pneumatically operated components, such as, but not limited by, substrate floatation tables, air bearings, and pneumatically operated robots, and the like, a low particle environment for various embodiments of a gas enclosure system can be maintained.

Regarding maintaining a substantially low-particle environment, various embodiments of a multi-zone gas circulation and filtration system can be designed to provide a low particle inert gas environment for airborne particulates meeting the standards of International Standards Organization Standard (ISO) 14644-1:1999, "Cleanrooms and associated controlled environments—Part 1: Classification of air cleanliness," as specified by Class 1 through Class 5. However, controlling airborne particulate matter alone is not sufficient for providing a low-particle environment proximal to a substrate during, for example, but not limited by, a printing process, as particles generated proximal to a substrate during such a process can accumulate on a substrate surface before they can be swept through a gas circulation and filtration system.

Accordingly, in conjunction with a gas circulation and filtration system, various embodiments of a gas enclosure system of the present teachings can have a particle control system that can include components that can provide a low-particle zone proximal to a substrate during processing in a printing step. A particle control system for various embodiments of a gas enclosure system of the present teachings can include a multi-zone gas circulation and filtration system, a low-particle-generating X-axis linear bearing system for moving a printhead assembly relative to a substrate, a service bundle housing exhaust system, and a printhead assembly exhaust system. For example, a gas enclosure system can have a gas circulation and filtration system internal a gas enclosure assembly.

For systems and methods of the present teachings, various embodiments of a gas enclosure can have gas circulation and filtration in various zones. For example, a tunnel circulation zone of a gas enclosure can provide for the circulation of gas across a substrate support apparatus in a tunnel circulation and filtration zone to provide a cross-flow circulation path that is across the direction of substrate travel. In various embodiments of systems and methods of the present teachings, the cross-flow of gas across a substrate support apparatus in a tunnel circulation zone of a gas enclosure can be substantially laminar. Gas enclosure having a tunnel circulation zone can have a transition-flow zone proximal to a carriage assembly that draws gas away from a substrate located below the carriage assembly. Various embodiments of a gas enclosure system can have a bridge circulation and filtration zone that can provide circulation and filtration of gas about a printing system bridge and related apparatuses and devices, and is in flow communication with the transition-flow zone. Such internal filtration systems can have a plurality of fans for circulation of air, where each fan can be in serial flow communication with a heat exchanger for thermal control of the gas and a filtration unit providing control of circulating particulate matter. For various embodiments of a gas enclosure system, fan filter units can be used to circulate and filter gas, and a heat exchanger can be in flow communication with each fan filter unit. Although a flow of gas generated by a circulation and filtration system need not be laminar, a laminar flow of gas can be used to ensure thorough and complete turnover of gas in the interior. A laminar flow of gas can also be used to minimize turbulence, such turbulence being undesirable as it can cause particles in the environment to collect in such areas of turbulence, preventing the filtration system from removing those particles from the environment.

Various embodiments of systems and methods of the present teachings can maintain a substantially low-particle environment providing for an average on-substrate distribution of particles of a particular size range of interest that does not exceed an on-substrate deposition rate specification. An on-substrate deposition rate specification can be set for each of a particle size range of interest of between about 0.1 µm and greater to about 10 µm and greater. In various embodiments systems and methods of the present teachings, an on-substrate particle deposition rate specification can be expressed as a limit of the number of particles deposited per square meter of substrate per minute for each of a target particle size range.

Various embodiments of an on-substrate particle deposition rate specification can be readily converted from a limit of the number of particles deposited per square meter of substrate per minute to a limit of the number of particles deposited per substrate per minute for each of a target particle size range. Such a conversion can be readily done through a known relationship between substrates, for example, of a specific generation-sized substrate and the corresponding area for that substrate generation. For example, Table 2 below summarizes aspect ratios and areas for some known generation-sized substrates. It should be understood that a slight variation of aspect ratio and hence size may be seen from manufacturer to manufacturer. However, regardless of such variation, a conversion factor for a specific generation-sized substrate and an area in square meters can be obtained any of a variety of generation-sized substrates.

TABLE 2

Correlation between area and substrate size

| Generation ID | X (mm) | Y (mm) | Area (m2) |
|---|---|---|---|
| Gen 3.0 | 550 | 650 | 0.36 |
| Gen 3.5 | 610 | 720 | 0.44 |
| Gen 3.5 | 620 | 750 | 0.47 |
| Gen 4 | 680 | 880 | 0.60 |
| Gen 4 | 730 | 920 | 0.67 |
| Gen 5 | 1100 | 1250 | 1.38 |
| Gen 5 | 1100 | 1300 | 1.43 |
| Gen 5.5 | 1300 | 1500 | 1.95 |
| Gen 6 | 1500 | 1850 | 2.78 |
| Gen 7.5 | 1950 | 2250 | 4.39 |
| Gen 8 | 2160 | 2400 | 5.18 |
| Gen 8 | 2160 | 2460 | 5.31 |
| Gen 8.5 | 2200 | 2500 | 5.50 |
| Gen 9 | 2400 | 2800 | 6.72 |
| Gen 10 | 2850 | 3050 | 8.69 |

Additionally, an on-substrate particle deposition rate specification expressed as a limit of the number of particles deposited per square meter of substrate per minute can be readily converted to any of a variety of unit time expressions. It will be readily understood that an on-substrate particle deposition rate specification normalized to minutes can be readily converted to any other expression of time through know relationships of time, for example, but not limited by, such as second, hour, day, etc. Additionally, units of time specifically relating to processing can be used. For example, a print cycle can be associated with a unit of time. For various embodiments of a gas enclosure system according to the present teachings a print cycle can be a period of time in which a substrate is moved into a gas enclosure system for printing and then removed from a gas enclosure system after printing is complete. For various embodiments of a gas enclosure system according to the present teachings a print cycle can be a period of time from the initiation of the alignment of a substrate with respect to a printhead assembly to the delivery of a last ejected drop of ink onto the substrate. In the art of processing, total average cycle time or TACT can be an expression of a unit of time for a particular process cycle. According to various embodiments of systems and methods of the present teachings, TACT for a print cycle can be about 30 seconds. For various embodiments of systems and methods of the present teachings, TACT for a print cycle can be about 60 seconds. In various embodiments of systems and methods of the present teachings, TACT for a print cycle can be about 90 seconds. For various embodiments of systems and methods of the present teachings, TACT for a print cycle can be about 120 seconds. In various embodiments of systems and methods of the present teachings, TACT for a print cycle can be about 300 seconds.

With respect to airborne particulate matter and particle deposition within a system, a substantial number of variables can impact developing a general model that may adequately compute, for example, an approximation of a value for particle fallout rate on a surface, such as a substrate, for any particular manufacturing system. Variables such as the size of particles, the distribution of particles of particular size; surface area of a substrate and the time of exposure of a substrate within a system can vary depending on various manufacturing systems. For example, the size of particles and the distribution of particles of particular size can be substantially impacted by the source and location of particle-generating components in various manufacturing systems. Calculations based on various embodiments of gas enclosure systems of the present teachings suggest that without various particle control systems of the present teachings, on-substrate deposition of particulate matter per print cycle per square meter of substrate can be between more than about 1 million to more than about 10 million particles for particles in a size range of 0.1 µm and greater. Such calculations suggest that that without various particle control systems of the present teachings, on-substrate deposition of particulate matter per print cycle per square meter of substrate can be between more than about 1000 to about more than about 10,000 particles for particles in a size range of about 2 µm and greater.

Various embodiments of a low-particle gas enclosure system of the present teachings can maintain a low-particle environment providing for an average on-substrate particle distribution that meets an on-substrate deposition rate specification of less than or equal to about 100 particles per square meter of substrate per minute for particles greater than or equal to 10 µm in size. Various embodiments of a low-particle gas enclosure system of the present teachings can maintain a low-particle environment providing for an average on-substrate particle distribution that meets an on-substrate deposition rate specification of less than or equal to about 100 particles per square meter of substrate per minute for particles greater than or equal to 5 µm in size. In various embodiments of a gas enclosure system of the present teachings, a low-particle environment can be maintained providing for an average on-substrate particle distribution that meets an on-substrate deposition rate specification of less than or equal to about 100 particles per square meter of substrate per minute for particles greater than or equal to 2 µm in size. In various embodiments of a gas enclosure system of the present teachings, a low-particle environment can be maintained providing for an average on-substrate particle distribution that meets an on-substrate deposition rate specification of less than or equal to about 100 particles per square meter of substrate per minute for particles greater than or equal to 1 µm in size. Various embodiments of a low-particle gas enclosure system of the present teachings can maintain a low-particle environment providing for an average on-substrate particle distribution that meets an on-substrate deposition rate specification of less than or equal to about 1000 particles per square meter of substrate per minute for particles greater than or equal to 0.5 µm in size. For various embodiments of a gas enclosure system of the present teachings, a low-particle environment can be maintained providing for an average on-substrate particle distribution that meets an on-substrate deposition rate specification of less than or equal to about 1000 particles per square meter of substrate per minute for particles greater than or equal to 0.3 µm in size. Various embodiments of a low-particle gas enclosure system of the present teachings can maintain a low-particle environment providing for an average on-substrate particle distribution that meets an on-substrate deposition rate specification of less than or equal to about 1000 particles per square meter of substrate per minute for particles greater than or equal to 0.1 µm in size.

It is contemplated that a wide variety of ink formulations can be printed within the inert, substantially low-particle environment of various embodiments of a gas enclosure system of the present teachings. During the manufacture of an OLED display, an OLED pixel can be formed to include an OLED film stack, which can emit light of a specific peak wavelength when a voltage is applied. An OLED film stack structure between an anode and a cathode can include a hole injection layer (HIL), a hole transport layer (HTL), an emissive layer (EL), an electron transport layer (ETL) and an electron injection layer (EIL). In some embodiments of an OLED film stack structure, an electron transport layer (ETL) can be combined with an electron injection layer (EIL) to form an ETL/EIL layer. According to the present teachings, various ink formulations for an EL for various color pixel EL films of an OLED film stack can be printed using inkjet printing. Additionally, for example, but not limited by, the HIL, HTL, EML, and ETL/EIL layers can have ink formulations that can be printed using inkjet printing.

It is further contemplated that an organic encapsulation layer can be printed on an OLED panel using inkjet printing. It is contemplated that an organic encapsulation layer can be printed using inkjet printing, as inkjet printing can provide several advantages. First, a range of vacuum processing operations can be eliminated because such inkjet-based fabrication can be performed at atmospheric pressure. Additionally, during an inkjet printing process, an organic encapsulation layer can be localized to cover portions of an OLED substrate over and proximal to an active region, to effectively encapsulate an active region, including lateral edges of the active region. The targeted patterning using inkjet printing results in eliminating material waste, as well as eliminating additional processing typically required to achieve patterning of an organic layer. An encapsulation ink can comprise a polymer including, for example, but not limited by, an acrylate, methacrylate, urethane, or other material, as well as copolymers and mixtures thereof, which can be cured using thermal processing (e.g. bake), UV exposure, and combinations thereof. As used herein polymer and copolymer can include any form of a polymer component that can be formulated into an ink and cured on a substrate to form an organic encapsulation layer. Such polymeric components can include polymers, and copolymers, as well as precursors thereof, for example, but not limited by, monomers, oligomers, and resins.

Various embodiments of a gas enclosure assembly can have various frame members that are constructed to provide contour for a gas enclosure assembly. Various embodiments of a gas enclosure assembly of the present teachings can accommodate an OLED printing system, while optimizing the working space to minimize inert gas volume, and also allowing ready access to an OLED printing system from the exterior during processing. In that regard, various gas enclosure assemblies of the present teachings can have a contoured topology and volume. As will be discussed in more detail subsequently herein, various embodiments of a gas enclosure can be contoured around a printing system base, upon which a substrate support apparatus can be mounted. Further, a gas enclosure can be contoured around a bridge structure used for the X-axis movement of a carriage assembly. As a non-limiting example, various embodiments of a contoured gas enclosure according to the present teachings can have a gas enclosure volume of between about 6 m$^3$ to about 95 m$^3$ for housing various embodiments of a printing system capable of printing substrate sizes from Gen 3.5 to Gen 10. By way a further non-limiting example, various embodiments of a contoured gas enclosure according to the present teachings can have a gas enclosure volume of between about 15 m$^3$ to about 30 m$^3$ for housing various embodiments of a printing system capable of printing, for example, Gen 5.5 to Gen 8.5 substrate sizes. Such embodiments of a contoured gas enclosure can be between about 30% to about 70% savings in volume in comparison to a non-contoured enclosure having non-contoured dimensions for width, length and height.

FIG. 1A depicts a perspective view of contoured gas enclosure assembly 1000 in accordance with various embodiments of a gas enclosure assembly of the present teachings. Gas enclosure assembly 1000 can include front panel assembly 1200, middle panel assembly 1300 and rear panel assembly 1400. Front panel assembly 1200 can include front ceiling panel assembly 1260, front wall panel assembly 1240, which can have opening 1242 for receiving a substrate, and front base panel assembly 1220. Front panel assembly 1200 when assembled can provide a first tunnel enclosure section of a gas enclosure, which is supported by a base. Rear panel assembly 1400 can include rear ceiling panel assembly 1460, rear wall panel assembly 1440, which can have opening 1442 for removing a substrate, and rear base panel assembly 1420. Rear panel assembly 1400 when assembled can provide a second tunnel enclosure section of a gas enclosure, which is supported by a base. Middle panel assembly 1300 can include first middle enclosure panel assembly 1340, middle wall and ceiling panel assembly 1360 and second middle enclosure panel assembly 1380, as well as middle base panel assembly 1320. Middle panel assembly 1300 when assembled can provide a bridge enclosure section of a gas enclosure, which is supported by a base.

Additionally, as depicted in FIG. 1A, middle panel assembly 1300 can include first printhead management system substantially low particle environment, as well as a second printhead management system auxiliary panel assembly (not shown), which provides for an auxiliary gas enclosure. Various embodiments of an auxiliary enclosure constructed as a section of a gas enclosure assembly can be sealably isolated from the working volume of a gas enclosure system. For various embodiments of systems and methods of the present teachings, an auxiliary enclosure can be less than or equal to about 1% of the enclosure volume of a gas enclosure system. In various embodiments of systems and methods of the present teachings, an auxiliary enclosure can be can be less than or equal to about 2% of the enclosure volume of a gas enclosure system. For various embodiments of systems and methods of the present teachings, an auxiliary enclosure can be less than or equal to about 5% of the enclosure volume of a gas enclosure system. In various embodiments of systems and methods of the present teachings, an auxiliary enclosure can be less than or equal to about 10% of the enclosure volume of a gas enclosure system. In various embodiments of systems and methods of the present teachings, an auxiliary enclosure can be less than or equal to about 20% of the enclosure volume of a gas enclosure system. Should the opening of an auxiliary enclosure to an ambient environment containing reactive gases be indicated for performing, for example, a maintenance procedure, isolating an auxiliary enclosure from the working volume of a gas enclosure can prevent contamination of the entire volume of a gas enclosure. Further, given the relatively small volume of an auxiliary enclosure in comparison to the printing system enclosure portion of a gas enclosure, the recovery time for an auxiliary enclosure can take significantly less time than recovery time for an entire printing system enclosure.

Figure 1B:
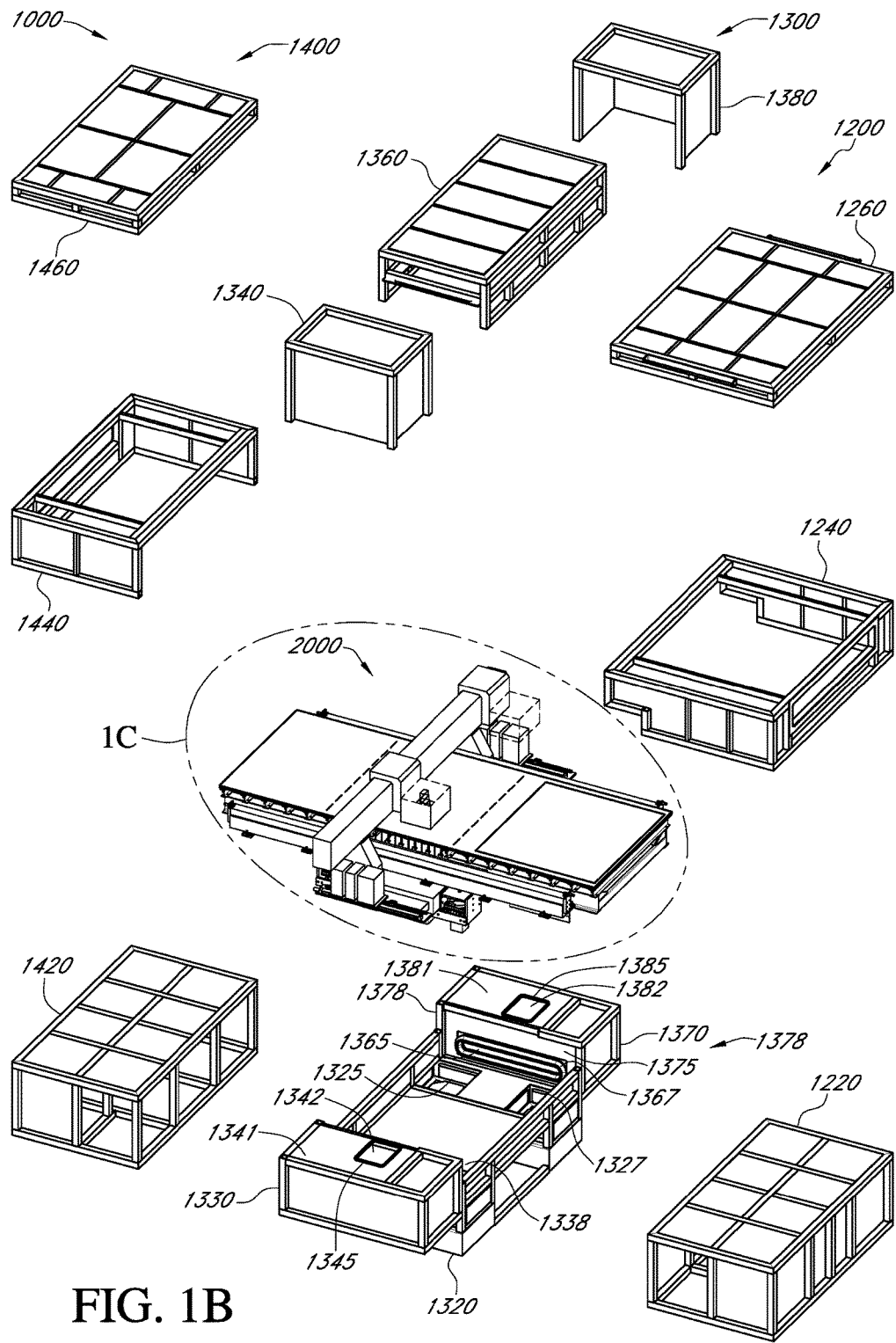
FIG. 1B depicts an exploded view of various embodiments of a gas enclosure assembly as depicted in FIG. 1A.

As depicted in FIG. 1B, gas enclosure assembly 1000 can include front base panel assembly 1220, middle base panel assembly 1320, and rear base panel assembly 1420, which when fully-constructed form a contiguous base or pan on which OLED printing system 2000 can be mounted. In a similar fashion as described for gas enclosure assembly 100 of FIG. 1A, the various frame members and panels comprising front panel assembly 1200, middle panel assembly 1300, and rear panel assembly 1400 of gas enclosure assembly 1000 can be joined around OLED printing system 2000 to form a printing system enclosure. Front panel assembly 1200 can be contoured around printing system 2000 mounted to form a first tunnel enclosure section of a gas enclosure. Similarly, rear panel assembly 1400 can be contoured around printing system 2000 to form a second tunnel enclosure section of a gas enclosure. Additionally, middle panel assembly 1300 can be contoured around a printing system 2000 to form a bridge enclosure section of a gas enclosure. A fully constructed gas enclosure assembly, such as gas enclosure assembly 1000, when integrated with various environmental control systems can form various embodiments of a gas enclosure system including various embodiments of an OLED printing system, such as OLED printing system 2000. According to various embodiments of a gas enclosure system of the present teachings, environmental control of an interior volume defined by a gas enclosure assembly can include control of lighting, for example, by the number and placement of lights of a specific wavelength, control of particulate matter using various embodiments of a particle control system, control of reactive gas species using various embodiments of a gas purification system, and temperature control of a gas enclosure assembly using various embodiments of a thermal regulation system.

Figure 1C:
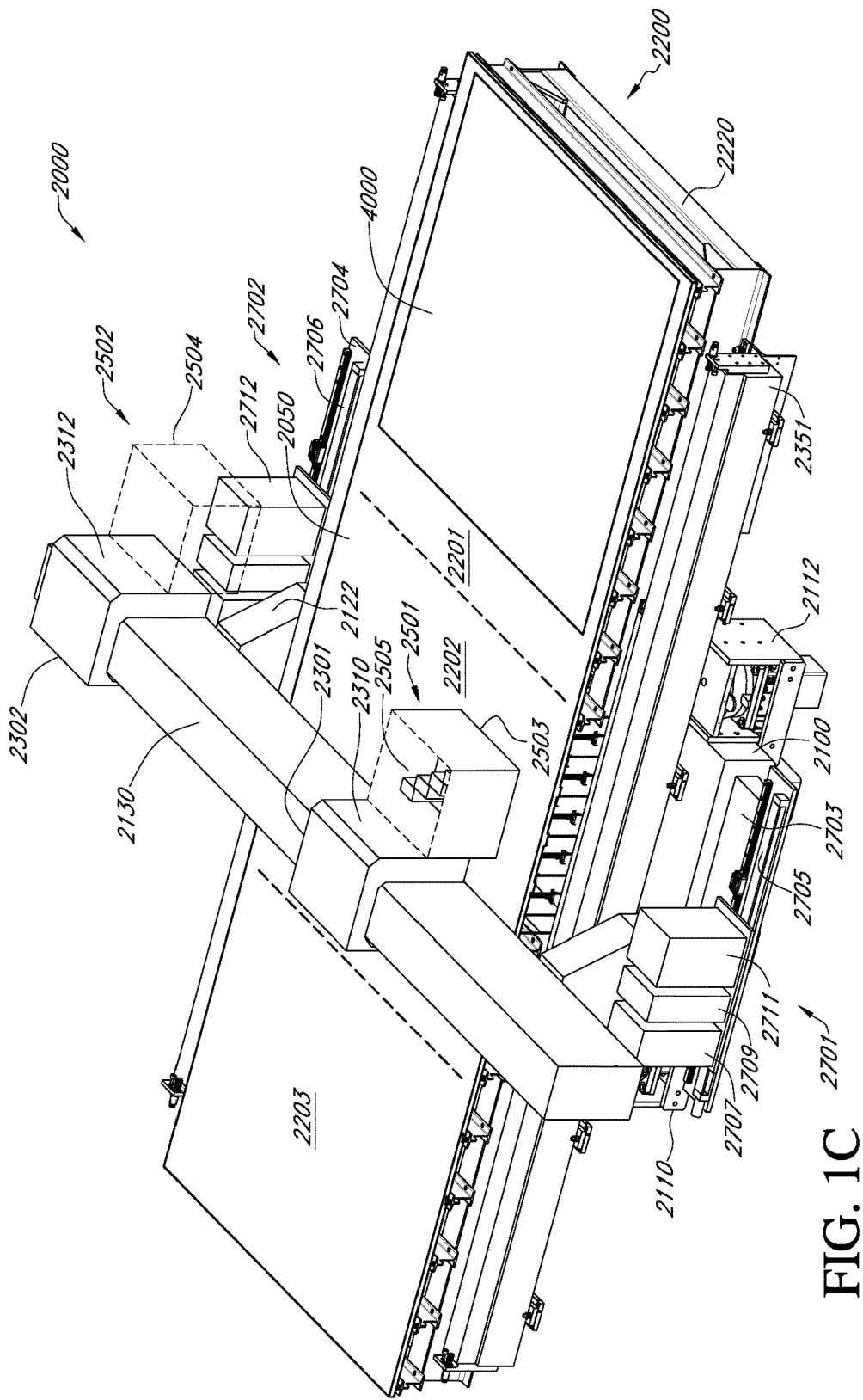
FIG. 1C depicts an expanded iso perspective view of the printing system depicted in FIG. 1B.

An OLED inkjet printing system, such as OLED printing system 2000 of FIG. 1B, shown in expanded view in FIG. 1C, can be comprised of several devices and apparatuses, which allow the reliable placement of ink drops onto specific locations on a substrate. These devices and apparatuses can include, but are not limited to, a printhead assembly, ink delivery system, a motion system for providing relative motion between a printhead assembly and a substrate, substrate support apparatus, substrate loading and unloading system, and printhead management system.

A printhead assembly can include at least one inkjet head, with at least one orifice capable of ejecting droplets of ink at a controlled rate, velocity, and size. The inkjet head is fed by an ink supply system which provides ink to the inkjet head. As shown in an expanded view of FIG. 1C, OLED inkjet printing system 2000 can have a substrate, such as substrate 2050, which can be supported by a substrate support apparatus, such as a chuck, for example, but not limited by, a vacuum chuck, a substrate floatation chuck having pressure ports, and a substrate floatation chuck having vacuum and pressure ports. In various embodiments of systems and methods of the present teachings, a substrate support apparatus can be a substrate floatation table. As will be discussed in more detail subsequently herein, substrate floatation table 2200 of FIG. 1C can be used for supporting substrate 2050, and in conjunction with a Y-axis motion system, can be part of a substrate conveyance system providing for the frictionless conveyance of substrate 2050. A Y-axis motion system of the present teachings can include first Y-axis track 2351 and second Y-axis track 2352, which can include a gripper system (not shown) for holding a substrate. Y-axis motion can be provided by either a linear air bearing or linear mechanical system. Substrate floatation table 2200 of OLED inkjet printing system 2000 shown in FIG. 1B and FIG. 1C can define the travel of substrate 2050 through gas enclosure assembly 1000 of FIG. 1A during a printing process.

FIG. 1C illustrates generally an example of substrate floatation table 2200 for a printing system 2000 that can include a floating conveyance of a substrate, which can have a porous medium to provide floatation. In the example of FIG. 1C, a handler or other conveyance can be used to position a substrate 2050 in first region 2201 of a substrate floatation table 2200, such as located on a conveyor. The conveyer can position the substrate 2050 at a specified location within the printing system such as using either mechanical contact (e.g., using an array of pins, a tray, or a support frame configuration), or using gas cushion to controllably float the substrate 2050 (e.g., an "air bearing" table configuration). A printing region 2202 of the substrate floatation table 2200 can be used to controllably deposit one or more layers on the substrate 2050 during fabrication. The printing region 2202 can also be coupled to an second region 2203 of the substrate floatation table 2200. The conveyer can extend along the first region 2201, the printing region 2202, and the second region 2203 of the substrate floatation table 2200, and the substrate 2050 can be repositioned as desired for various deposition tasks, or during a single deposition operation. The controlled environments nearby the first region 2201, the printing region 2202, and the second region 2203 can be commonly-shared. According to various embodiments of printing system 2000 of FIG. 1C, first region 2201 can be an input region, and second region 2203 can be an output region. For various embodiments of printing system 2000 of FIG. 1C, first region 2201 can be both an input and an output region. Further, function referred to in association with regions 2201, 2202, and 2203, such as input, printing, and output for illustration only. Such regions can be used for other processing steps, such as conveyance of a substrate, or support of a substrate such as during one or more of holding, drying, or thermal treatment of the substrate in one or more other modules.

The printing system 2000 of FIG. 1C can include one or more printhead devices 2505, each printhead device having one or more printheads; e.g. nozzle printing, thermal jet or ink-jet type. The one or more printhead devices 2505 can be coupled to or otherwise traversing an overhead carriage, such as first X-axis carriage assembly 2301. For various embodiments of printing system 2000 of the present teachings, one or more printheads of one or more printhead devices 2505 can be configured to deposit one or more patterned organic layers on the substrate 2050 in a "face up" configuration of the substrate 2050. Such layers can include one or more of an electron injection or transport layer, a hole injection or transport layer, a blocking layer, or an emission layer, for example. Such materials can provide one or more electrically functional layers.

According to the floatation schemes shown in FIG. 1C, in an example where the substrate 2050 is supported exclusively by the gas cushion, a combination of positive gas pressure and vacuum can be applied through the arrangement of ports or using a distributed porous medium. Such a zone having both pressure and vacuum control can effectively provide a fluidic spring between the conveyor and a substrate. A combination of positive pressure and vacuum control can provide a fluidic spring with bidirectional stiffness. The gap that exists between the substrate (e.g., substrate 2050) and a surface can be referred to as the "fly height," and such a height can be controlled or otherwise established by controlling the positive pressure and vacuum port states. In this manner, the substrate Z-axis height can be carefully controlled in, for example, the printing region 2202. In some embodiments, mechanical retaining techniques, such as pins or a frame, can be used to restrict lateral translation of the substrate while the substrate is supported by the gas cushion. Such retaining techniques can include using spring loaded structures, such as to reduce the instantaneous forces incident the sides of the substrate while the substrate is being retained; this can be beneficial as a high force impact between a laterally translating substrate and a retaining means can cause substrate chipping or even catastrophic breakage.

Elsewhere, as illustrated generally in FIG. 1C, such as where the fly height need not be controlled precisely, pressure-only floatation zones can be provided, such as along the conveyor in the first or second regions 2201 or 2203, or elsewhere. A "transition" floatation zone can be provided such as where a ratio of pressure to vacuum nozzles increases or decreases gradually. In an illustrative example, there can be an essentially uniform height between a pressure-vacuum zone, a transition zone, and a pressure only zone, so that within tolerances, the three zones can lie essentially in one plane. A fly height of a substrate over pressure-only zones elsewhere can be greater than the fly height of a substrate over a pressure-vacuum zone, such as in order to allow enough height so that a substrate will not collide with a floatation table in the pressure-only zones. In an illustrative example, an OLED panel substrate can have a fly height of between about 150 micrometers ($\mu$) to about 300$\mu$ above pressure-only zones, and then between about 30$\mu$ to about 50$\mu$ above a pressure-vacuum zone. In an illustrative example, one or more portions of the substrate floatation table 2200 or other fabrication apparatus can include an "air bearing" assembly provided by NewWay® Air Bearings (Aston, Pa., United States of America).

A porous medium can be used to establish a distributed pressurized gas cushion for floating conveyance or support of the substrate 2050 during one or more of printing, buffering, drying, or thermal treatment. For example, a porous medium "plate" such as coupled to or included as a portion of a conveyor can provide a "distributed" pressure to support the substrate 2050 in a manner similar to the use of individual gas ports. The use of a distributed pressurized gas cushion without using large gas port apertures can in some instances further improve uniformity and reduce or minimize the formation of mura or other visible defects, such as in those instances where the use of relatively large gas ports to create a gas cushion leads to non-uniformity, in spite of the use of a gas cushion.

A porous medium can be obtained such as from Nano TEM Co., Ltd. (Niigata, Japan), such as having physical dimensions specified to occupy an entirety of the substrate 2050, or specified regions of the substrate such as display regions or regions outside display regions. Such a porous medium can include a pore size specified to provide a desired pressurized gas flow over a specified area, while reducing or eliminating mura or other visible defect formation.

Printing requires relative motion between the printhead assembly and the substrate. This is accomplished with a motion system, typically a gantry or split axis XYZ system. Either the printhead assembly can move over a stationary substrate (gantry style), or both the printhead and substrate can move, in the case of a split axis configuration. In another embodiment, a printhead assembly can be substantially stationary; for example, in the X and Y axes, and the substrate can move in the X and Y axes relative to the printheads, with Z axis motion provided either by a substrate support apparatus or by a Z-axis motion system associated with a printhead assembly. As the printheads move relative to the substrate, droplets of ink are ejected at the correct time to be deposited in the desired location on a substrate. A substrate can be inserted and removed from the printer using a substrate loading and unloading system. Depending on the printer configuration, this can be accomplished with a mechanical conveyor, a substrate floatation table with a conveyance assembly, or a substrate transfer robot with end effector. A printhead management system can be comprised of several subsystems which allow for such measurement tasks, such as the checking for nozzle firing, as well as the measurement of drop volume, velocity and trajectory from every nozzle in a printhead, and maintenance tasks, such as wiping or blotting the inkjet nozzle surface of excess ink, priming and purging a printhead by ejecting ink from an ink supply through the printhead and into a waste basin, and replacement of printheads. Given the variety of components that can comprise an OLED printing system, various embodiments of OLED printing system can have a variety of footprints and form factors.

With respect to FIG. 1C, printing system base 2100, can include first riser 2120 and second riser 2122, upon which bridge 2130 is mounted. For various embodiments of OLED printing system 2000, bridge 2130 can support first X-axis carriage assembly 2301 and second X-axis carriage assembly 2302, which can control the movement of first printhead assembly 2501 and second printhead assembly 2502, respectively across bridge 2130. For various embodiments of printing system 2000, first X-axis carriage assembly 2301 and second X-axis carriage assembly 2302 can utilize a linear air bearing motion system, which are intrinsically low-particle generating. According to various embodiments of a printing system of the present teachings, an X-axis carriage can have a Z-axis moving plate mounted thereupon. In FIG. 1C, first X-axis carriage assembly 2301 is depicted with first Z-axis moving plate 2310, while second X-axis carriage assembly 2302 is depicted with second Z-axis moving plate 2312. Though FIG. 1C depicts two carriage assemblies and two printhead assemblies, for various embodiments of OLED inkjet printing system 2000, there can be a single carriage assembly and a single printhead assembly. For example, either of first printhead assembly 2501 and second printhead assembly 2502 can be mounted on an X,Z-axis carriage assembly, while a camera system for inspecting features of substrate 2050 can be mounted on a second X,Z-axis carriage assembly. Various embodiments of OLED inkjet printing system 2000 can have a single printhead assembly, for example, either of first printhead assembly 2501 and second printhead assembly 2502 can be mounted on an X,Z-axis carriage assembly, while a UV lamp for curing an encapsulation layer printed on substrate 2050 can be mounted on a second X,Z-axis carriage assembly. For various embodiments of OLED inkjet printing system 2000, there can be a single printhead assembly, for example, either of first printhead assembly 2501 and second printhead assembly 2502, mounted on an X,Z-axis carriage assembly, while a heat source for curing an encapsulation layer printed on substrate 2050 can be mounted on a second carriage assembly.

In FIG. 1C, each printhead assembly, such as first printhead assembly 2501 and second printhead assembly 2502 of FIG. 1C, can have a plurality of printheads mounted in at least one printhead device, as depicted in partial view for first printhead assembly 2501, which depicts a plurality of printhead devices 2505. A printhead device can include, for example, but not limited by, fluidic and electronic connections to at least one printhead; each printhead having a plurality of nozzles or orifices capable of ejecting ink at a controlled rate, velocity and size. For various embodiments of printing system 2000, a printhead assembly can include between about 1 to about 60 printhead devices, where each printhead device can have between about 1 to about 30 printheads in each printhead device. A printhead, for example, an industrial inkjet head, can have between about 16 to about 2048 nozzles, which can expel a droplet volume of between about 0.1 pL to about 200 pL.

According to various embodiments of a gas enclosure system of the present teachings, given the sheer number of printhead devices and printheads, first printhead management system 2701 and second printhead management system 2702 can be housed in an auxiliary enclosure, which can be isolated from a printing system enclosure during a printing process for performing various measurement and maintenance tasks with little or no interruption to the printing process. As can be seen in FIG. 1C, first printhead assembly 2501 can be seen positioned relative to first printhead management system 2701 for ready performance of various measurement and maintenance procedures that can be performed by first printhead management system apparatuses 2707, 2709 and 2711. Apparatuses 2707, 2709, and 2011 can be any of a variety of subsystems or modules for performing various printhead management functions. For example apparatuses 2707, 2709, and 2011 can be any of a drop measurement module, a printhead replacement module, a purge basin module, and a blotter module. As depicted in FIG. 1C, first printhead management system apparatuses 2707, 2709 and 2711 and can be mounted on linear rail motion system 2705 for positioning relative to first printhead assembly 2501. Similarly, second printhead management system 2702, which can have a similar complement of apparatuses, can have printhead management apparatuses mounted on linear rail motion system 2706 for positioning relative to first printhead assembly 2502.

With respect to various embodiments of a gas enclosure assembly having an auxiliary enclosure that can be closed off from, as well as sealably isolated from a first working volume, for example, a printing system enclosure, reference is made again to FIG. 1B. As depicted in FIG. 1C, there can be four isolators on OLED printing system 2000; first isolator set 2110 (second not shown on opposing side) and second isolator set 2112 (second not shown on opposing side), which support substrate floatation table 2200 of OLED printing system 2000. For gas enclosure assembly 1000 of FIG. 1B, first isolator set 2110 and second isolator set 2112 can be mounted in each of a respective isolator well panel, such as first isolator wall panel 1325 and second isolator wall panel 1327 of middle base panel assembly 1320. For gas enclosure assembly 1000 of FIG. 1B, middle base assembly 1320 can include first auxiliary enclosure 1330, as well as second auxiliary enclosure 1370. FIG. 1B of gas enclosure assembly 1000 depicts first auxiliary enclosure 1330 that can include first back wall panel assembly 1338. Similarly, also depicted is second auxiliary enclosure 1370 that can include second back wall panel assembly 1378. First back wall panel assembly 1338 of first auxiliary enclosure 1330 can be constructed in a similar fashion as shown for second back wall panel assembly 1378. Second back wall panel assembly 1378 of second auxiliary enclosure 1370 can be constructed from second back wall frame assembly 1378 having second seal-support panel 1375 sealably mounted to second back wall frame assembly 1378. Second seal-support panel 1375 can have second passage 1365, which is proximal to a second end of base 2100 (not shown). Second seal 1367 can be mounted on second seal-support panel 1375 around second passage 1365. A first seal can be similarly positioned and mounted around a first passage for first auxiliary enclosure 1330. Each passage in auxiliary panel assembly 1330 and auxiliary panel assembly 1370 can accommodate having each maintenance system platform, such as first and second maintenance system platforms 2703 and 2704 of FIG. 1C pass through the passages. As will be discussed in more detail subsequently herein, in order to sealably isolate auxiliary panel assembly 1330 and auxiliary panel assembly 1370 the passages, such as second passage 1365 of FIG. 1B must be sealable. It is contemplated that various seals, such as an inflatable seal, a bellows seal and a lip seal can be used for sealing a passage, such as second passage 1365 of FIG. 1B, around a maintenance platform affixed to a printing system base.

First auxiliary enclosure 1330 and second auxiliary enclosure 1370 can include first printhead assembly opening 1342 of first floor panel assembly 1341 and second printhead assembly opening 1382 of second floor panel assembly 1381; respectively. First floor panel assembly 1341 is depicted in FIG. 1B as part of first middle enclosure panel assembly 1340 of middle panel assembly 1300. First floor panel assembly 1341 is a panel assembly in common with both first middle enclosure panel assembly 1340 and first auxiliary enclosure 1330. Second floor panel assembly 1381 is depicted in FIG. 1B as part of second middle enclosure panel assembly 1380 of middle panel assembly 1300. Second floor panel assembly 1381 is a panel assembly in common with both second middle enclosure panel assembly 1380 and second auxiliary enclosure 1370.

As previously discussed herein, first printhead assembly 2501 can be housed in first printhead assembly enclosure 2503, and second printhead assembly 2502 can be housed in second printhead assembly enclosure 2504. According to systems and methods of the present teachings, first printhead assembly enclosure 2503 and second printhead assembly enclosure 2504 can have an opening at the bottom that can have a rim (not shown), so that various printhead assemblies can be positioned for printing during a printing process. Additionally, the portions of first printhead assembly enclosure 2503 and second printhead assembly enclosure 2504 forming a housing can be constructed as previously described for various panel assemblies, so that the frame assembly members and panels are capable of providing an hermetically-sealed enclosure.

A compressible gasket which can additionally be used for the hermetic sealing of various frame members, can be affixed around each of first printhead assembly opening 1342 and second printhead assembly opening 1382, or alternatively around the rim of first printhead assembly enclosure 2503 and second printhead assembly enclosure 2504.

According to the present teachings, compressible gasket material can be selected from, for example, but not limited by, any in the class of closed-cell polymeric materials, also referred to in the art as expanded rubber materials or expanded polymer materials. Briefly, a closed-cell polymer is prepared in a fashion whereby gas is enclosed in discrete cells; where each discrete cell is enclosed by the polymeric material. Properties of compressible closed-cell polymeric gasket materials that are desirable for use in gas-tight sealing of frame and panel components include, but are not limited by, that they are robust to chemical attack over a wide range of chemical species, possess excellent moisture-barrier properties, are resilient over a broad temperature range, and they are resistant to a permanent compression set. In general, compared to open-cell-structured polymeric materials, closed-cell polymeric materials have higher dimensional stability, lower moisture absorption coefficients, and higher strength. Various types of polymeric materials from which closed-cell polymeric materials can be made include, for example, but not limited by, silicone, neoprene, ethylene-propylene-diene terpolymer (EPT); polymers and composites made using ethylene-propylene-diene-monomer (EPDM), vinyl nitrile, styrene-butadiene rubber (SBR), and various copolymers and blends thereof.

In addition to close-cell compressible gasket materials, another example of a class of compressible gasket material having desired attributes for use in constructing embodiments of a gas enclosure assembly according to the present teachings includes the class of hollow-extruded compressible gasket materials. Hollow-extruded gasket materials as a class of materials have the desirable attributes, including, but not limited by, that they are robust to chemical attack over a wide range of chemical species, possess excellent moisture-barrier properties, are resilient over a broad temperature range, and they are resistant to a permanent compression set. Such hollow-extruded compressible gasket materials can come in a wide variety of form factors, such as for example, but not limited by, U-cell, D-cell, square-cell, rectangular-cell, as well as any of a variety of custom form factor hollow-extruded gasket materials. Various hollow-extruded gasket materials can be fabricated from polymeric materials that are used for closed-cell compressible gasket fabrication. For example, but not limited by, various embodiments of hollow-extruded gaskets can be fabricated from silicone, neoprene, ethylene-propylene-diene terpolymer (EPT); polymers and composites made using ethylene-propylene-diene-monomer (EPDM), vinyl nitrile, styrene-butadiene rubber (SBR), and various copolymers and blends thereof. Compression of such hollow cell gasket materials should not exceed about 50% deflection in order to maintain the desired attributes.

As depicted in FIG. 1B, first printhead assembly docking gasket 1345 and second printhead assembly docking gasket 1385 can be affixed around first printhead assembly opening 1342 and second printhead assembly opening 1382, respectively. During various printhead measurement and maintenance procedures, first printhead assembly 2501 and second printhead assembly 2502 can be positioned by first X,Z-axis carriage assembly 2301 and second X,Z-axis carriage assembly 2302, respectively, over first printhead assembly opening 1342 of first floor panel assembly 1341 and second printhead assembly opening 1382 of second floor panel assembly 1381, respectively. In that regard, for various printhead measurement and maintenance procedures, first printhead assembly 2501 and second printhead assembly 2502 can be positioned over first printhead assembly opening 1342 of first floor panel assembly 1341 and second printhead assembly opening 1382 of second floor panel assembly 1381, respectively, without covering or sealing first printhead assembly opening 1342 and second printhead assembly opening 1382. First X,Z-axis carriage assembly 2301 and second X,Z-axis carriage assembly 2302 can dock first printhead assembly enclosure 2503 and second printhead assembly enclosure 2504, respectively, with first auxiliary enclosure 1330 and second auxiliary enclosure 1370, respectively. In various printhead measurement and maintenance procedures, such docking may effectively close first printhead assembly opening 1342 and second printhead assembly opening 1382 without the need for sealing first printhead assembly opening 1342 and second printhead assembly opening 1382. For various printhead measurement and maintenance procedures, the docking can include the formation of a gasket seal between each of the printhead assembly enclosures and the printhead management system panel assemblies. In conjunction with sealably closing passages, such as second passage 1365 and a complementary first passage of FIG. 1B, when first printhead assembly enclosure 2503 and second printhead assembly enclosure 2504 are docked with first auxiliary enclosure 1330 and second auxiliary enclosure 1370 to sealably close first printhead assembly opening 1342 and second printhead assembly opening 1382, the combined structures so formed are hermetically sealed.

Additionally, according to the present teachings, an auxiliary enclosure can be isolated from, for example, another interior enclosure volume, such as the printing system enclosure, as well as the exterior of a gas enclosure assembly, by using a structural closure to sealably close a passageway, such as first printhead assembly opening 1342 and second printhead assembly opening 1382 of FIG. 1B. According to the present teachings, a structural closure can include a variety of sealable coverings for an opening or passageway; such opening or passageway including non-limiting examples of an enclosure panel opening or passageway. According to systems and methods of the present teachings, a gate can be any structural closure that can be used to reversibly cover or reversibly sealably close any opening or passageway using pneumatic, hydraulic, electrical, or manual actuation. As such, first printhead assembly opening 1342 and second printhead assembly opening 1382 of FIG. 1B can be reversibly covered or reversibly sealably closed using a gate.

In the expanded view of OLED printing system 2000 of FIG. 1C, various embodiments of a printing system can include substrate floatation table 2200, supported by substrate floatation table base 2220. Substrate floatation table base 2220 can be mounted on printing system base 2100. Substrate floatation table 2200 of OLED printing system can support substrate 2050, as well as defining the travel over which substrate 2050 can be moved through gas enclosure assembly 1000 during the printing of an OLED substrate. A Y-axis motion system of the present teachings can include first Y-axis track 2351 and second Y-axis track 2352, which can include a gripper system (not shown) for holding a substrate. Y-axis motion can be provided by either a linear air bearing or linear mechanical system. In that regard, in conjunction with a motion system; as depicted in FIG. 1C, a Y-axis motion system, substrate floatation table 2200 can provide frictionless conveyance of substrate 2050 through a printing system.

Figure 2:
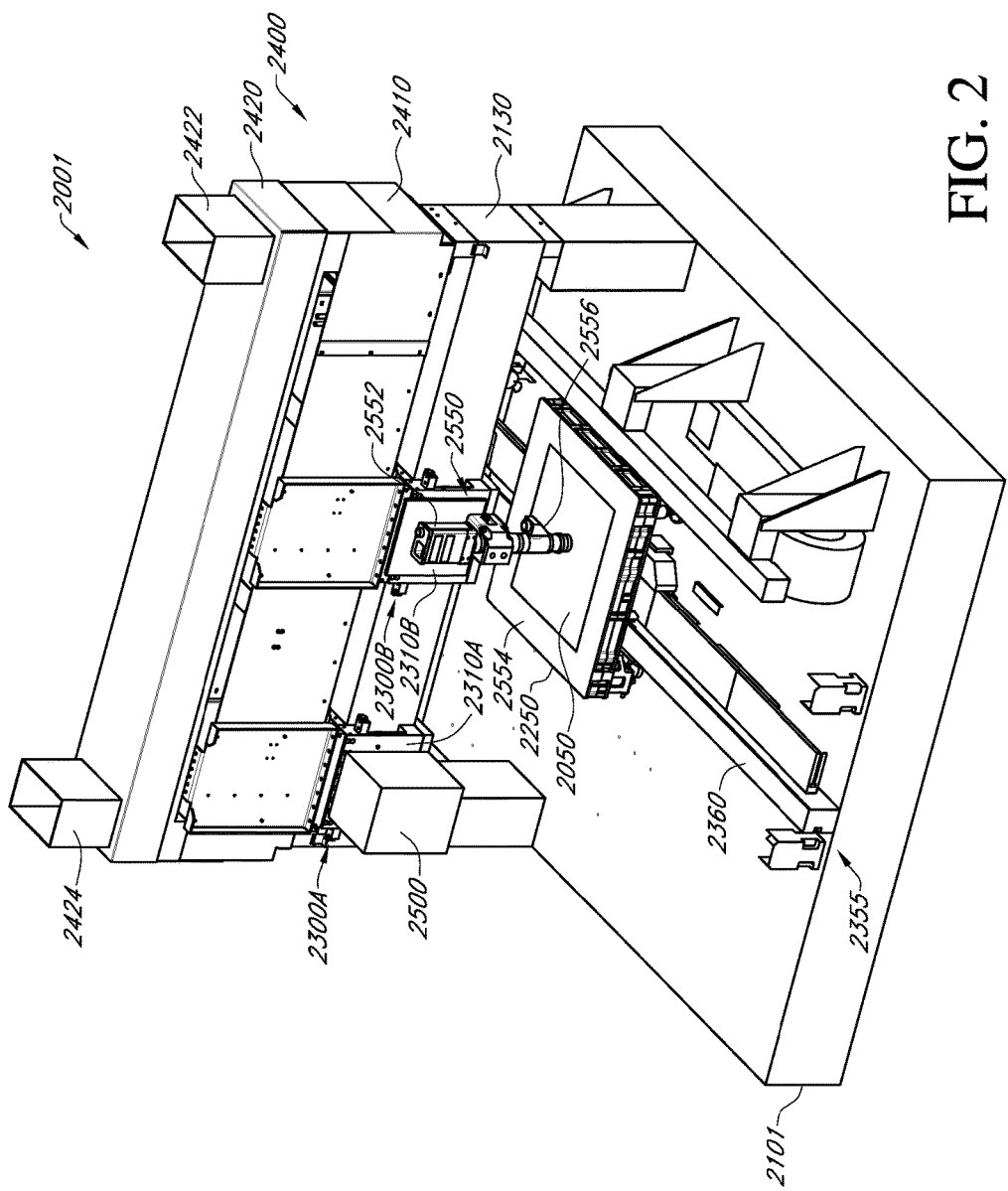
FIG. 2 is an iso perspective view of the placement of substrate proximal to a printing area in a printing system equipped with a camera in accordance with various embodiments of the present teachings.

In reference to FIG. 2, printing system 2001 can have all of the elements previously described for printing system 2000 of FIG. 1C. For example, but not limited by, printing system 2001 of FIG. 2 can have service bundle housing exhaust system 2400 for containing and exhausting particles generated from a service bundle. Service bundle housing exhaust system 2400 of printing system 2001 can include service bundle housing 2410, which can house a service bundle. According to the present teachings, a service bundle can be operatively connected to a printing system to provide various optical, electrical, mechanical and fluidic connections required to operate various devices and apparatuses in a gas enclosure system, for example, but not limited by, various devices and apparatuses associated with a printing system. A positive flow differential through service bundle housing exhaust system 2400 can ensure that particles generated by a service bundle in service bundle housing 2410 can be directed into service bundle housing exhaust plenum 2420 and then into a gas circulation and filtration system through service bundle housing exhaust plenum first duct 2422 and service bundle housing exhaust plenum second duct 2424. Printing system 2001 of FIG. 2 can have substrate support apparatus 2250 for supporting substrate 2050, which can be positioned with precision in the Y-axis direction using Y-axis positioning system 2355. Both substrate support apparatus 2250 and Y-axis positioning system 2355 are supported by printing system base 2101. Substrate support apparatus 2250 can be mounted on Y-axis motion assembly 2355 and can be moved on rail system 2360 using, for example, but not limited by, a linear bearing system; either utilizing mechanical bearings or air bearings. For various embodiments of gas enclosure systems, an air bearing motion system helps facilitation frictionless conveyance in the Y-axis direction for a substrate placed on substrate support apparatus 2250. Y-axis motion system 2355 can also optionally use dual rail motion, once again, provided by a linear air bearing motion system or a linear mechanical bearing motion system.

Regarding motion systems supporting various carriage assemblies, printing system 2001 of FIG. 2 can have first X-axis carriage assembly 2300A that is depicted having printhead assembly 2500 mounted thereupon and second X-axis carriage assembly 2300B that is depicted having camera assembly 2550 mounted thereupon. Substrate 2050, which is on substrate support apparatus 2250, can be located in various positions proximal to bridge 2130, for example, during a printing process. Substrate support apparatus 2250 can be mounted on printing system base 2101. In FIG. 2, printing system 2001 can have first X-axis carriage assembly 2300A and second X-axis carriage assembly 2300B mounted on bridge 2130. First X-axis carriage assembly 2300A can also include first Z-axis moving plate 2310A for the Z-axis positioning of printhead assembly 2500, while second X-axis carriage assembly 2300B can have second Z-axis moving plate 2310B for the Z-axis positioning of camera assembly 2550. In that regard, various embodiments of carriage assemblies 2300A and 2300B can provide precision X,Z positioning with respect to a substrate positioned on substrate support 2250 for printhead assembly 2500 and camera assembly 2550, respectively. For various embodiments of printing system 2004, first X-axis carriage assembly 2300A and second X-axis carriage assembly 2300B can utilize a linear air bearing motion system, which is intrinsically low-particle generating.

Camera assembly 2550 of FIG. 2 can be a high-speed, high-resolution camera. A camera assembly 2550 can include camera 2552, camera mount assembly 2554 and lens assembly 2556. Camera assembly 2550 can be mounted to motion system 2300B on Z-axis moving plate 2310B, via camera mount assembly 2556. Camera 2552 can be any image sensor device that converts an optical image into an electronic signal, such as by way of non-limiting example, a charge-coupled device (CCD), a complementary metal-oxide-semiconductor (CMOS) device or N-type metal-oxide-semiconductor (NMOS) device. Various image sensor devices can be configured as an array of sensors for an area scan camera, or a single row of sensors, for a line scan camera. Camera assembly 2550 can be connected to image processing system that can include, for example, a computer for storing, processing, and providing results. As previously discussed herein for printing system 2001 of FIG. 2, Z-axis moving plate 2310B can controllably adjust the Z-axis position of camera assembly 2550 relative to substrate 2050. During various processes, such as for example, printing and data collection, substrate 2050 can be controllably positioned relative to the camera assembly 2550 using the X-axis motion system 2300B and Y-axis motion system 2355.

Accordingly, the split axis motion system of FIG. 2 can provide precise positioning of the camera assembly 2550 and substrate 2050 relative to one another in three dimensions in order to capture image data on any part of the substrate 2050 at any desired focus and/or height. Moreover, precision XYZ motion of a camera relative to a substrate can be done for either area scanning or line scanning processes. As previously discussed herein, other motion systems, such as a gantry motion system, can also be used to provide precision movement in three dimensions between, for example, a printhead assembly and/or a camera assembly, relative to a substrate. Additionally, lighting can be mounted in various positions; either on an X-axis motion system or on a substrate support apparatus proximal to a substrate, and combinations thereof. In that regard, lighting can be positioned according to performing various lightfield and darkfield analyses, and combinations thereof. Various embodiments of a motion system can position camera assembly 2550 relative to substrate 2050 using a continuous or a stepped motion or a combination thereof to capture a series of one or more images of the surface of substrate 2050. Each image can encompass an area associated with one or more pixel wells, associated electronic circuitry components, pathways and connectors of an OLED substrate. By using image processing, images of particles can be obtained, and size and number of particles of a specific size determined. In various embodiments of systems and methods of the present teachings, a line scan camera having about 8192 pixels, with a working height of about 190 mm, and capable of scanning at about 34 kHz can be used. Additionally, more than one camera can be mounted on an X-axis carriage assembly for various embodiments of a printing system camera assembly, where each camera can have different specifications regarding field of view and resolution. For example, one camera can be a line scan camera for in situ particle inspection, while a second camera can be for regular navigation of a substrate in a gas enclosure system. Such a camera useful for regular navigation can be an area scan camera having a field of view in the range of about 5.4 mm×4 mm with a magnification of about 0.9× to about 10.6 mm×8 mm with a magnification of about 0.45×. In still other embodiments, one camera can be a line scan camera for in situ particle inspection, while a second camera can be for precise navigation of a substrate in a gas enclosure system, for example, for substrate alignment. Such a camera can be useful for precise navigation can be an area scan camera having a field of view of about 0.7 mm×0.5 mm with a magnification of about 7.2×.

With respect to in situ inspection of an OLED substrate, various embodiments of a printing system camera assembly, such as camera assembly 2550 of printing system 2001 depicted in FIG. 2, can be used to inspect a panel without significant impact to total average cycle time (TACT). For example, a Gen 8.5 substrate can be scanned for on-substrate particulate matter in less than 70 seconds. In addition to in situ inspection of OLED substrate, a printing system camera assembly can be used for a system validation study by using a test substrate to determine whether or not a sufficiently low particle environment for a gas enclosure system can be verified prior to using the gas enclosure system for a printing process.

Various embodiments of a gas enclosure system can have a gas circulation and filtration system in which gas can be circulated and filtered in various zones. In various embodiments of gas enclosure systems and methods of the present teachings, a gas circulation and filtration system can have a tunnel baffle plate that directs the circulation of filtered gas through an opening that creates a transition-flow zone through which gas can flow into a bridge circulation and filtration zone. A tunnel circulation and filtration system can provide for the cross-flow of gas across a substrate support apparatus. In various embodiments of systems and methods of the present teachings, the cross-flow of gas across a substrate support apparatus in a tunnel circulation and filtration zone can be substantially laminar. A gas enclosure system having a tunnel circulation and filtration zone can have a transition-flow zone proximal to a carriage assembly that draws gas away from a substrate located below the carriage assembly. The gas drawn into the transition flow zone can be drawn through an opening in a tunnel baffle plate. Various embodiments of a gas enclosure system can have a bridge circulation and filtration system that can provide circulation and filtration of gas about a printing system bridge and related apparatuses and devices, and is in flow communication with the transition-flow zone. Various embodiments of a gas circulation and filtration system of the present teachings can effectively remove both airborne particulate matter, as well as particulate matter generated proximal to a substrate during a printing process.

Figure 3A:
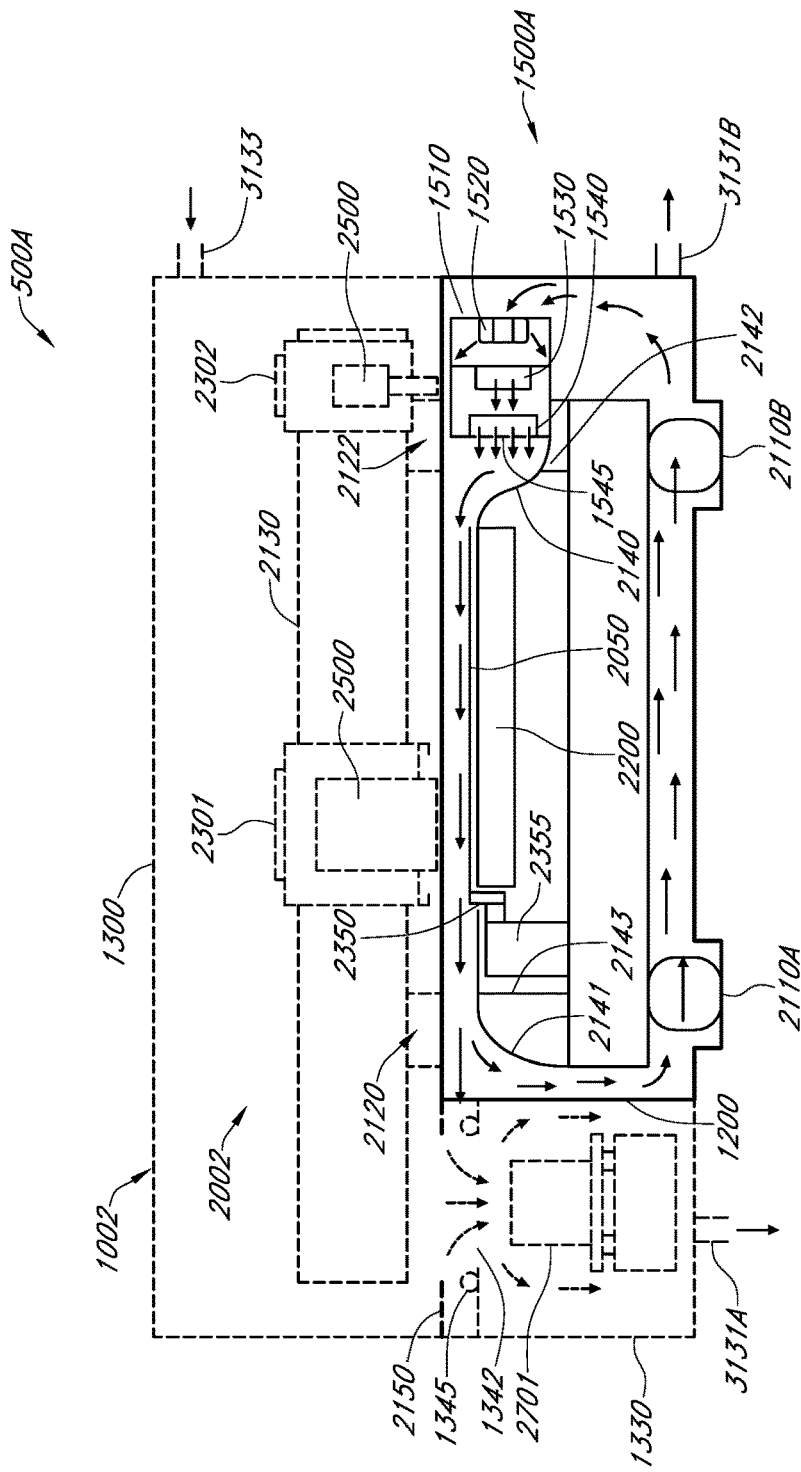
FIG. 3A and FIG. 3B are schematic front cross-section views of various embodiments of gas enclosure assembly and related system components of the present teachings.
Figure 3B:
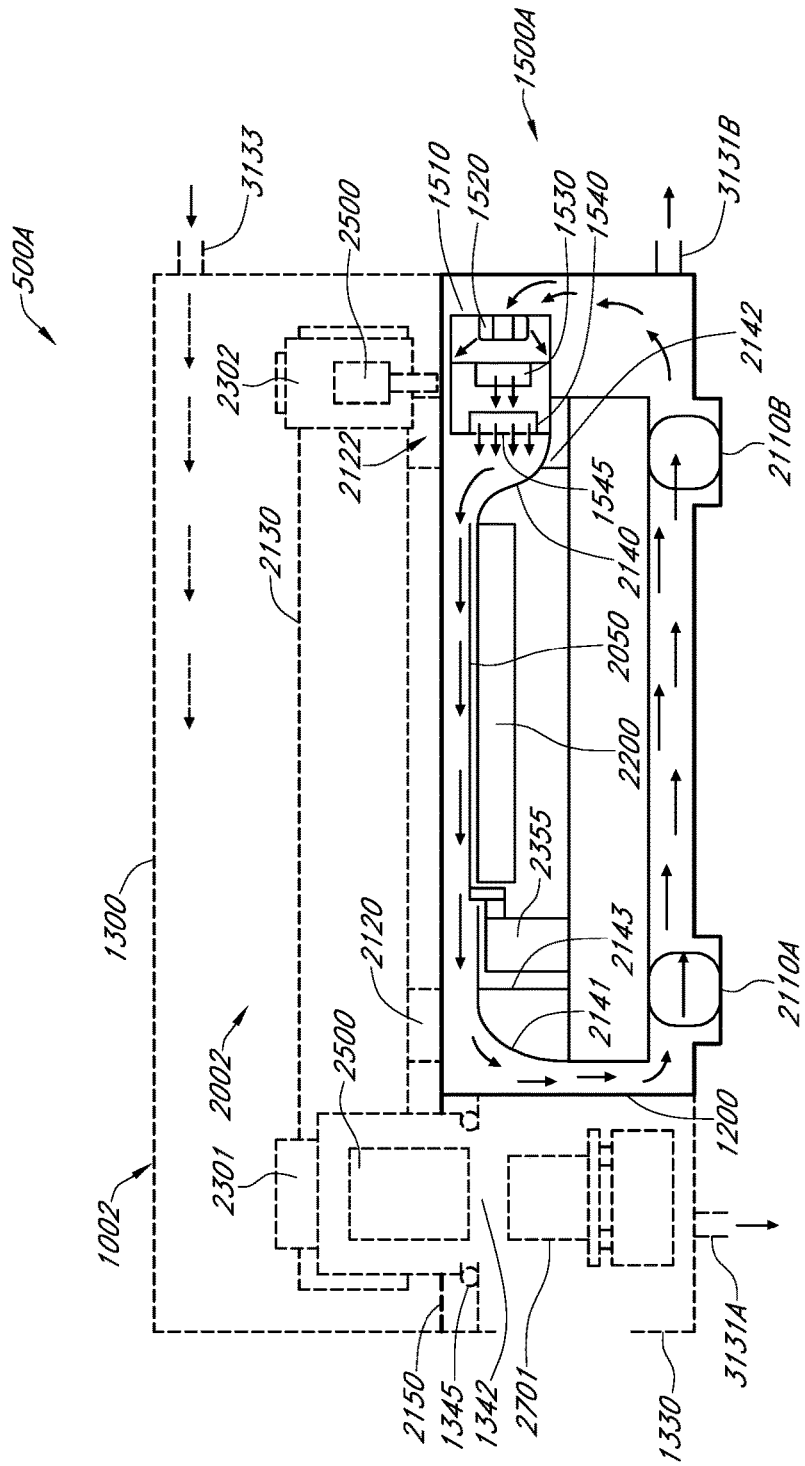

FIG. 3A and FIG. 3B are schematic front cross-section views of gas enclosure system 500A, which depicts a cross section of a first tunnel enclosure section 1200 that illustrate generally tunnel circulation and filtration system 1500. Additionally, for perspective and context, features as described for various embodiments of gas enclosure 1000 of FIG. 1A, as well as printing system 2000 of FIG. 1B and FIG. 1C are depicted in phantom view through a section of bridge enclosure section 1300. Printing system 2002, which can be housed in gas enclosure 1002, can have printing system base 2100, which can be supported by at least two sets of isolators such as isolator set 2110 that includes isolators 2110A and 2110B of FIG. 3A and FIG. 3B. A Y-axis motion system can be mounted on printing system base 2100 and can include Y-axis track 2350, supported by Y-axis track support 2355. Substrate 2050 can be floatingly supported by substrate floatation table 2200. Printing system base 2100 can support first riser 2120 and second riser 2122, upon which bridge 2130 can be mounted. Printing system bridge 2130 can support first X-axis carriage assembly 2301, upon which printhead assembly 2500 can be mounted, and second X-axis carriage assembly 2302, upon which camera assembly 2550 can be mounted.

Additionally, gas enclosure system 500A can have auxiliary enclosure 1330, depicted in phantom view, which can enclose printhead management system 2701. Printing system 2000 of FIG. 1B depicts a gas enclosure having first auxiliary enclosure 1330 and second auxiliary enclosure 1370, while in FIG. 3A and FIG. 3B, auxiliary enclosure 1330 is indicated. As such, various embodiments of systems and methods of the present teachings can have a gas enclosure with one auxiliary enclosure. In various embodiments of systems and methods of the present teachings, a gas enclosure can have two auxiliary enclosures. Auxiliary enclosure 1330 can be in flow communication with the printing system enclosure of gas enclosure system 500A through printhead assembly opening 1342, and can be sealably isolated from the remaining volume of gas enclosure 1002, by way of non-limiting example, by docking first printhead assembly 2500 onto first printhead assembly docking gasket 1345. As will be discussed subsequently in more detail herein, for various embodiments of a multi-zone gas circulation and filtration system of the present teachings, tunnel baffle plate 2150, shown partially in phantom view in FIG. 3A and FIG. 3B, can be mounted horizontally in a bridge enclosure section of a gas enclosure.

As depicted in the schematic front cross-section view of FIG. 3A and FIG. 3B, various embodiments of tunnel circulation and filtration system 1500 can include inlet baffle 2140, which can include inlet baffle support 2142. Inlet baffle 2140, in conjunction with tunnel enclosure 1200, can direct the flow of gas across floatation table 2200. Tunnel circulation and filtration system 1500 can include gas intake housing 1510, in which fan 1520, heat exchanger 1530, and filter unit 1540 can be mounted in series. Filter unit 1540 can have tunnel circulation and filtration diffuser 1545 in series with filter unit 1540, as depicted in FIG. 3A and FIG. 3B. In various embodiments, tunnel circulation and filtration diffuser 1545 can be a perforated metallic plate for creating a controlled distribution of flow. Various embodiments of tunnel circulation and filtration diffuser 1545 can be a filtration material having, for example, but not limited by, a porous structure for creating a controlled distribution of flow. For various embodiments of tunnel circulation and filtration diffuser 1545, gas flowing through the diffuser can provide for a desired controlled pressure drop, which can result in a controlled flow on an exit side of a diffuser. For example, a diffuser can be designed to offset an uneven flow profile entering a flow-directing structure, such as a duct, a baffle or a plenum, leading to uniform flow on an exit side of a diffuser. Additionally, various embodiments of a diffuser according to the present teachings can be designed for a specifically controlled non-uniform flow profile on an exit side of a diffuser.

For various embodiments of tunnel circulation and filtration system 1500, fan 1520 and filter unit 1540 can be combined into a fan filter unit. Various embodiments of a tunnel circulation and filtration zone can include outlet baffle 2141, which can include outlet baffle support 2143. Outlet baffle 2141, in conjunction with tunnel enclosure 1200, can direct the flow of gas in a downward direction to be circulated across floatation table 2200 and around a portion of a printing system housed in a first tunnel enclosure and second tunnel enclosure section (see also FIG. 1B), thereby providing a cross-flow path in a first tunnel enclosure and second tunnel enclosure section. In that regard, various embodiments of systems and methods of the present teachings can have a first tunnel circulation and filtration zone, as well as a second tunnel circulation and filtration zone. Various embodiments of tunnel circulation and filtration system 1500 can provide filtered gas that circulates across the tunnel zone of a gas enclosure system. As depicted in the cross-section view of FIG. 3A and FIG. 3B, various embodiments of a tunnel circulation and filtration system 1500 direct inert gas across substrate 2050. For gas enclosure system 500A, inlet baffle 2140 and outlet baffle 2141, in conjunction with first tunnel enclosure section 1200 can be used to direct the flow of filtered gas laterally, so that gas is circulated in a cross-flow path through gas enclosure system 500A.

In various embodiments of systems and methods of the present teachings, tunnel circulation and filtration system 1500 of FIG. 3A and FIG. 3B can provide circulation and filtration for both the first tunnel enclosure section, as well as the second tunnel enclosure section. According to various embodiments of systems and methods of the present teachings, a second tunnel circulation and filtration system having the components described for tunnel circulation and filtration system 1500 of first tunnel enclosure section 1200 of FIG. 3A and FIG. 3B can be provided for a second tunnel enclosure section, such as second tunnel enclosure section 1400 of FIG. 1A.

As will be discussed in more detail subsequently herein, gas enclosure system 500A can be in flow communication with a gas enclosure purification system. As depicted in FIG. 3A, gas purification first outlet line 3131A can provide flow communication between gas enclosure system 500A and a gas purification system. Similarly, gas purification inlet line 3133 can be a return line bringing purified inert gas to gas enclosure system 500A from a gas purification system. For example, during a printing process, gas flowing into auxiliary enclosure 1330 through first printhead assembly opening 1342 of FIG. 3A can be cycled to a gas purification system from gas purification first outlet line 3131A and purified inert gas can be directed back into gas enclosure 1002 through gas purification inlet line 3133. During such a process, gas purification second outlet line 3131B can be isolated from flow communication with a purification system, for example, by use of a valve (not shown) in a closed position. As shown in FIG. 3B, first printhead assembly opening 1342 can be constructed as a sealable section of gas enclosure assembly, for example, by the positioning of first printhead assembly 2500 onto first printhead assembly docking gasket 1345. According to systems and methods of the present teachings, an auxiliary enclosure can be sealable isolated from a printing system enclosure, and can be opened to an environment external a gas enclosure assembly. For example, while performing a maintenance procedure, auxiliary enclosure 1300 can be opened to the environment, as depicted in FIG. 3B, without exposing the remaining volume of gas enclosure 1002 to the external environment. As depicted in FIG. 3B, during such a process, gas purification second outlet line 3131B would be in flow communication with a purification system, and purified inert gas can be directed back into gas enclosure 1002 through gas purification inlet line 3133. During such a procedure, gas purification first outlet line 3131A can be isolated from flow communication with a purification system, for example, by use of a valve (not shown) in a closed position.

Figure 4:
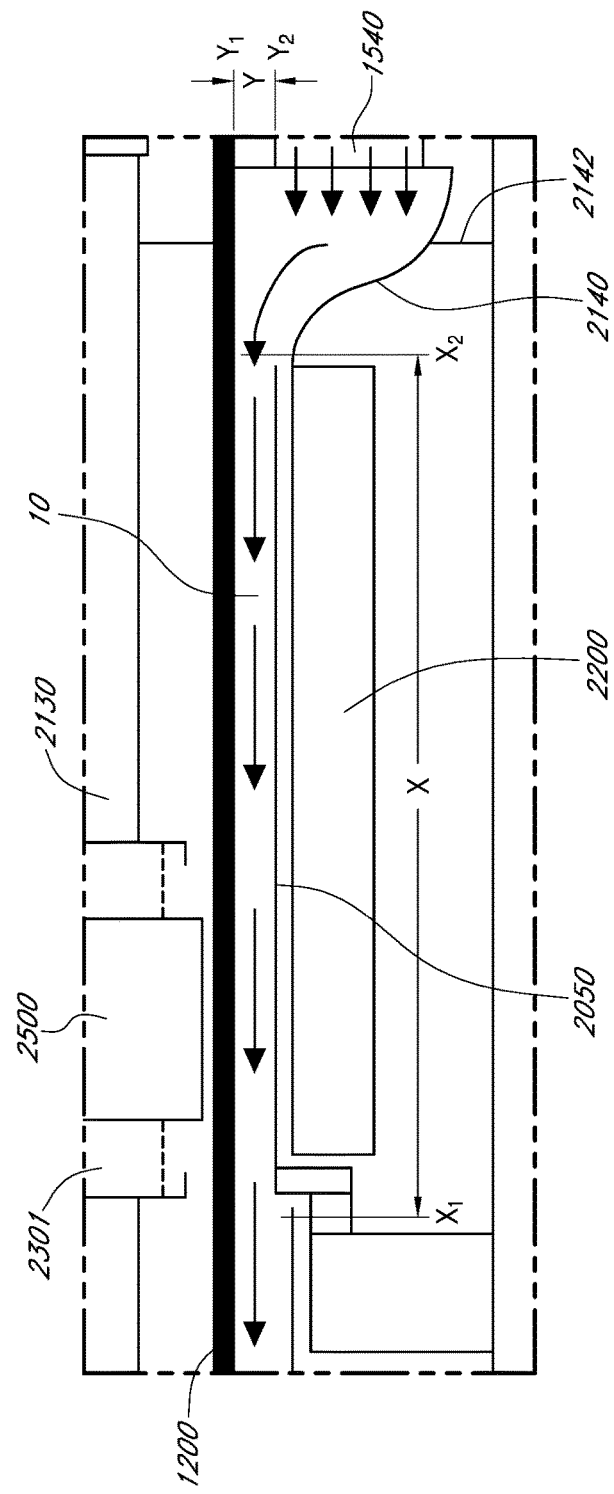
FIG. 4 is an enlarged schematic front cross-section view of a portion indicated in FIG. 3B.

As indicated in FIG. 3B, FIG. 4 is an enlarged view of a section of printing system 2002, which depicts filter unit 1540 of first tunnel circulation and filtration system 1500 X under bridge 2130 proximal to substrate 2050. Substrate 2050 is depicted in FIG. 4 as floatingly supported by floatation table 2200. First X-axis carriage assembly 2301, which has at least one printhead assembly, is controllably positioned in X-axis movement relative to substrate 2050 using a precision movement system. Various components essential to the printing system operation, for example, a service bundle are located proximal to substrate 2050 positioned for printing and can be an ongoing source of particulate matter. As shown in FIG. 4, inlet baffle 2140 in combination with first tunnel enclosure section 1200, can be used to direct a filtered gas stream over substrate 2050, indicated as substrate cross flow circulation path 10. Substrate cross flow circulation path 10 as depicted in FIG. 4 has cross-sectional dimensions X in the horizontal direction defined by $X_1$ and $X_2$ and Y in the vertical direction defined by $Y_1$ and $Y_2$. The flow velocity of a circulation and filtration system, such as circulation and filtration system 1500 (see FIG. 3A), is set in accordance with the longest horizontal dimension of substrate cross flow circulation path 10, so that a particle entering the flow stream at about $Y_1$ will be swept through substrate cross flow circulation path 10 and thereby will not make contact with substrate 2050.

The data in Table 3, shown below, summarizes a limit particle size that can be swept through substrate cross flow circulation path 10 of FIG. 4. The calculations were made in consideration of the longest horizontal dimension of each generation substrate size, as well as a range of flow rates from 0.1 to 1 m/s, and additionally in consideration of variation of densities of particles in the range of 1000-9000 $kg/m^3$. The upper limit of a particle size; reported as diameter in microns [μ], which includes the value of a diameter reported in Table 3 (i.e. ≤), was determined in consideration of two cases bounded by: 1) the lowest flow rate of 0.1 m/s and highest particle density of a particle of 9000 $kg/m^3$ and 2) the highest flow rate of 1 m/s and lowest density of a particle of 1000 $kg/m^3$. In that regard, the diameters reported represent a value in between those two bounds. The trend of the data indicate that as the longest horizontal dimension of substrate increases under the condition of fairly constant flow velocity, the average limit diameter of a particle that can be effectively swept through cross flow circulation path 10 decreases. However, the smallest particle size reported is for the longest cross flow circulation path for a Gen 10 substrate, and is substantially larger than particle sizes of interest. Accordingly, the summary of calculations presented in Table 3 demonstrate the effectiveness of various embodiments of systems and methods of the present teachings that utilize cross flow for preventing particles from contaminating a substrate surface during processing.

TABLE 3

Limit of particle size that can be swept by cross flow.

| Generation ID | X (mm) | Y (mm) | Area ($m^2$) | Limit Particle Size: Diameter ≤ μ [microns] |
|---|---|---|---|---|
| Gen 3.0 | 550 | 650 | 0.36 | 42 |
| Gen 3.5 | 610 | 720 | 0.44 | 40 |
| Gen 3.5 | 620 | 750 | 0.47 | 40 |
| Gen 4 | 680 | 880 | 0.6 | 38 |

TABLE 3-continued

Limit of particle size that can be swept by cross flow.

| Generation ID | X (mm) | Y (mm) | Area (m²) | Limit Particle Size: Diameter ≤ µ [microns] |
|---|---|---|---|---|
| Gen 4 | 730 | 920 | 0.67 | 37 |
| Gen 5 | 1100 | 1250 | 1.38 | 30 |
| Gen 5 | 1100 | 1300 | 1.43 | 30 |
| Gen 5.5 | 1300 | 1500 | 1.95 | 28 |
| Gen 6 | 1500 | 1850 | 2.78 | 26 |
| Gen 7.5 | 1950 | 2250 | 4.39 | 23 |
| Gen 8 | 2160 | 2400 | 5.18 | 21 |
| Gen 8 | 2160 | 2460 | 5.31 | 21 |
| Gen 8.5 | 2200 | 2500 | 5.5 | 21 |
| Gen 9 | 2400 | 2800 | 6.72 | 20 |
| Gen 10 | 2850 | 3050 | 8.69 | 19 |

Accordingly, the design of various embodiments of first tunnel circulation and filtration system 1500, in conjunction with other low-particle systems and methods of the present teachings, can provide a substantially low particle environment proximal a substrate for various embodiments of a gas enclosure system. As previously discussed herein, such a substantially low particle environment can have a specification for airborne particulate matter, as well as for on-substrate particulate matter. various embodiments of a multi-zone gas circulation and filtration system of the present teachings can effectively remove both airborne particulate matter in various sections of a gas enclosure, as well as particulate matter generated proximal to a substrate, for example, during a printing process.

Figure 5A:
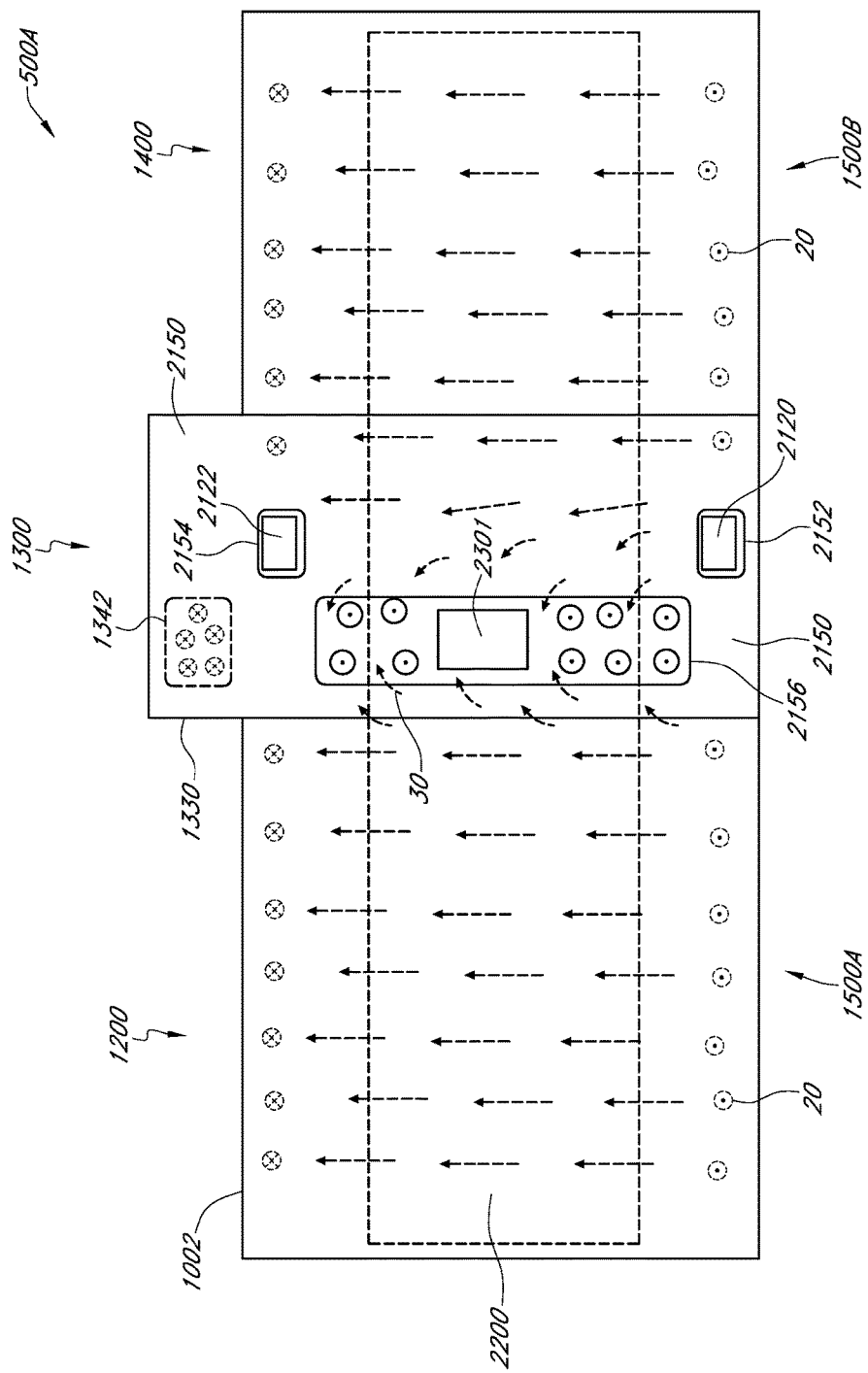
FIG. 5A is a schematic top section view of a gas enclosure system in accordance with various embodiments of the present teachings.

FIG. 5A is a schematic top section view of gas enclosure system 500A, depicting various embodiments of a tunnel circulation and filtration zone, as well various embodiments of a bridge circulation and filtration zone. The section is taken through gas enclosure 1002 above opening 1342 of auxiliary enclosure 1330 (see FIG. 1B). As previously discussed herein, various embodiments of systems and methods of the present teachings can have a gas enclosure with one auxiliary enclosure. Additionally, for various embodiments of systems and methods of the present teachings, a gas enclosure can have two auxiliary enclosures. In the schematic rending of FIG. 5A, tunnel cross flow circulation path 20 is depicted for first tunnel enclosure section 1200 and second tunnel enclosure section 1400 of gas enclosure system 500A. Tunnel cross flow circulation path 20 of FIG. 5A is depicted as a flow path circulating gas around a printing system, which can include floatation table 2200 (see FIG. 1B). According to various embodiments of a multi-zone circulation and filtration system of the present teachings, first tunnel circulation and filtration system 1500A can be positioned approximately mid-way in first tunnel enclosure section 1200. For various embodiments of systems and methods of the present teachings, gas enclosure system 500A may utilize a single tunnel circulation and filtration system. As depicted in FIG. 5A, various systems and methods of the present teachings can utilize two tunnel circulation and filtration systems, and can include second tunnel circulation and filtration system 1500B, which can be positioned approximately mid-way in second tunnel enclosure section 1400.

For gas enclosure system 500A of FIG. 5A, tunnel baffle plate 2150, mounted in bridge enclosure section 1300, can have first riser opening 2152, which accommodates first riser 2120, as well as having second riser opening 2154 for accommodating second riser 2122. Additionally, tunnel baffle plate 2150 can have carriage assembly opening 2156, which can allow for the movement of various carriage assemblies that can be mounted on a printing system bridge, such as X-axis carriage assembly 2301 depicted in FIG. 5A. Tunnel baffle plate carriage assembly opening 2156 can be in flow communication with various embodiments of a bridge circulation and filtration zone. Tunnel baffle plate carriage assembly opening 2156 can allow for transition zone flow path 30, as indicated by the direction of flow indicators in transition zone flow path 30. As such, tunnel baffle plate 2150 provides for flow communication from a tunnel circulation and filtration zone to a bridge circulation and filtration zone.

Figure 5B:
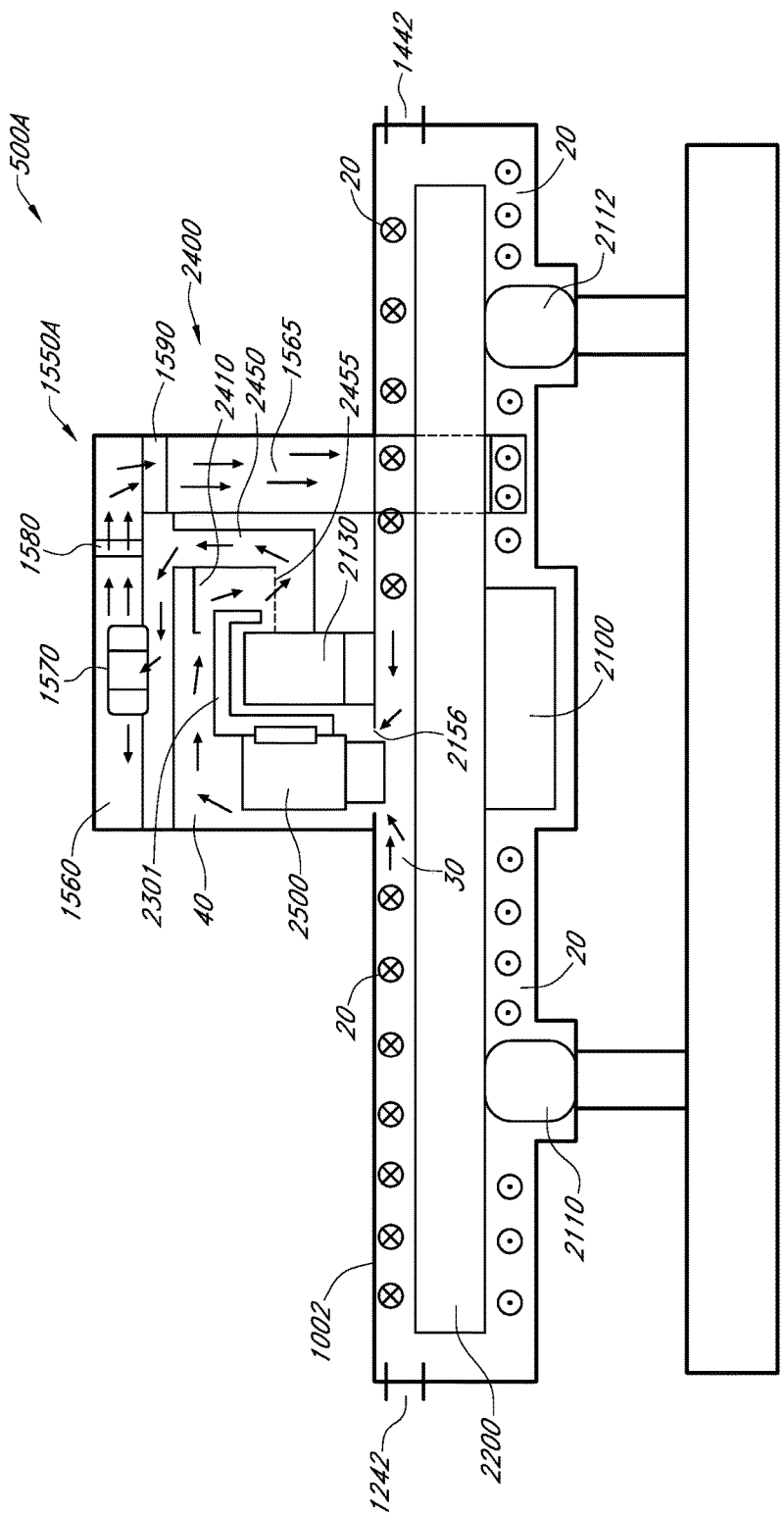
FIG. 5B is a long section schematic of view a gas enclosure system in accordance with various embodiments of the present teachings.

FIG. 5B is a schematic long section view through gas enclosure system 500A. Gas enclosure system 500A can have a printing system that can include floatation table 2200 that is supported by a first set of isolators 2110 and a second set of isolators 2112, as well as mounted on printing system base 2100. In FIG. 5B, tunnel cross flow circulation path 20 is depicted in long section view of gas enclosure 1002, with flow direction indicators showing the cross circulation path of filtered gas in the tunnel circulation and filtration zone of gas enclosure system 500A. Gas enclosure 1002 can have inlet opening or inlet gate 1242 for receiving a substrate, as well as outlet opening or outlet gate 1442 for transitioning a substrate from gas enclosure assembly 500A. In various embodiments of gas enclosure system 500A, there may be only a single gate 1242, which can be both an inlet and outlet gate. Various embodiments of a Y-axis motion system can move a substrate in the Y-axis direction relative to X-axis carriage assembly 2301 mounted on bridge 2130, which can have at least one printhead assembly mounted thereupon, such as printhead assembly 2500 depicted in FIG. 5B.

As depicted in FIG. 5B for gas enclosure system 500A, tunnel baffle plate carriage assembly opening 2156 can allow for transition zone flow path 30. In that regard, tunnel baffle plate 2150 can provide flow communication between a tunnel circulation and filtration zone and a bridge circulation and filtration zone. Bridge circulation and filtration system 1550A can have bridge circulation flow path 40, which can draw filtered gas in an upward direction around, for example, X-axis carriage assembly 2301. Bridge circulation and filtration system 1550A can include service bundle housing exhaust system 2400, which can include service bundle housing 2410, as well as bridge enclosure section exhaust duct 2450, which can exhaust service bundle housing 2410, and generally the bridge enclosure section, as indicated by flow path 40. Bridge enclosure section exhaust duct 2450 can have bridge enclosure section exhaust duct diffuser 2455, which can provide for a desired controlled pressure drop that can result in a controlled flow into bridge enclosure section exhaust duct 2450. In various embodiments, bridge enclosure section exhaust duct diffuser 2455 can be a perforated metallic plate for creating a controlled distribution of flow. Various embodiments of bridge enclosure section exhaust duct diffuser 2455 can be a filtration material having, for example, but not limited by, a porous structure for creating a controlled distribution of flow. For various embodiments of bridge enclosure section exhaust duct diffuser 2455, gas flowing through the diffuser can provide for a desired controlled pressure drop, which can result in a controlled flow on an exit side of a diffuser. For example, a diffuser can be designed to offset an uneven flow profile entering a flow-directing structure, such as a duct, a baffle or a plenum, leading to uniform flow on an exit side of a diffuser. Additionally, various embodiments of a diffuser according to the present teachings can be designed for a specifically controlled non-uniform flow profile on an exit side of a diffuser.

Bridge circulation and filtration system 1550A can include bridge circulation and filtration system intake duct 1560, which can be in flow communication with bridge enclosure section exhaust duct 2450. Bridge circulation and filtration system 1550A can include fan 1570, heat exchanger 1580, and filter 1590, which can be mounted within bridge circulation and filtration system intake duct 1560. For various embodiments of bridge circulation and filtration system 1550A, fan 1570 and filter unit 1590 can be combined into a fan filter unit. Bridge circulation and filtration system intake duct 1560 can be in flow communication with bridge circulation and filtration system return duct 1565. Bridge circulation and filtration system return duct 1565 can be in flow communication with a tunnel enclosure section, as indicated in FIG. 5B. Gas enclosure system 500A of FIG. 5B can have more than one bridge circulation and filtration return duct. For various embodiments of a multi-zone circulation and filtration system, a bridge circulation and filtration system return duct can complete the flow communication between a tunnel circulation and filtration zone and a bridge circulation and filtration zone.

Various embodiments of a cross flow design for systems and methods of the present teachings may utilize a combination of flow-directing structures, such as baffle plates, ducts and plenums to provide for a tunnel circulation and filtration zone and a bridge circulation and filtration zone that are not in active flow communication via a flow-directing structure. For example, FIG. 6 illustrates generally a cross section view of an embodiments of the present teachings in which a tunnel circulation and filtration zone and a bridge circulation and filtration zone that are substantially independent zones not in directed flow communication via a flow-directing structure.

Figure 6:
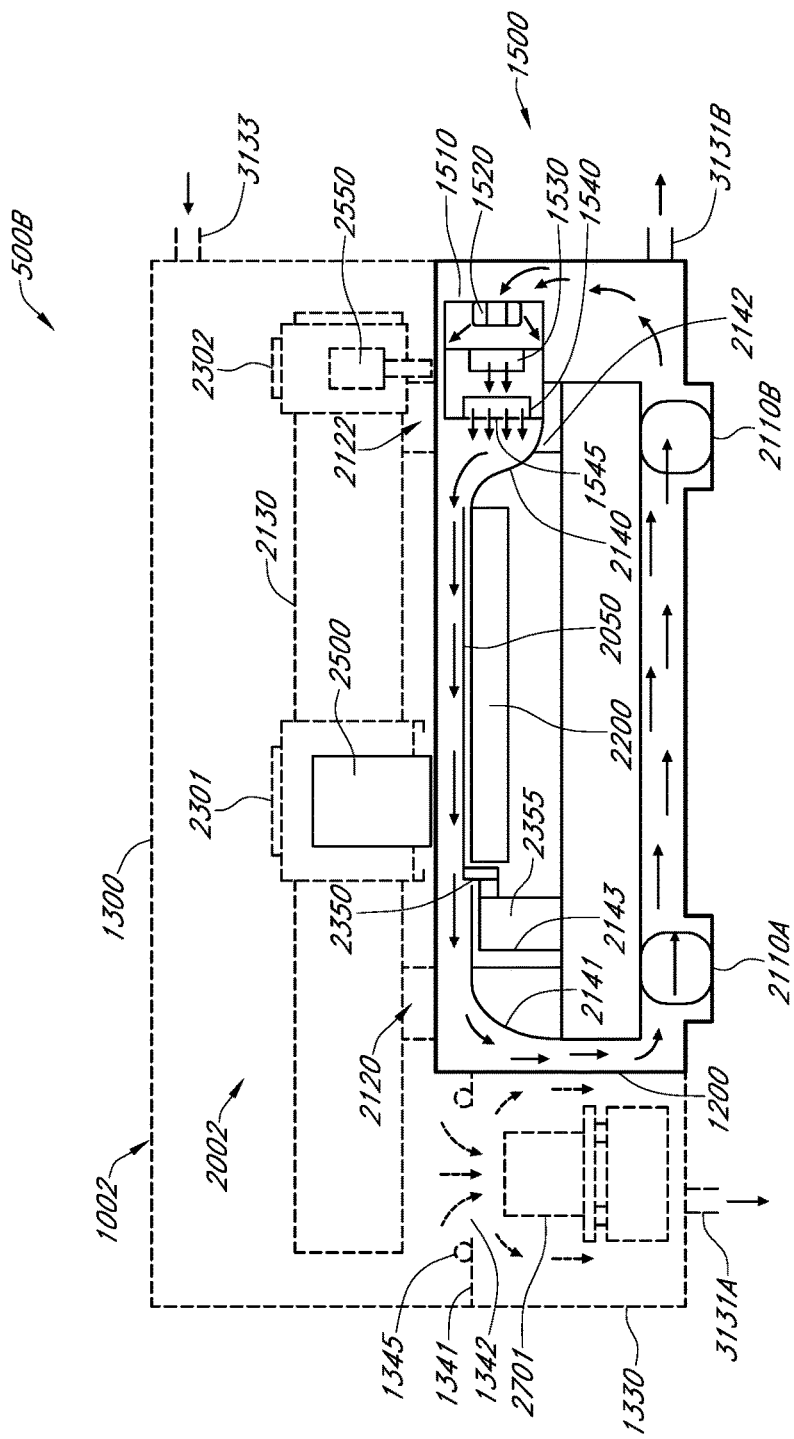
FIG. 6 is a schematic front cross-section view of various embodiments of gas enclosure assembly and related system components of the present teachings.

Similarly to gas enclosure system 500A of FIG. 3A and FIG. 3B, FIG. 6 illustrates generally tunnel circulation and filtration system 1500B of gas enclosure system 500B. Additionally, for perspective and context, features as described for various embodiments of gas enclosure 1000 of FIG. 1A, as well as printing system 2000 of FIG. 1B and FIG. 1C are depicted in phantom view through a section of bridge enclosure section 1300. Gas enclosure system 500B can have printing system 2002, which can be housed in gas enclosure 1002. Printing system 2002 can have printing system base 2100, which can be supported by at least two sets of isolators such as isolator set 2110 that includes isolators 2110A and 2110B of FIG. 3A and FIG. 3B. A Y-axis motion system can be mounted on printing system base 2100 and can include Y-axis track 2350, supported by Y-axis track support 2355. Substrate 2050 can be floatingly supported by substrate floatation table 2200. Printing system base 2100 can support first riser 2120 and second riser 2122, upon which bridge 2130 can be mounted. Printing system bridge 2130 can support first X-axis carriage assembly 2301, upon which printhead assembly 2500 can be mounted, and second X-axis carriage assembly 2302, upon which camera assembly 2550 can be mounted.

Additionally, gas enclosure system 500B of FIG. 6 can have auxiliary enclosure 1330, depicted in phantom view, which can enclose printhead management system 2701. Printing system 2000 of FIG. 1B depicts a gas enclosure having first auxiliary enclosure 1330 and second auxiliary enclosure 1370, while in FIG. 6, auxiliary enclosure 1330 is indicated. As such, various embodiments of systems and methods of the present teachings can have a gas enclosure with one auxiliary enclosure. In various embodiments of systems and methods of the present teachings, a gas enclosure can have two auxiliary enclosures. Auxiliary enclosure 1330 can be in flow communication with the printing system enclosure of gas enclosure system 500B through printhead assembly opening 1342, and can be sealably isolated from the remaining volume of gas enclosure 1002, by way of non-limiting example, by docking first printhead assembly 2500 onto first printhead assembly docking gasket 1345. As will be discussed in more detail subsequently herein, for various embodiments of a multi-zone gas circulation and filtration system of the present teachings, floor panel assembly 1341 (see also FIG. 1B) shown in phantom view in FIG. 6 can be configured as an auxiliary enclosure baffle structure for directing the flow of air into auxiliary enclosure 1330.

Similarly to what has been described for FIG. 3A, various embodiments of systems and methods illustrated generally by FIG. 6 can have a first tunnel enclosure section, and a second tunnel enclosure section, for example, as first tunnel enclosure section 1200 and second tunnel enclosure section 1400 of FIG. 1A. In various embodiments, each tunnel enclosure section can have a tunnel circulation and filtration system providing cross-flow about the tunnel enclosure section. Various embodiments of a tunnel circulation and filtration system of FIG. 6 can have a tunnel circulation and filtration system providing cross-flow for both the first tunnel enclosure section, as well as the second tunnel enclosure section. As illustrated generally in the schematic front cross-section view of FIG. 6, various embodiments of tunnel circulation and filtration system 1500 can include inlet baffle 2140, which can include inlet baffle support 2142. Inlet baffle 2140, in conjunction with tunnel enclosure 1200, can direct the flow of gas across floatation table 2200. Tunnel circulation and filtration system 1500 can include gas intake housing 1510, in which fan 1520, heat exchanger 1530, and filter unit 1540 can be mounted in series. Filter unit 1540 can have tunnel circulation and filtration diffuser 1545 in series with filter unit 1540, as depicted in FIG. 6. In various embodiments, tunnel circulation and filtration diffuser 1545 can be a perforated metallic plate for creating a controlled distribution of flow. Various embodiments of tunnel circulation and filtration diffuser 1545 can be a filtration material having, for example, but not limited by, a porous structure for creating a controlled distribution of flow. For various embodiments of tunnel circulation and filtration diffuser 1545, gas flowing through the diffuser can provide for a desired controlled pressure drop, which can result in a controlled flow on an exit side of a diffuser. For example, a diffuser can be designed to offset an uneven flow profile entering a flow-directing structure, such as a duct, a baffle or a plenum, leading to uniform flow on an exit side of a diffuser. Additionally, various embodiments of a diffuser according to the present teachings can be designed for a specifically controlled non-uniform flow profile on an exit side of a diffuser.

For various embodiments of tunnel circulation and filtration system 1500, fan 1520 and filter unit 1540 can be combined into a fan filter unit. Various embodiments of a tunnel circulation and filtration zone can include outlet baffle 2141, which can include outlet baffle support 2143. Outlet baffle 2141, in conjunction with tunnel enclosure 1200, can direct the flow of gas in a downward direction to be circulated across floatation table 2200 and around a portion of a printing system housed in a first tunnel enclosure and second tunnel enclosure section (see also FIG. 1B), thereby providing a cross-flow path in a first tunnel enclosure and second tunnel enclosure section. In that regard, various embodiments of systems and methods of the present teachings can have a first tunnel circulation and filtration zone, as well as a second tunnel circulation and filtration zone. Various embodiments of tunnel circulation and filtration system 1500 can provide filtered gas that circulates across the tunnel zone of a gas enclosure system.

For various systems and methods illustrated generally by FIG. 6, as previously discussed herein for FIG. 3A, FIG. 3B, as well as FIG. 4, a tunnel circulation and filtration system, such as tunnel circulation and filtration system 1500A can direct inert gas across substrate 2050. For gas enclosure system 500A, inlet baffle 2140 and outlet baffle 2141, in conjunction with first tunnel enclosure section 1200 can be used to direct the flow of filtered gas laterally, so that gas is circulated in a cross-flow path through gas enclosure system 500A. Additionally, for various systems and methods illustrated generally by FIG. 6, as previously discussed herein for FIG. 4 and Table 3, the cross flow of gas in a printing region proximal to a substrate can remove particles that may be generated by various printing system devices and apparatuses. As such, in addition to providing a low-particle environment throughout a tunnel enclosure section, the cross flow of gas in a printing region proximal to a substrate provides for a low-particle environment in a printing area proximal to a substrate.

Figure 7A:
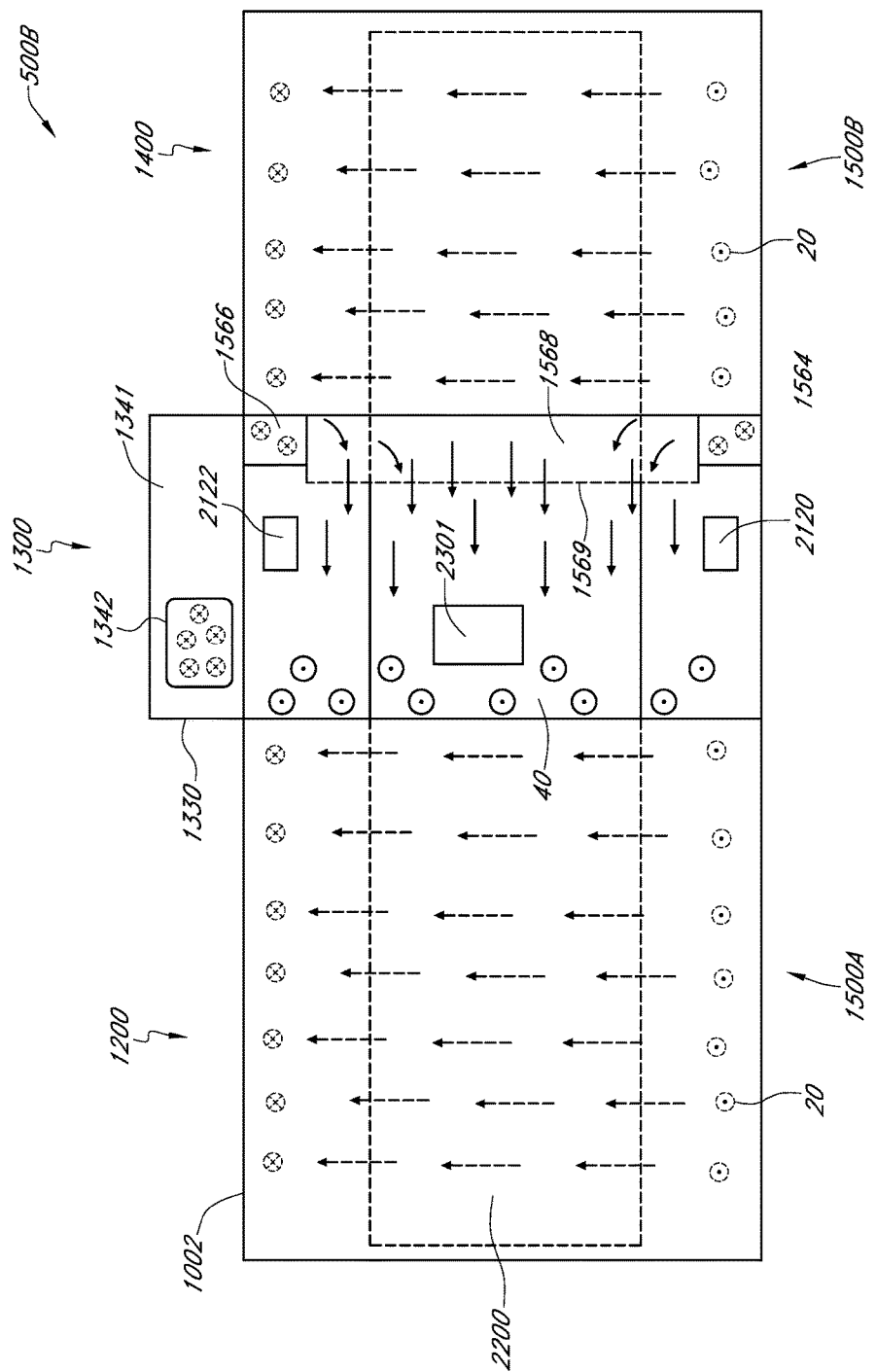
FIG. 7A is a schematic top section view of a gas enclosure system in accordance with various embodiments of the present teachings.

FIG. 7A is a schematic top section view of gas enclosure system 500B, depicting various embodiments of a tunnel circulation and filtration zone, as well various embodiments of a bridge circulation and filtration zone. The section is taken through gas enclosure 1002, at about the level of floor panel assembly 1341 (see also FIG. 1B), which can be configured as an auxiliary enclosure baffle structure for directing the flow of air into auxiliary enclosure 1330, as indicated in FIG. 7A. Auxiliary enclosure baffle structure 1341 can have opening 1342 of auxiliary enclosure 1330 (see FIG. 1B), around which gasket 1345 can be mounted. As previously discussed herein, various embodiments of systems and methods of the present teachings can have a gas enclosure with one auxiliary enclosure. Additionally, for various embodiments of systems and methods of the present teachings, a gas enclosure can have two auxiliary enclosures. In the schematic rending of FIG. 7A, tunnel cross flow circulation path 20 is depicted for first tunnel enclosure section 1200 and second tunnel enclosure section 1400 of gas enclosure system 500B. Cross flow circulation path 20 of FIG. 7A is depicted as a flow path circulating gas around a printing system, which can include floatation table 2200 (see FIG. 1B). According to various embodiments of a multi-zone circulation and filtration system of the present teachings, first tunnel circulation and filtration system 1500A can be positioned approximately mid-way in first tunnel enclosure section 1200. For various embodiments of systems and methods of the present teachings, gas enclosure system 500B may utilize a single tunnel circulation and filtration system. As depicted in FIG. 6, various systems and methods of the present teachings can utilize two tunnel circulation and filtration systems, and can include second tunnel circulation and filtration system 1500B, which can be positioned approximately mid-way in second tunnel enclosure section 1400.

Gas enclosure system 500B of FIG. 7A can have first riser 2120 and second riser 2122 for supporting bridge 2130 (see FIG. 6), upon which carriage assembly 2301 can be mounted. Bridge circulation and filtration system 1550B of gas enclosure system 500B of FIG. 7A can have bridge enclosure section first return duct 1566 and bridge enclosure section second return duct 1568, which can direct gas circulating into a bridge enclosure section output plenum 1568. Bridge enclosure section output plenum 1568 can have bridge circulation and filtration diffuser 1569. In various embodiments, bridge circulation and filtration diffuser 1569 can be a perforated metallic plate for creating a controlled distribution of flow. Various embodiments of bridge circulation and filtration diffuser 1569 can be a filtration material having, for example, but not limited by, a porous structure for creating a controlled distribution of flow. For various embodiments of bridge circulation and filtration diffuser 1569, gas flowing through the diffuser can provide for a desired controlled pressure drop, which can result in a controlled flow on an exit side of a diffuser. For example, a diffuser can be designed to offset an uneven flow profile entering a flow-directing structure, such as a duct, a baffle or a plenum, leading to uniform flow on an exit side of a diffuser. Additionally, various embodiments of a diffuser according to the present teachings can be designed for a specifically controlled non-uniform flow profile on an exit side of a diffuser. On the wall of the bridge enclosure section 1300 opposing the wall on which bridge circulation and filtration diffuser 1569 is located, a bridge enclosure section baffle can be mounted (not shown), which in conjunction with the bridge enclosure wall, can direct gas up around a printing system bridge and related apparatuses and devices. In that regard, various embodiments of a bridge circulation and filtration system of FIG. 7A can have flow directing structures such as a first and second return duct in flow communication with an output plenum with a flow diffuser, which can direct a flow of gas towards a baffle that can direct the gas up and around a printing system bridge and related apparatuses and devices and away from a substrate in a printing region.

Figure 7B:
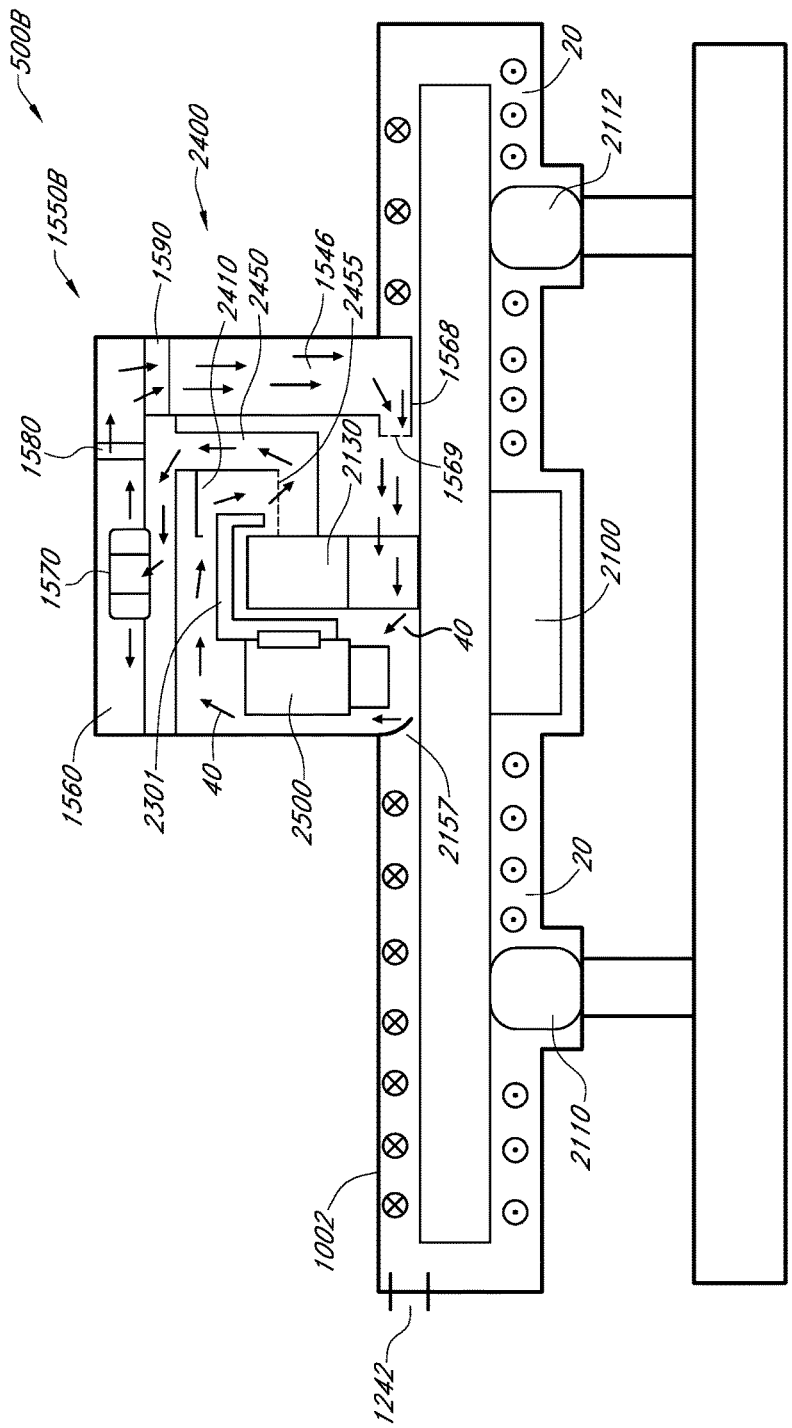
FIG. 7B is a long section schematic of view a gas enclosure system in accordance with various embodiments of the present teachings.

As depicted in FIG. 7B for gas enclosure system 500B, bridge enclosure section baffle 2157 can direct gas up and around printhead assembly 2500. Bridge circulation and filtration system 1550B can have bridge circulation flow path 40, which can draw filtered gas in an upward direction around, for example, X-axis carriage assembly 2301. Bridge circulation and filtration system 1550B can include service bundle housing exhaust system 2400, which can include service bundle housing 2410, as well as bridge enclosure section exhaust duct 2450, which can exhaust service bundle housing 2410, and generally the bridge enclosure section, as indicated by flow path 40. Bridge enclosure section exhaust duct 2450 can have bridge enclosure section exhaust duct diffuser 2455, which can provide for a desired controlled pressure drop that can result in a controlled flow into bridge enclosure section exhaust duct 2450. In various embodiments, bridge enclosure section exhaust duct diffuser 2455 can be a perforated metallic plate for creating a controlled distribution of flow. Various embodiments of bridge enclosure section exhaust duct diffuser 2455 can be a filtration material having, for example, but not limited by, a porous structure for creating a controlled distribution of flow. For various embodiments of bridge enclosure section exhaust duct diffuser 2455, gas flowing through the diffuser can provide for a desired controlled pressure drop, which can result in a controlled flow on an exit side of a diffuser. For example, a diffuser can be designed to offset an uneven flow profile entering a flow-directing structure, such as a duct, a baffle or a plenum, leading to uniform flow on an exit side of a diffuser. Additionally, various embodiments of a diffuser according to the present teachings can be designed for a specifically controlled non-uniform flow profile on an exit side of a diffuser.

Bridge circulation and filtration system 1550B can include bridge circulation and filtration system intake duct 1560, which can be in flow communication with bridge enclosure section exhaust duct 2450. Bridge circulation and filtration system 1550A can include fan 1570, heat exchanger 1580, and filter 1590, which can be mounted within bridge circulation and filtration system intake duct 1560. For various embodiments of bridge circulation and filtration system 1550A, fan 1570 and filter unit 1590 can be combined into a fan filter unit. Bridge circulation and filtration system intake duct 1560 can be in flow communication with bridge circulation and filtration system return first duct 1564 and bridge circulation and filtration system return second duct 1566. Bridge circulation and filtration system return first duct 1564 and bridge circulation and filtration system return second duct 1566 can be in flow communication with bridge enclosure section output plenum 1568 as indicated in FIG. 7B. Circulating gas can then flow through bridge circulation and filtration diffuser 1569, and can then be directed towards bridge enclosure section baffle 2157, completing bridge circulation flow path 40 thereby.

According to the present teachings, as depicted and illustrated generally for FIGS. 3A-7B, various embodiments of a multi-zone gas circulation and filtration system can effectively remove airborne particulate matter in various sections of a gas enclosure, such as a tunnel enclosure section and a bridge enclosure section. Additionally, various embodiments of a multi-zone gas circulation and filtration system of the present teachings can remove particulate matter generated proximal to a substrate during, for example, a printing process by utilizing various embodiments of a tunnel circulation and filtration system together with a bridge circulation and filtration system.

Figure 8:
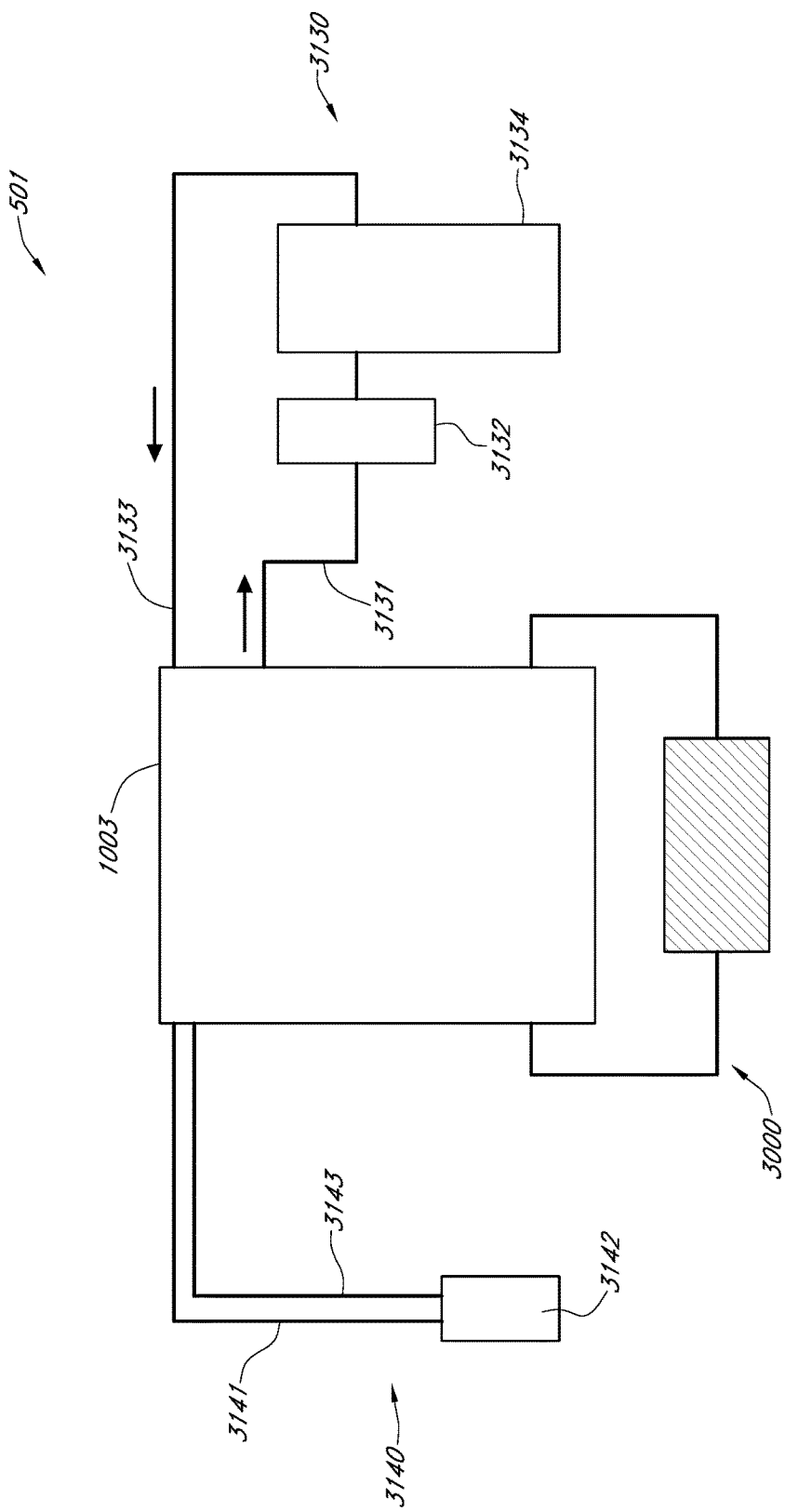
FIG. 8 is a schematic view of various embodiments of gas enclosure assembly and related system components the present teachings.

FIG. 8 is a schematic diagram showing a gas enclosure system 501. Various embodiments of a gas enclosure system 501 according to the present teachings can comprise gas enclosure assembly 1003 for housing a printing system, gas purification loop 3130 in fluid communication gas enclosure assembly 1003, and at least one thermal regulation system 3140. Additionally, various embodiments of gas enclosure system 501 can have pressurized inert gas recirculation system 3000, which can supply inert gas for operating various devices, such as a substrate floatation table for an OLED printing system. Various embodiments of a pressurized inert gas recirculation system 3000 can utilize a compressor, a blower and combinations of the two as sources for various embodiments of pressurized inert gas recirculation system 3000, as will be discussed in more detail subsequently herein. Additionally, gas enclosure system 501 can have a circulation and filtration system internal to gas enclosure system 501 (not shown).

As depicted in, for example, FIG. 3A, FIG. 3B, FIG. 5A, FIG. 5B, FIG. 6, FIG. 7A and FIG. 7B, for various embodiments of a gas enclosure assembly according to the present teachings, the design of a two zone tunnel circulation and filtration system, and a bridge circulation and filtration system can separate the inert gas circulated through gas purification loop 3130 from the inert gas that is continuously filtered and circulated internally for various embodiments of a gas enclosure assembly. Gas purification loop 3130 includes gas purification outlet line 3131 from gas enclosure assembly 1003, to a solvent removal component 3132 and then to gas purification system 3134. Inert gas purified of solvent and other reactive gas species, such as oxygen, ozone, and water vapor, are then returned to gas enclosure assembly 1003 through gas enclosure gas purification inlet line 3133, which receives purified gas from a gas purification outlet line. Gas purification loop 3130 may also include appropriate conduits and connections, and sensors, for example, oxygen, ozone, water vapor and solvent vapor sensors. A gas circulating unit, such as a fan, blower or motor and the like, can be separately provided or integrated, for example, in gas purification system 3134, to circulate gas through gas purification loop 3130. According to various embodiments of a gas enclosure assembly, though solvent removal system 3132 and gas purification system 3134 are shown as separate units in the schematic shown in FIG. 8, solvent removal system 3132 and gas purification system 3134 can be housed together as a single purification unit.

Gas purification loop 3130 of FIG. 8 can have solvent removal system 3132 placed upstream of gas purification system 3134, so that inert gas circulated from gas enclosure assembly 1003 passes through solvent removal system 3132 via gas purification outlet line 3131. According to various embodiments, solvent removal system 3132 may be a solvent trapping system based on adsorbing solvent vapor from an inert gas passing through solvent removal system 3132 of FIG. 8. A bed or beds of a sorbent, for example, but not limited by, such as activated charcoal, molecular sieves, and the like, may effectively remove a wide variety of organic solvent vapors. For various embodiments of a gas enclosure system cold trap technology may be employed to remove solvent vapors in solvent removal system 3132. As previously discussed herein, for various embodiments of a gas enclosure system according to the present teachings, sensors, such as oxygen, ozone, water vapor and solvent vapor sensors, may be used to monitor the effective removal of such species from inert gas continuously circulating through a gas enclosure system, such as gas enclosure system 501 of FIG. 8. Various embodiments of a solvent removal system can indicate when sorbent, such as activated carbon, molecular sieves, and the like, has reached capacity, so that the bed or beds of sorbent can be regenerated or replaced. Regeneration of a molecular sieve can involve heating the molecular sieve, contacting the molecular sieve with a forming gas, a combination thereof, and the like. Molecular sieves configured to trap various species, including oxygen, ozone, water vapor, and solvents, can be regenerated by heating and exposure to a forming gas that comprises hydrogen, for example, a forming gas comprising about 96% nitrogen and 4% hydrogen, with said percentages being by volume or by weight. Physical regeneration of activated charcoal can be done using a similar procedure of heating under an inert environment.

Any suitable gas purification system can be used for gas purification system 3134 of gas purification loop 3130 of FIG. 8. Gas purification systems available, for example, from MBRAUN Inc., of Statham, N.H., or Innovative Technology of Amesbury, Mass., may be useful for integration into various embodiments of a gas enclosure assembly according to the present teachings. Gas purification system 3134 can be used to purify one or more inert gases in gas enclosure system 501, for example, to purify the entire gas atmosphere within a gas enclosure assembly. As previously discussed herein, in order to circulate gas through gas purification loop 3130, gas purification system 3134 can have a gas circulating unit, such as a fan, blower or motor, and the like. In that regard, a gas purification system can be selected depending on the volume of the enclosure, which can define a volumetric flow rate for moving an inert gas through a gas purification system. For various embodiments of gas enclosure system having a gas enclosure assembly with a volume of up to about 4 $m^3$; a gas purification system that can move about 84 $m^3$/h can be used. For various embodiments of gas enclosure system having a gas enclosure assembly with a volume of up to about 10 m³; a gas purification system that can move about 155 m³/h can be used. For various embodiments of a gas enclosure assembly having a volume of between about 52-114 m³, more than one gas purification system may be used.

Any suitable gas filters or purifying devices can be included in the gas purification system 3134 of the present teachings. In some embodiments, a gas purification system can comprise two parallel purifying devices, such that one of the devices can be taken off line for maintenance and the other device can be used to continue system operation without interruption. In some embodiments, for example, the gas purification system can comprise one or more molecular sieves. In some embodiments, the gas purification system can comprise at least a first molecular sieve, and a second molecular sieve, such that, when one of the molecular sieves becomes saturated with impurities, or otherwise is deemed not to be operating efficiently enough, the system can switch to the other molecular sieve while regenerating the saturated or non-efficient molecular sieve. A control unit can be provided for determining the operational efficiency of each molecular sieve, for switching between operation of different molecular sieves, for regenerating one or more molecular sieves, or for a combination thereof. As previously discussed herein, molecular sieves may be regenerated and reused.

Thermal regulation system 3140 of FIG. 8 can include at least one chiller 3142, which can have fluid outlet line 3141 for circulating a coolant into a gas enclosure assembly, and fluid inlet line 3143 for returning the coolant to the chiller. An at least one fluid chiller 3142 can be provided for cooling the gas atmosphere within gas enclosure system 501. For various embodiments of a gas enclosure system of the present teachings, fluid chiller 3142 delivers cooled fluid to heat exchangers within the enclosure, where inert gas is passed over a filtration system internal the enclosure. At least one fluid chiller can also be provided with gas enclosure system 501 to cool heat evolving from an apparatus enclosed within gas enclosure system 501. For example, but not limited by, at least one fluid chiller can also be provided for gas enclosure system 501 to cool heat evolving from an OLED printing system. Thermal regulation system 3140 can comprise heat-exchange or Peltier devices and can have various cooling capacities. For example, for various embodiments of a gas enclosure system, a chiller can provide a cooling capacity of from between about 2 kW to about 20 kW. Various embodiments of a gas enclosure system can have a plurality of fluid chillers that can chill one or more fluids. In some embodiments, the fluid chillers can utilize a number of fluids as coolant, for example, but not limited by, water, anti-freeze, a refrigerant, and a combination thereof as a heat exchange fluid. Appropriate leak-free, locking connections can be used in connecting the associated conduits and system components.

As previously discussed herein, the present teachings disclose various embodiments of a gas enclosure system that can include a printing system enclosure defining a first volume and an auxiliary enclosure defining a second volume. Various embodiments of a gas enclosure system can have an auxiliary enclosure that can be constructed as a sealable section of gas enclosure assembly. According to systems and methods of the present teachings, an auxiliary enclosure can be sealable isolated from a printing system enclosure, and can be opened to an environment external a gas enclosure assembly without exposing a printing system enclosure to the external environment. Such physical isolation of an auxiliary enclosure to perform, for example, but not limited by, various printhead management procedures, can be done to eliminate or minimize the exposure of a printing system enclosure to contamination, such as air and water vapor and various organic vapors, as well as particulate contamination. Various printhead management procedures that can include measurement and maintenance procedures on a printhead assembly can be done with little or no interruption of a printing process, thereby minimizing or eliminating gas enclosure system downtime.

For a gas enclosure system having a printing system enclosure defining a first volume and an auxiliary enclosure defining a second volume, both volumes can be readily integrated with gas circulation, filtration and purification components to form a gas enclosure system that can sustain an inert, substantially low-particle environment for processes requiring such an environment with little or no interruption of a printing process. According to various systems and methods of the present teachings, a printing system enclosure may be introduced to a level of contamination that is sufficiently low that a purification system can remove the contamination before it can affect a printing process. Various embodiments of an auxiliary enclosure can be a substantially smaller volume of the total volume of a gas enclosure assembly and can be readily integrated with gas circulation, filtration and purification components to form an auxiliary enclosure system that can rapidly recover an inert, of a low-particle environment after exposure to an external environment, thereby providing little or no interruption of a printing process.

According to systems and methods of the present teachings, various embodiments of a printing system enclosure and an auxiliary enclosure constructed as sections of a gas enclosure assembly can be constructed in a fashion to provide for separately-functioning frame member assembly sections. Gas enclosure system 502 of FIG. 9 can have all elements disclosed, for example, for gas enclosure system 500A of FIG. 3A and FIG. 3B, and gas enclosure 501 of FIG. 8. Additionally, gas enclosure system 502 of FIG. 9, can have first gas enclosure assembly section 1004-S1 defining a first volume of gas enclosure assembly 1004 and second gas enclosure assembly section 1004-S2 defining a second volume of gas enclosure assembly 1004. If all valves, $V_1$, $V_2$, $V_3$ and $V_4$ are opened, then gas purification loop 3130 operates essentially as previously described for gas enclosure assembly and system 1003 of FIG. 9. With closure of $V_3$ and $V_4$, only first gas enclosure assembly section 1004-S1 is in fluid communication with gas purification loop 3130. This valve state may be used, for example, but not limited by, when second gas enclosure assembly section 1004-S2 is sealably closed and thereby isolated from first gas enclosure assembly section 1004-S1 during various measurement and maintenances procedure requiring that second gas enclosure assembly section 1004-S2 be opened to the atmosphere. With closure of $V_1$ and $V_2$, only second gas enclosure assembly section 1004-S2 is in fluid communication with gas purification loop 3130. This valve state may be used, for example, but not limited by, during recovery of second gas enclosure assembly section 1004-S2 after the section has been opened to the atmosphere. As previously discussed herein for the present teachings related to FIG. 9, the requirements for gas purification loop 3130 are specified with respect to the total volume of gas enclosure assembly 1003. Therefore, by devoting the resources of a gas purification system to the recovery of a gas enclosure assembly section, such as second gas enclosure assembly section 1004-S2, which is depicted for gas enclosure system

Figure 9:
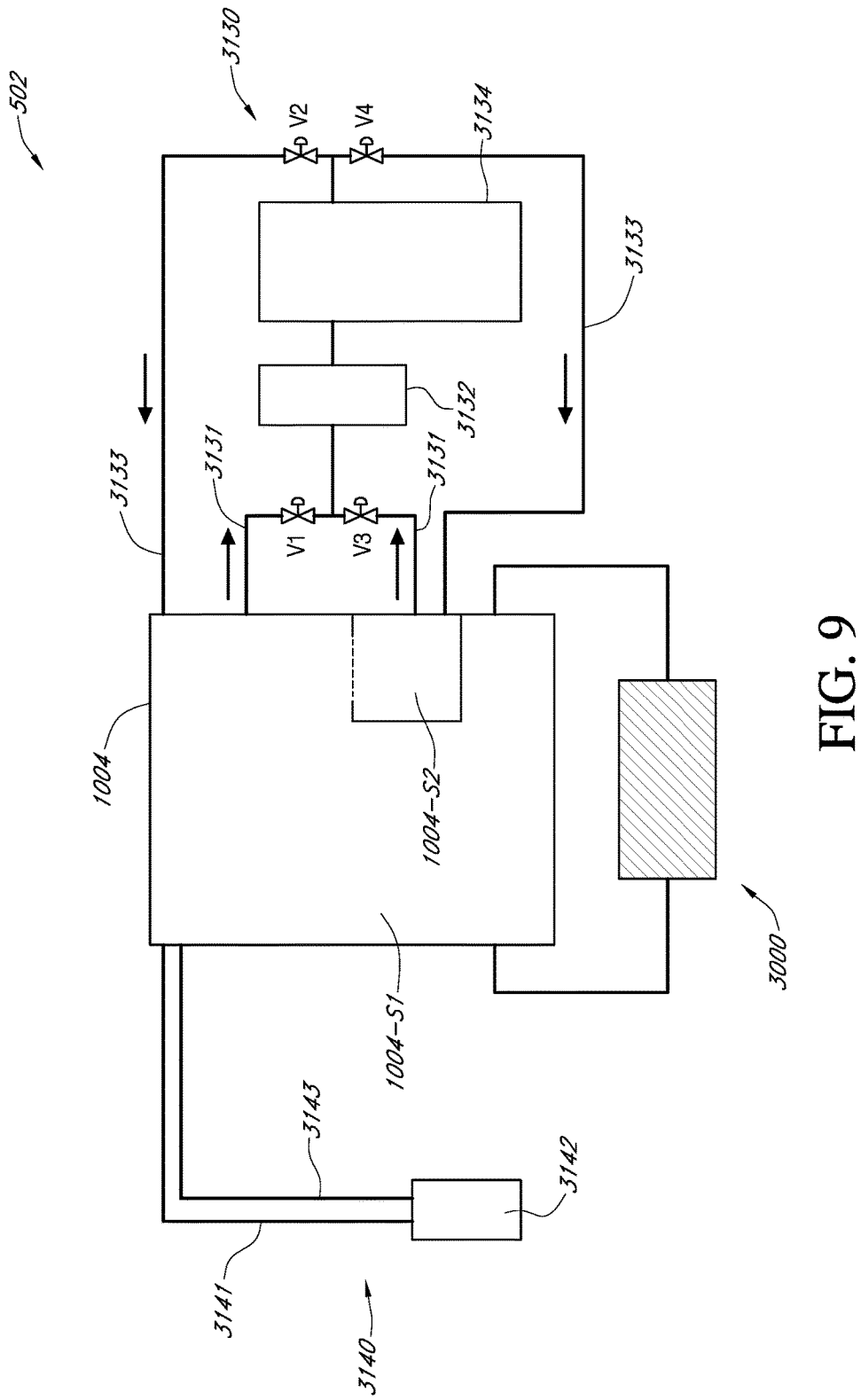
FIG. 9 is a schematic view of various embodiments of gas enclosure assembly and related system components the present teachings.

502 of FIG. 9 to be significantly less in volume than the total volume of gas enclosure 1004, the recovery time can be substantially reduced.

Additionally, various embodiments of an auxiliary enclosure can be readily integrated with a dedicated set of environmental regulation system components, such as lighting, gas circulation and filtration, gas purification, and thermostating components. In that regard, various embodiments of a gas enclosure system that include an auxiliary enclosure that can be sealably isolated as a section of gas enclosure assembly can have a controlled environment that is set to be uniform with a first volume defined by a gas enclosure assembly housing a printing system. Further, various embodiments of a gas enclosure system including an auxiliary enclosure that can be sealably isolated as a section of gas enclosure assembly can have a controlled environment that is set to be different than the controlled environment of a first volume defined by a gas enclosure assembly housing a printing system.

Figure 10A:
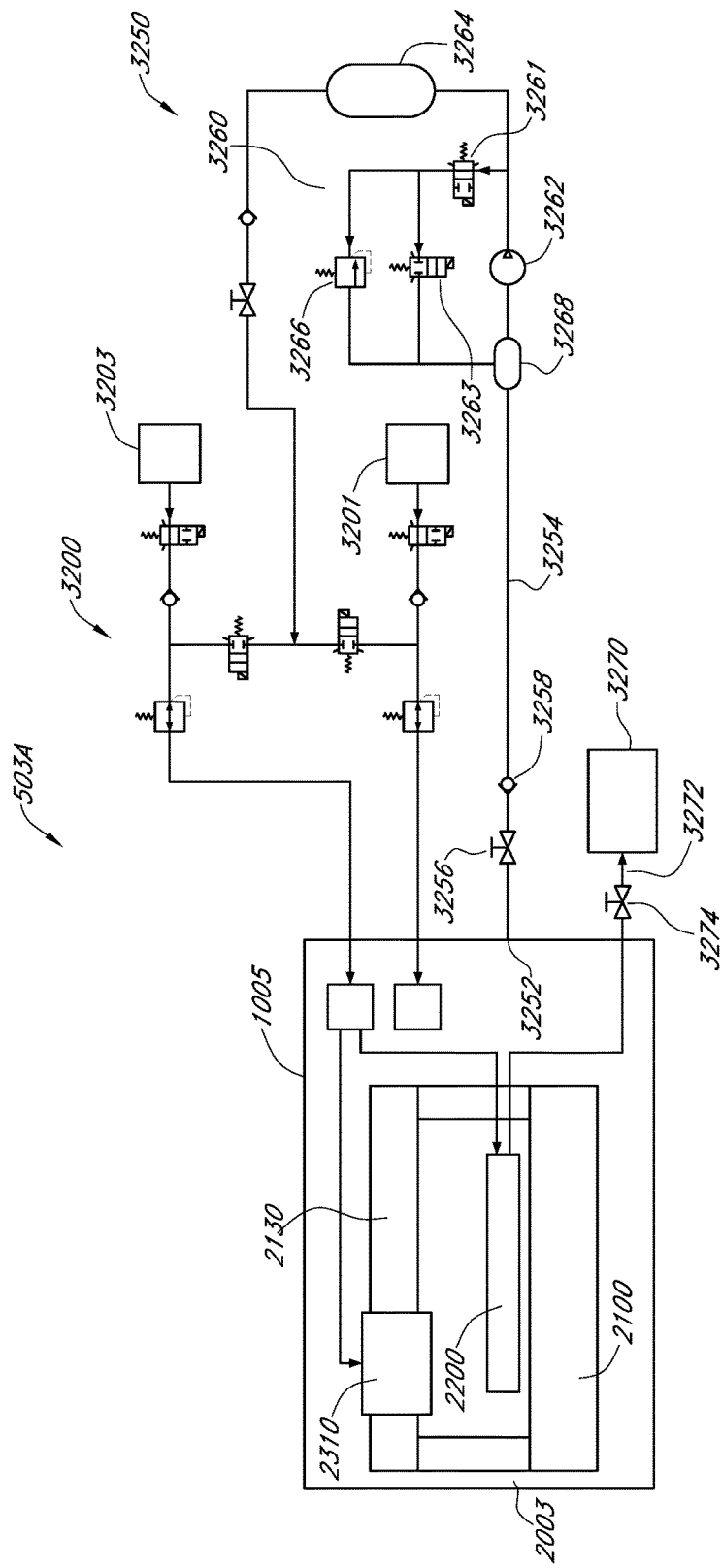
FIG. 10A and FIG. 10B are schematic views of various embodiments of gas enclosure assembly and related system components the present teachings.
Figure 10B:
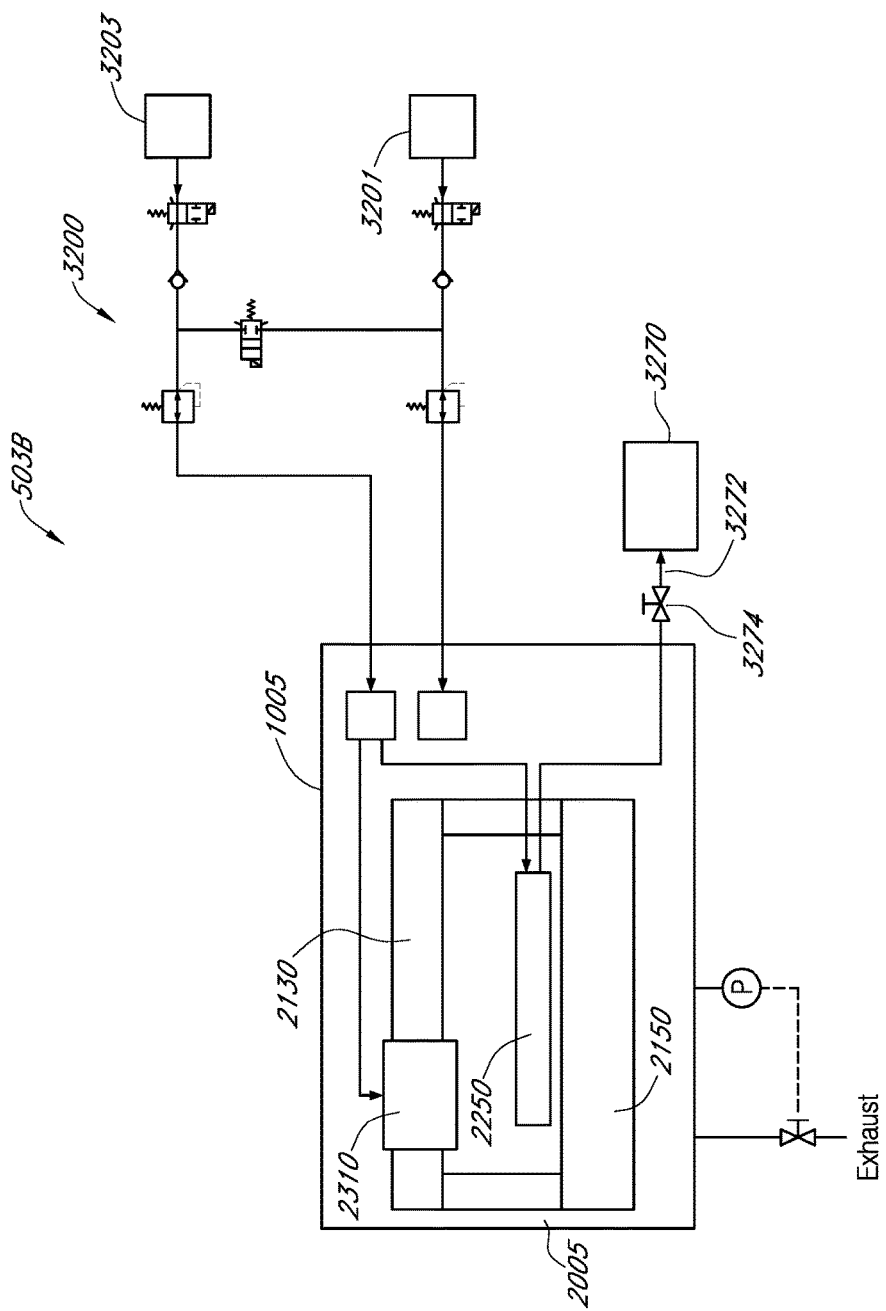
Figure 11A:
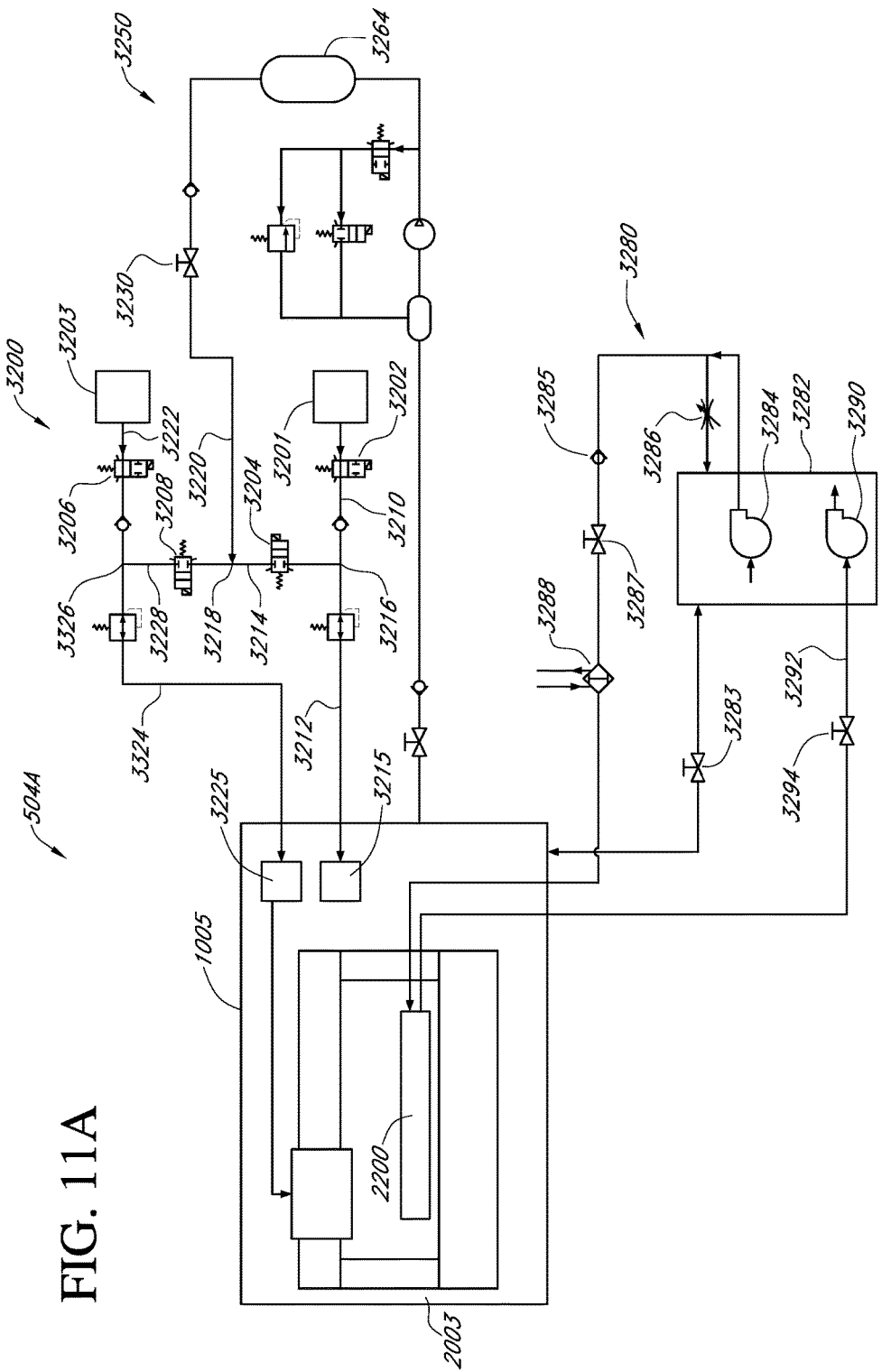
FIG. 11A, FIG. 11B and FIG. 11C are schematic views of various embodiments of gas enclosure assembly and related system components the present teachings.
Figure 11B:
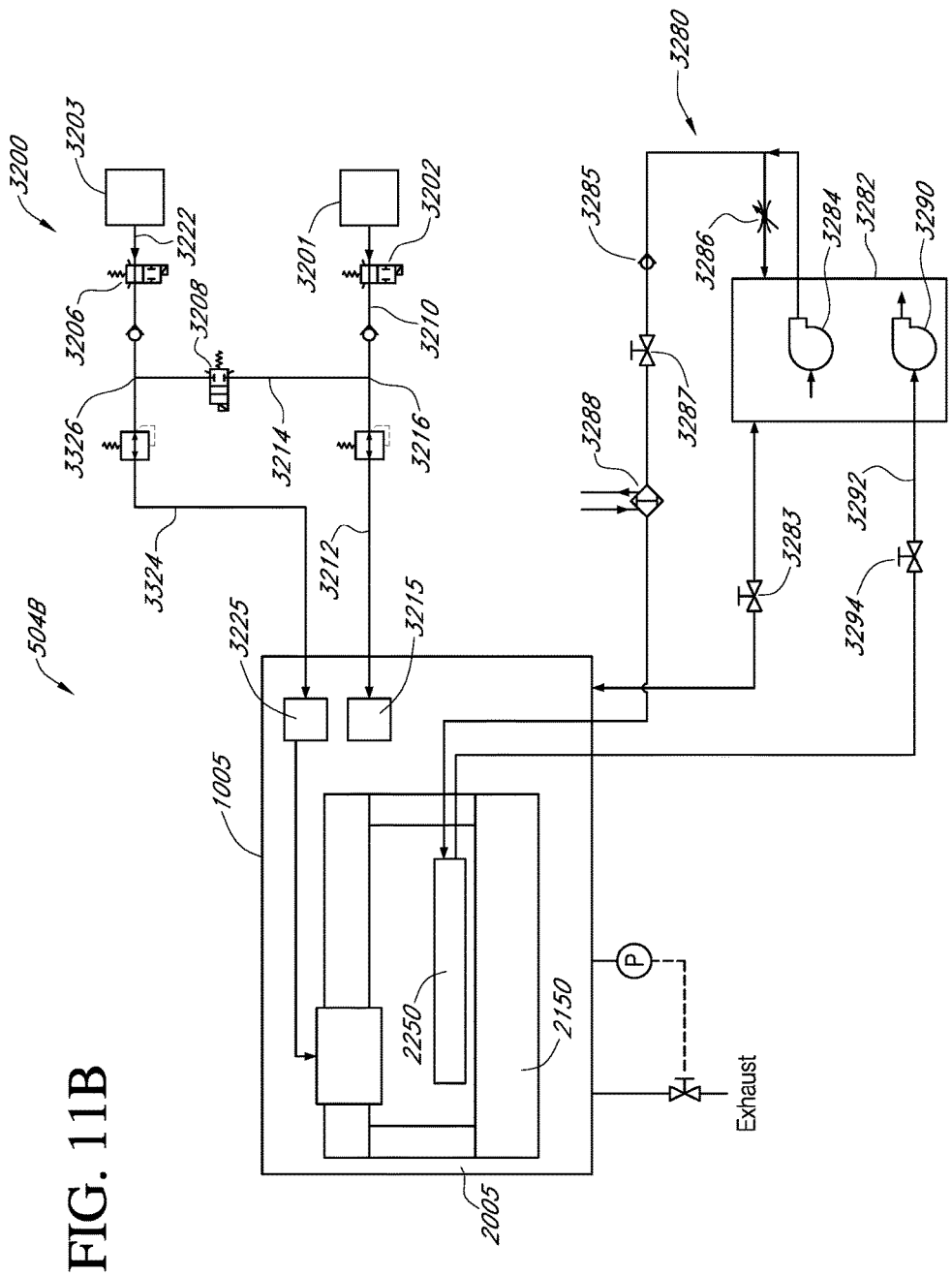
Figure 11C:
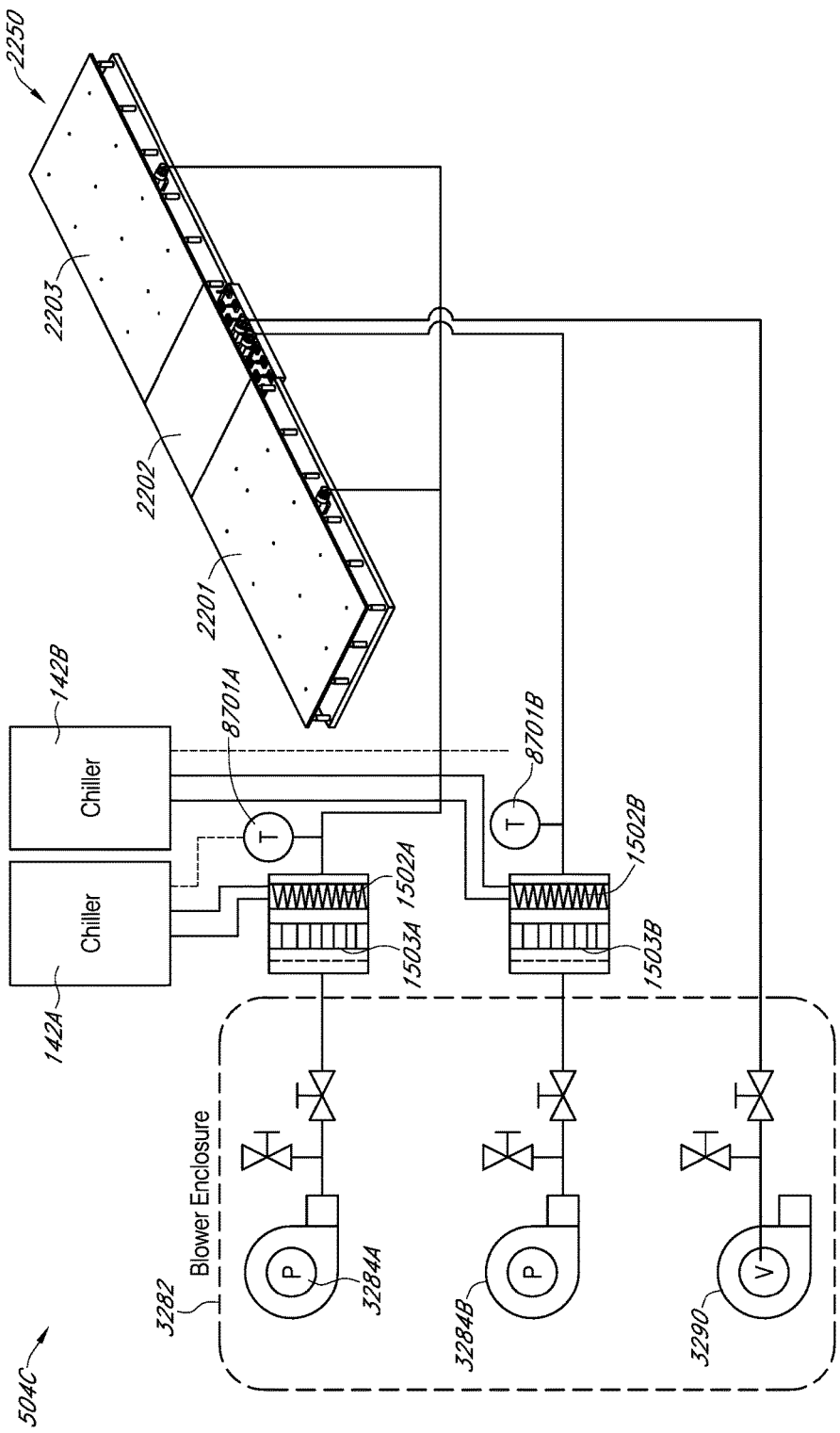

FIGS. 10A and 10B illustrate generally examples of a gas enclosure system for integrating and controlling non-reactive gas and clean dry air (CDA) sources such as can be used to establish the controlled environment referred to in other examples described elsewhere herein, and such as can include a supply of pressurized gas for use with a floatation table. FIGS. 11A and 11B illustrate generally examples of a gas enclosure system for integrating and controlling non-reactive gas and clean dry air (CDA) sources such as can be used to establish the controlled environment referred to in other examples described elsewhere herein, and such as can include a blower loop to provide, for example, pressurized gas and at least partial vacuum for use with a floatation table. FIG. 11C illustrates generally a further example of a system for integrating and controlling one or more gas or air sources, such as to establish floatation control zones included as a portion of a floatation conveyance system.

Recalling, various embodiments of a gas enclosure assembly utilized in embodiments of a gas enclosure system of the present teachings can be constructed in a contoured fashion that minimizes the internal volume of a gas enclosure assembly, and at the same time optimizes the working volume for accommodating various footprints of OLED printing systems designs. For example, various embodiments of a contoured gas enclosure assembly according to the present teachings can have a gas enclosure volume of between about 6 m$^3$ to about 95 m$^3$ for various embodiments of a gas enclosure assembly of the present teachings covering, for example, substrate sizes from Gen 3.5 to Gen 10. Various embodiments of a contoured gas enclosure assembly according to the present teachings can have a gas enclosure volume of, for example, but not limited by, of between about 15 m$^3$ to about 30 m$^3$, which might be useful for OLED printing of, for example, Gen 5.5 to Gen 8.5 substrate sizes. Various embodiments of an auxiliary enclosure can be constructed as a section of gas enclosure assembly and readily integrated with gas circulation and filtration, as well as purification components to form a gas enclosure system that can sustain an inert, substantially low-particle environment for processes requiring such an environment.

As shown in FIG. 10A and FIG. 11A, various embodiments of a gas enclosure system can include a pressurized inert gas recirculation system 3000. Various embodiments of a pressurized inert gas recirculation loop can utilize a compressor, a blower and combinations thereof.

According to the present teachings, several engineering challenges were addressed in order to provide for various embodiments of a pressurized inert gas recirculation system in a gas enclosure system. First, under typical operation of a gas enclosure system without a pressurized inert gas recirculation system, a gas enclosure system can be maintained at a slightly positive internal pressure relative to an external pressure in order to safeguard against outside gas or air from entering the interior should any leaks develop in a gas enclosure system. For example, under typical operation, for various embodiments of a gas enclosure system of the present teachings, the interior of a gas enclosure system can be maintained at a pressure relative to the surrounding atmosphere external to the enclosure system, for example, of at least 2 mbarg, for example, at a pressure of at least 4 mbarg, at a pressure of at least 6 mbarg, at a pressure of at least 8 mbarg, or at a higher pressure.

Maintaining a pressurized inert gas recirculation system within a gas enclosure system can be challenging, as it presents a dynamic and ongoing balancing act regarding maintaining a slight positive internal pressure of a gas enclosure system, while at the same time continuously introducing pressurized gas into a gas enclosure system. Further, variable demand of various devices and apparatuses can create an irregular pressure profile for various gas enclosure assemblies and systems of the present teachings. Maintaining a dynamic pressure balance for a gas enclosure system held at a slight positive pressure relative to the external environment under such conditions can provide for the integrity of an ongoing OLED printing process. For various embodiments of a gas enclosure system, a pressurized inert gas recirculation system according to the present teachings can include various embodiments of a pressurized inert gas loop that can utilize at least one of a compressor, an accumulator, and a blower, and combinations thereof. Various embodiments of a pressurized inert gas recirculation system that include various embodiments of a pressurized inert gas loop can have a specially designed pressure-controlled bypass loop that can provide internal pressure of an inert gas in a gas enclosure system of the present teachings at a stable, defined value. In various embodiments of a gas enclosure system, a pressurized inert gas recirculation system can be configured to recirculate pressurized inert gas via a pressure-controlled bypass loop when a pressure of an inert gas in an accumulator of a pressurized inert gas loop exceeds a pre-set threshold pressure. The threshold pressure can be, for example, within a range from between about 25 psig to about 200 psig, or more specifically within a range of between about 75 psig to about 125 psig, or more specifically within a range from between about 90 psig to about 95 psig. In that regard, a gas enclosure system of the present teachings having a pressurized inert gas recirculation system with various embodiments of a specially designed pressure-controlled bypass loop can maintain a balance of having a pressurized inert gas recirculation system in an hermetically sealed gas enclosure.

According to the present teachings, various devices and apparatuses can be disposed in the interior of a gas enclosure system and in fluid communication with various embodiments of a pressurized inert gas recirculation system. For various embodiments of a gas enclosure and system of the present teachings, the use of various pneumatically operated devices and apparatuses can provide low-particle generating performance, as well as being low maintenance. Exemplary devices and apparatuses that can be disposed in the interior of a gas enclosure system and in fluid communication with various pressurized inert gas loops can include, for example, but not limited by, one or more of a pneumatic robot, a substrate floatation table, an air bearing, an air bushing, a compressed gas tool, a pneumatic actuator, and combinations thereof. A substrate floatation table, as well as air bearings can be used for various aspects of operating an OLED printing system in accordance with various embodiments of a gas enclosure system of the present teachings. For example, a substrate floatation table utilizing air-bearing technology can be used to transport a substrate into position in a printhead chamber, as well as to support a substrate during an OLED printing process.

For example, as shown in FIG. 10A and FIG. 11A, various embodiments of gas enclosure system 503A and gas enclosure system 504A can have external gas loop 3200 for integrating and controlling inert gas source 3201 and clean dry air (CDA) source 3203 for use in various aspects of operation of gas enclosure system 503A and gas enclosure system 504A. Gas enclosure system 503A and gas enclosure system 504A can also include various embodiments of an internal particle filtration and gas circulation system, as well as various embodiments of an external gas purification system, as previously described. Such embodiments of a gas enclosure system can include a gas purification system for purifying various reactive species from an inert gas. Some commonly used non-limiting examples of an inert gas can include nitrogen, any of the noble gases, and any combination thereof. Various embodiments of a gas purification system according to the present teachings can maintain levels for each species of various reactive species, including various reactive atmospheric gases, such as water vapor, oxygen and ozone, as well as organic solvent vapors at 100 ppm or lower, for example, at 10 ppm or lower, at 1.0 ppm or lower, or at 0.1 ppm or lower. In addition to external loop 3200 for integrating and controlling inert gas source 3201 and CDA source 3203, gas enclosure system 503A and gas enclosure system 504A can have compressor loop 3250, which can supply inert gas for operating various devices and apparatuses that can be disposed in the interior of gas enclosure system 503A and gas enclosure system 504A.

Compressor loop 3250 of FIG. 10A can include compressor 3262, first accumulator 3264 and second accumulator 3268, which are configured to be in fluid communication. Compressor 3262 can be configured to compress inert gas withdrawn from gas enclosure assembly 1005 to a desired pressure. An inlet side of compressor loop 3250 can be in fluid communication with gas enclosure assembly 1005 via gas enclosure assembly outlet 3252 through line 3254, having valve 3256 and check valve 3258. Compressor loop 3250 can be in fluid communication with gas enclosure assembly 1005 on an outlet side of compressor loop 3250 via external gas loop 3200. Accumulator 3264 can be disposed between compressor 3262 and the junction of compressor loop 3250 with external gas loop 3200 and can be configured to generate a pressure of 5 psig or higher. Second accumulator 3268 can be in compressor loop 3250 for providing dampening fluctuations due to compressor piston cycling at about 60 Hz. For various embodiments of compressor loop 3250, first accumulator 3264 can have a capacity of between about 80 gallons to about 160 gallons, while second accumulator can have a capacity of between about 30 gallons to about 60 gallons. According to various embodiments of gas enclosure system 503A, compressor 3262 can be a zero ingress compressor. Various types of zero ingress compressors can operate without leaking atmospheric gases into various embodiments of a gas enclosure system of the present teachings. Various embodiments of a zero ingress compressor can be run continuously, for example, during an OLED printing process utilizing the use of various devices and apparatuses requiring compressed inert gas.

Accumulator 3264 can be configured to receive and accumulate compressed inert gas from compressor 3262. Accumulator 3264 can supply the compressed inert gas as needed in gas enclosure assembly 1005. For example, accumulator 3264 can provide gas to maintain pressure for various components of gas enclosure assembly 1005, such as, but not limited by, one or more of a pneumatic robot, a substrate floatation table, an air bearing, an air bushing, a compressed gas tool, a pneumatic actuator, and combinations thereof. As shown in FIG. 10A for gas enclosure system 503A, gas enclosure assembly 1005 can have an OLED printing system 2000 enclosed therein. As schematically depicted in FIG. 10A, inkjet printing system 2000 can be supported by printing system base 2100, which can be a granite stage. Printing system base 2100 can support a substrate support apparatus, such as a chuck, for example, but not limited by, a vacuum chuck, a substrate floatation chuck having pressure ports, and a substrate floatation chuck having vacuum and pressure ports. In various embodiments of the present teachings, a substrate support apparatus can be a substrate floatation table, such as substrate floatation table 2200 indicated in FIG. 10A. Substrate floatation table 2200 can be used for the frictionless support of a substrate. In addition to a low-particle generating floatation table, for frictionless Y-axis conveyance of a substrate, printing system 2000 can have a Y-axis motion system utilizing air bushings.

Additionally, printing system 2000 can have at least one X,Z-axis carriage assembly with motion control provided by a low-particle generating X-axis air bearing assembly. Various components of a low-particle generating motion system, such as an X-axis air bearing assembly, can be used in place of, for example, various particle-generating linear mechanical bearing systems. For various embodiments of a gas enclosure and system of the present teachings, the use of a variety of pneumatically operated devices and apparatuses can provide low-particle generating performance, as well as being low maintenance. Compressor loop 3250 can be configured to continuously supply pressurized inert gas to various devices and apparatuses of gas enclosure system 503A. In addition to a supply of pressurized inert gas, substrate floatation table 2200 of inkjet printing system 2000, which utilizes air bearing technology, also utilizes vacuum system 3270, which is in communication with gas enclosure assembly 1005 through line 3272 when valve 3274 is in an open position.

A pressurized inert gas recirculation system according to the present teachings can have pressure-controlled bypass loop 3260 as shown in FIG. 10A for compressor loop 3250, which acts to compensate for variable demand of pressurized gas during use, thereby providing dynamic balance for various embodiments of a gas enclosure system of the present teachings. For various embodiments of a gas enclosure system according to the present teachings, a bypass loop can maintain a constant pressure in accumulator 3264 without disrupting or changing the pressure in enclosure 1005. Bypass loop 3260 can have first bypass inlet valve 3261 on an inlet side of bypass loop, which is closed unless bypass loop 3260 is used. Bypass loop 3260 can also have back pressure regulator 3266, which can be used when second valve 3263 is closed. Bypass loop 3260 can have second accumulator 3268 disposed at an outlet side of bypass loop 3260. For embodiments of compressor loop 3250 utilizing a zero ingress compressor, bypass loop 3260 can compensate for small excursions of pressure that can occur over time during use of a gas enclosure system. Bypass loop 3260 can be in fluid communication with compressor loop 3250 on an inlet side of bypass loop 3260 when bypass inlet valve 3261 is in an opened position. When bypass inlet valve 3261 is opened, inert gas shunted through bypass loop 3260 can be recirculated to the compressor if inert gas from compressor loop 3250 is not in demand within the interior of gas enclosure assembly 1005. Compressor loop 3250 is configured to shunt inert gas through bypass loop 3260 when a pressure of the inert gas in accumulator 3264 exceeds a pre-set threshold pressure. A pre-set threshold pressure for accumulator 3264 can be from between about 25 psig to about 200 psig at a flow rate of at least about 1 cubic feet per minute (cfm), or from between about 50 psig to about 150 psig at a flow rate of at least about 1 cubic feet per minute (cfm), or from between about 75 psig to about 125 psig at a flow rate of at least about 1 cubic feet per minute (cfm) or between about 90 psig to about 95 psig at a flow rate of at least about 1 cubic feet per minute (cfm).

Various embodiments of compressor loop 3250 can utilize a variety of compressors other than a zero ingress compressor, such as a variable speed compressor or a compressor that can be controlled to be in either an on or off state. As previously discussed herein, a zero ingress compressor ensures that no atmospheric reactive species can be introduced into a gas enclosure system. As such, any compressor configuration preventing atmospheric reactive species from being introduced into a gas enclosure system can be utilized for compressor loop 3250. According to various embodiments, compressor 3262 of gas enclosure system 503A can be housed in, for example, but not limited by, an hermetically-sealed housing. The housing interior can be configured in fluid communication with a source of inert gas, for example, the same inert gas that forms the inert gas atmosphere for gas enclosure assembly 1005. For various embodiments of compressor loop 3250, compressor 3262 can be controlled at a constant speed to maintain a constant pressure. In other embodiments of compressor loop 3250 not utilizing a zero ingress compressor, compressor 3262 can be turned off when a maximum threshold pressure is reached, and turned on when a minimum threshold pressure is reached.

In FIG. 11A for gas enclosure system 504A, blower loop 3280 utilizing vacuum blower 3290 is shown for the operation of substrate floatation table 2200 of inkjet printing system 2000, which are housed in gas enclosure assembly 1005. As previously discussed herein for compressor loop 3250, blower loop 3280 can be configured to continuously supply pressurized inert gas to a substrate floatation table 2200 of printing system 2000.

Various embodiments of a gas enclosure system that can utilize a pressurized inert gas recirculation system can have various loops utilizing a variety of pressurized gas sources, such as at least one of a compressor, a blower, and combinations thereof. In FIG. 11A for gas enclosure system 504A, compressor loop 3250 can be in fluid communication with external gas loop 3200, which can be used for the supply of inert gas for high consumption manifold 3225, as well as low consumption manifold 3215. For various embodiments of a gas enclosure system according to the present teachings as shown in FIG. 11A for gas enclosure system 504A, high consumption manifold 3225 can be used to supply inert gas to various devices and apparatuses, such as, but not limited by, one or more of a substrate floatation table, a pneumatic robot, an air bearing, an air bushing, and a compressed gas tool, and combinations thereof. For various embodiments of a gas enclosure system according to the present teachings, low consumption 3215 can be used to supply inert gas to various apparatuses and devises, such as, but not limited by, one or more of an isolator, and a pneumatic actuator, and combinations thereof.

For various embodiments of gas enclosure system 504A of FIG. 11A, blower loop 3280 can be utilized to supply pressurized inert gas to various embodiments of substrate floatation table 2200, while compressor loop 3250; in fluid communication with external gas loop 3200, can be utilized to supply pressurized inert gas to, for example, but not limited by, one or more of a pneumatic robot, an air bearing, an air bushing, and a compressed gas tool, and combinations thereof. In addition to a supply of pressurized inert gas, substrate floatation table 2200 of OLED inkjet printing system 2000, which utilizes air bearing technology, also utilizes blower vacuum 3290, which is in communication with gas enclosure assembly 1005 through line 3292 when valve 3294 is in an open position. Housing 3282 of blower loop 3280 can maintain first blower 3284 for supplying a pressurized source of inert gas to substrate floatation table 2200, and second blower 3290, acting as a vacuum source for substrate floatation table 2200, which is housed in an inert gas environment in gas enclosure assembly 1005. Attributes that can make blowers suitable for use as a source of either pressurized inert gas or vacuum for various embodiments a substrate floatation table include, for example, but not limited by, that they have high reliability; making them low maintenance, have variable speed control, and have a wide range of flow volumes; various embodiments capable of providing a volume flow of between about 100 $m^3$/h to about 2,500 $m^3$/h. Various embodiments of blower loop 3280 additionally can have first isolation valve 3283 at an inlet end of blower loop 3280, as well as check valve 3285 and a second isolation valve 3287 at an outlet end of blower loop 3280. Various embodiments of blower loop 3280 can have adjustable valve 3286, which can be, for example, but not limited by, a gate, butterfly, needle or ball valve, as well as heat exchanger 3288 for maintaining inert gas from blower loop 3280 to substrate floatation table 2200 at a defined temperature.

FIG. 11A depicts external gas loop 3200, also shown in FIG. 10A, for integrating and controlling inert gas source 3201 and clean dry air (CDA) source 3203 for use in various aspects of operation of gas enclosure system 503A of FIG. 10A and gas enclosure system 504A of FIG. 11A. External gas loop 3200 of FIG. 10A and FIG. 11A can include at least four mechanical valves. These valves comprise first mechanical valve 3202, second mechanical valve 3204, third mechanical valve 3206, and fourth mechanical valve 3208. These various valves are located at positions in various flow lines that allow control of both an inert gas and an air source such as clean dry air (CDA). According to the present teachings, an inert gas may be any gas that does not undergo a chemical reaction under a defined set of conditions. Some commonly used non-limiting examples of an inert gas can include nitrogen, any of the noble gases, and any combination thereof. From a house inert gas source 3201, a house inert gas line 3210 extends. House inert gas line 3210 continues to extend linearly as low consumption manifold line 3212, which is in fluid communication with low consumption manifold 3215. A cross-line first section 3214 extends from a first flow juncture 3216, which is located at the intersection of house inert gas line 3210, low consumption manifold line 3212, and cross-line first section 3214. Cross-line first section 3214 extends to a second flow juncture 3218. A compressor inert gas line 3220 extends from accumulator 3264 of compressor loop 3250 and terminates at second flow juncture 3218. A CDA line 3222 extends from a CDA source 3203 and continues as high consumption manifold line 3224, which is in fluid communication with high consumption manifold 3225. A third flow juncture 3226 is positioned at the intersection of a cross-line second section 3228, clean dry air line 3222, and high consumption manifold line 3224. Cross-line second section 3228 extends from second flow juncture 3218 to third flow juncture 3226. Various components that are high consumption can be supplied CDA during maintenance, by means high consumption manifold 3225. Isolating the compressor using valves 3204, 3208, and 3230 can prevent reactive species, such as oxygen, ozone and water vapor from contaminating an inert gas within the compressor and accumulator.

By contrast with FIGS. 10A and 11A, FIGS. 10B and 11B illustrate generally a configuration wherein a pressure of gas inside the gas enclosure assembly 1005 can be maintained within a desired or specified range, such as using a valve coupled to a pressure monitor, P, where the valve allows gas to be exhausted to another enclosure, system, or a region surrounding the gas enclosure assembly 1005 using information obtained from the pressure monitor. Such gas can be recovered and re-processed as in other examples described herein. As mentioned above, such regulation can assist in maintaining a slight positive internal pressure of a gas enclosure system, because pressurized gas is also contemporaneously introduced into the gas enclosure system. Variable demand of various devices and apparatuses can create an irregular pressure profile for various gas enclosure assemblies and systems of the present teachings. Accordingly, the approach shown in FIGS. 10B and 11B for gas enclosure systems 503B and 504B, respectively, can be used in addition or instead of other approaches described herein such as to assist in maintaining a dynamic pressure balance for a gas enclosure system held at a slight positive pressure relative to the environment surrounding the enclosure.

FIG. 11C illustrates generally a further example of printing system 504C for integrating and controlling one or more gas or air sources, such as to establish floatation control zones included as a portion of a floatation conveyance system. Similar to the examples of FIG. 1C, as well as FIG. 10A through FIG. 11B, FIG. 11C illustrates generally floatation table 2200. Additionally shown in the illustrative example of FIG. 11C are first region 2201, printing region 2202, and second region 2203. According to various embodiments of printing system 504C of FIG. 11C, first region 2201 can be an input region, and second region 2203 can be an output region. For various embodiments of printing system 504C of FIG. 11C, first region 2201 can be both an input and an output region. Function referred to in association with regions 2201, 2202, and 2203, such as input, printing, and output for illustration only. Such regions can be used for other processing steps, such as conveyance of a substrate, or support of a substrate such as during one or more of holding, drying, or thermal treatment of the substrate in one or more other modules. In the illustration of FIG. 11C, a first blower 3284A is configured to provide pressurized gas in one or more of the input or output regions 2201 or 2203 of a floatation table apparatus. Such pressurized gas can be temperature controlled such as using a first chiller 142A coupled to a first heat exchanger 1502A. Such pressurized gas can be filtered using a first filter 1503A. A temperature monitor 8701A can be coupled to the first chiller 142 (or other temperature controller).

Similarly, as depicted in FIG. 11C, a second blower 3284B can be coupled to the printing region 2202 of the floatation table. A separate chiller 142B can be coupled to a loop including a second heat exchanger 1502B and a second filter 1503B. A second temperature monitor 8701B can be used to provide independent regulation of the temperature of pressurized gas provided by the second blower 3284B. In this illustrative example, as previously described herein for FIG. 1C, first and second regions 2201 and 2203 can be supplied with positive pressure, while printing region 2202 can include use of a combination of positive pressure and vacuum control to provide precise control over the substrate position. For example, using such a combination of positive pressure and vacuum control, the substrate can be exclusively controlled using the floating gas cushion provided by gas enclosure system 504C in the zone defined by the printing region 2202. The vacuum can be established by a third blower 3290, such as also provided at least a portion of the make-up gas for the first and second blowers 3284A or 3284B within the blower housing 3282.

Figure 12:
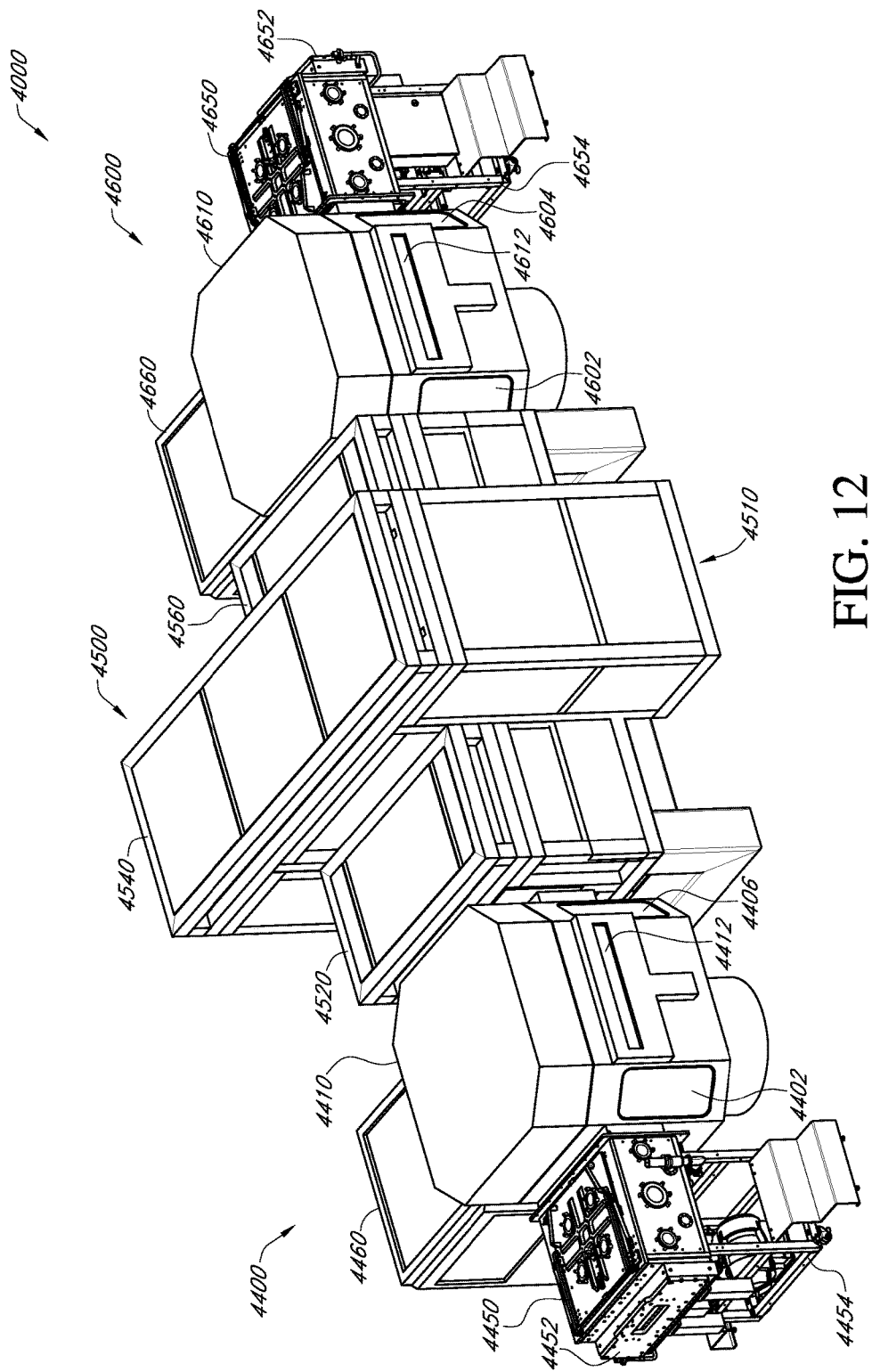
FIG. 12 is a front perspective view of view of a gas enclosure assembly in accordance with various embodiments of the present teachings.

FIG. 12 depicts a perspective view of OLED printing tool 4000 according to various embodiments of the present teachings, which can include first module 4400, printing module 4500, and second module 4600. Various modules, such as first module 4400 can have first transfer chamber 4410, which can have a gate, such as gate 4412, for each side of first transfer chamber 4410 to accommodate various chambers having a specified function. As depicted in FIG. 12 first transfer chamber 4410 can have a load lock gate (not shown) for integration of first load lock chamber 4450 with first transfer chamber 4410, as well as a buffer gate (not shown) for integration of first buffer chamber 4460 with first transfer chamber 4410. Gate 4412 of first transfer chamber 4410 can be used for a chamber or unit that can be movable, such as, but not limited by, a load lock chamber. Observation windows, such as observation windows 4402 and 4404 of first transfer chamber 4410, as well as observation window 4406 of first buffer chamber 4460, can be provided for an end user to, for example, monitor a process. Printing module 4500 can include gas enclosure assembly 4510, which can have first panel assembly 4520, printing system enclosure assembly 4540, and second panel assembly 4560. Similar to gas enclosure assembly 1000 of FIG. 1B, gas enclosure assembly 4510 can house various embodiments of a printing system. Second module 4600 can include second transfer chamber 4610, which can have a gate, such as gate 4612, for each side of second transfer chamber 4610 to accommodate various chambers having a specified function. As depicted in FIG. 12 second transfer chamber 4610 can have a load lock gate (not shown) for integration of second load lock chamber 4650 with second transfer chamber 4610, as well as a buffer gate (not shown) for integration of second buffer chamber 4660 with second transfer chamber 4610. Gate 4612 of second transfer chamber 4610 can be used for a chamber or unit that can be movable, such as, but not limited by, a load lock chamber. Observation windows, such as observation windows 4602 and 4604 of second transfer chamber 4610, can be provided for an end user to, for example, monitor a process.

First load lock chamber 4450 and second load lock chamber 4650 can be affixably associated with first transfer chamber 4410 and second transfer chamber 4610, respectively or can be movable, such as on wheels or on a track assembly, so that they can be readily positioned for use proximal a chamber. A load lock chamber can be mounted to a support structure and can have at least two gates. For example first load lock chamber 4450 can be supported by first support structure 4454 and can have first gate 4452, as well as a second gate (not shown) that can allow fluid communication with first transfer module 4410. Similarly, second load lock chamber 4650 can be supported by second support structure 4654 and can have second gate 4652, as well as a first gate (not shown) that can allow fluid communication with second transfer module 4610.

As previously discussed herein, various embodiments of a gas enclosure system can have an auxiliary enclosure that can be constructed as a sealable section of gas enclosure assembly. According to systems and methods of the present teachings, an auxiliary enclosure can be sealable isolated from a printing system enclosure, and can be opened to an environment external a gas enclosure assembly without exposing a printing system enclosure to the external environment. Such physical isolation of an auxiliary enclosure to perform, for example, but not limited by, various printhead management procedures, can be done to eliminate or minimize the exposure of a printing system enclosure to contamination, such as air and water vapor and various organic vapors, as well as particulate contamination. Various printhead management procedures that can include measurement and maintenance procedures on a printhead assembly can be done with little or no interruption of a printing process, thereby minimizing or eliminating gas enclosure system downtime.

Figure 13A:
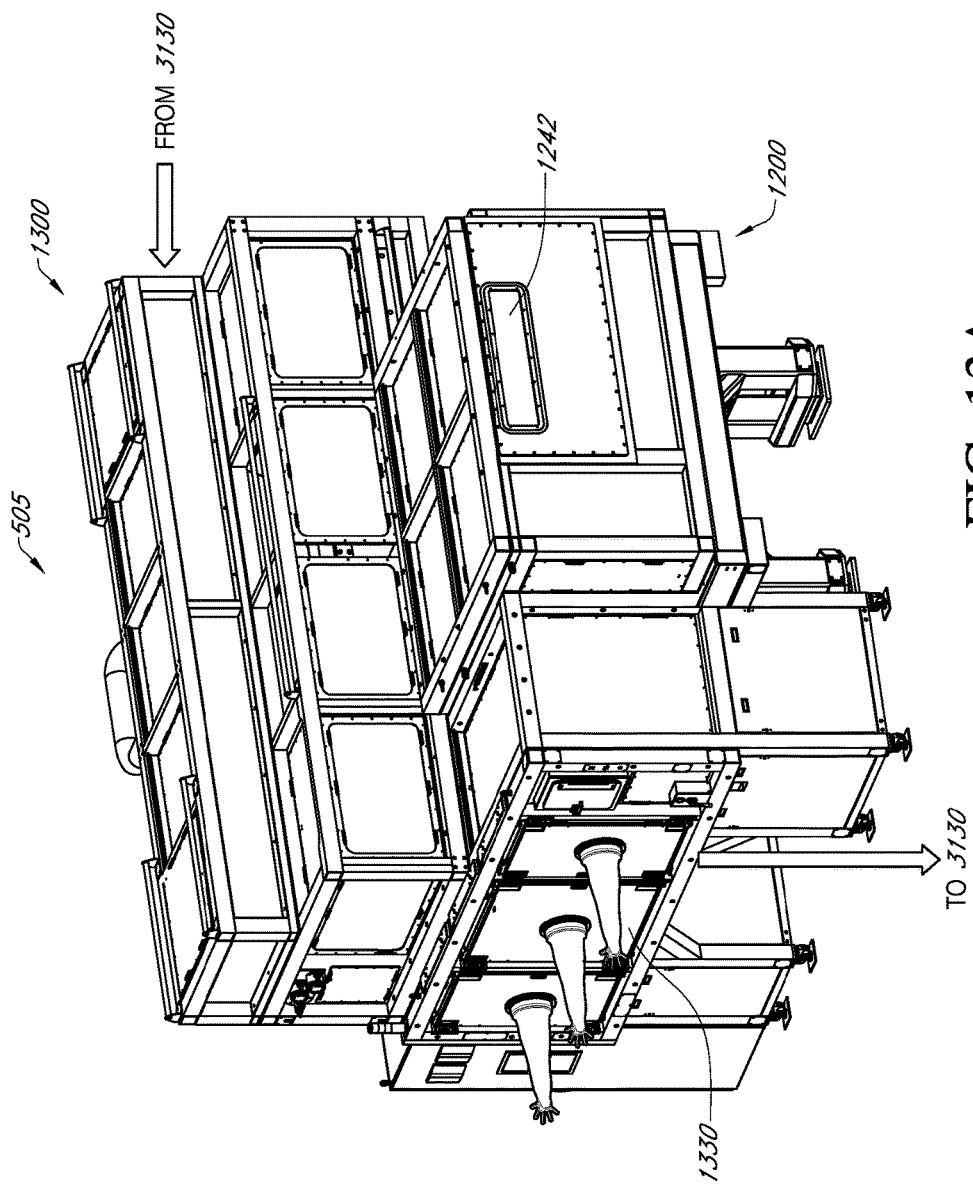
FIG. 13A through FIG. 13D depicts the flow communication between a purification system and a gas enclosure system during various operations in accordance with various embodiments of the present teachings.
Figure 13B:
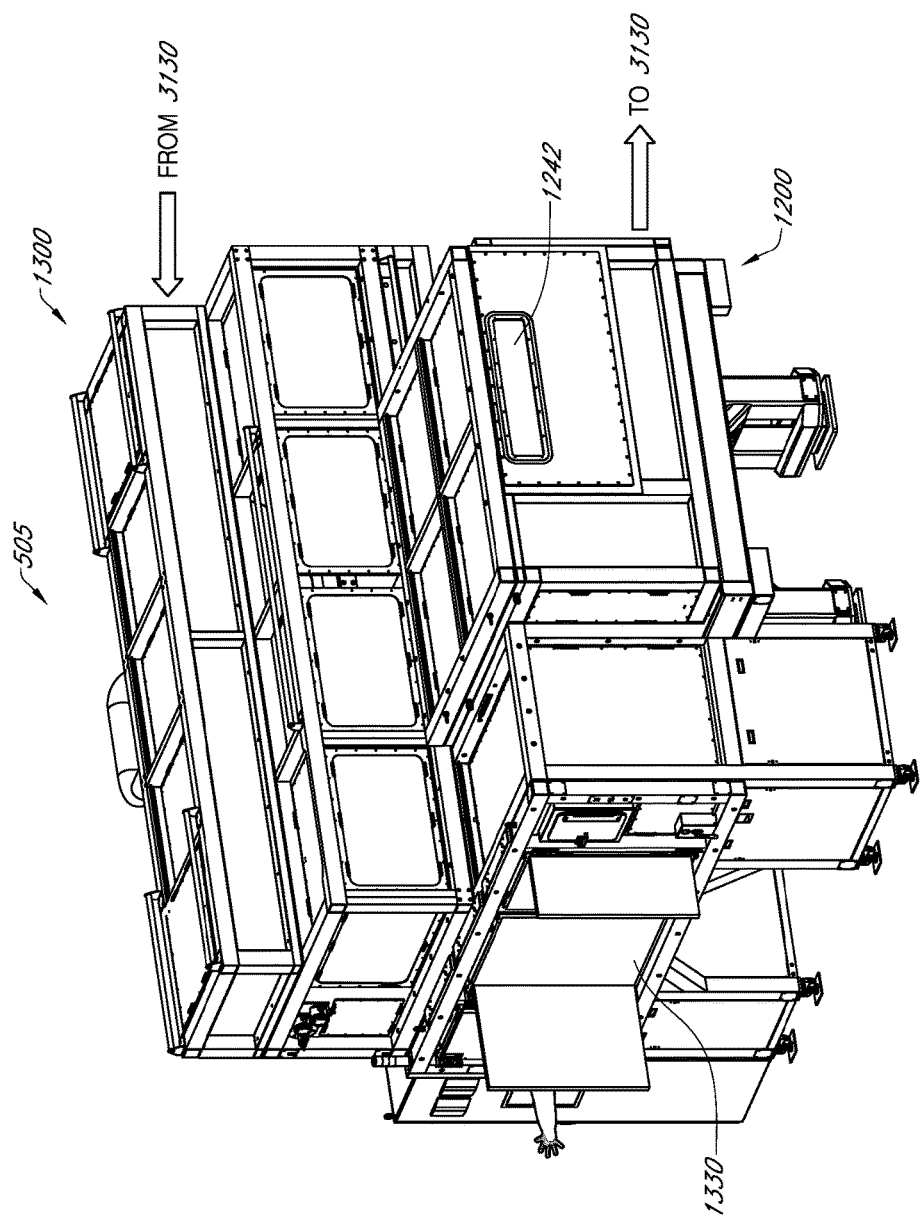

For example, as depicted in FIG. 13A through FIG. 13D, gas enclosure system 505 can have first tunnel enclosure section 1200, which can have inlet gate 1242 for receiving a substrate, and bridge enclosure section 1300, as well as auxiliary enclosure 1330, which can be sealably isolated from the remaining volume of gas enclosure system 505. As previously discussed herein for FIG. 3A and FIG. 3B, purified inert gas from a purification system, such as purification system 3130 of FIG. 8 and FIG. 9, can circulate into gas enclosure system 505, for example, into bridge enclosure section 1300, from a gas purification inlet line, such as gas purification inlet line 3133 of FIG. 3A, FIG. 3B, FIG. 6, FIG. 8 and FIG. 9. As depicted In FIG. 13A, during, for example, a printing procedure, inert gas can be circulated to a gas purification system, such as purification system 3130 of FIG. 8 and FIG. 9, from a gas purification outlet line, such as gas purification outlet line 3131A of FIG. 3A. As depicted in FIG. 13B, during, for example, a maintenance procedure, auxiliary enclosure 1330 can be opened to the external environment for access after being sealably isolated from the remaining volume of gas enclosure system 505. During such a procedure, inert gas can be circulated to a gas purification system, such as purification system 3130 of FIG. 8 and FIG. 9, from a gas purification outlet line, such as gas purification outlet line 31316 of FIG. 3B. Purified inert gas can be returned to gas enclosure system 505 from a gas purification system, such as purification system 3130 of FIG. 8 and FIG. 9, from a gas purification inlet line, such as gas purification inlet line 3133 of FIG. 3A, FIG. 3B, FIG. 6, FIG. 8 and FIG. 9.

Figure 13C:
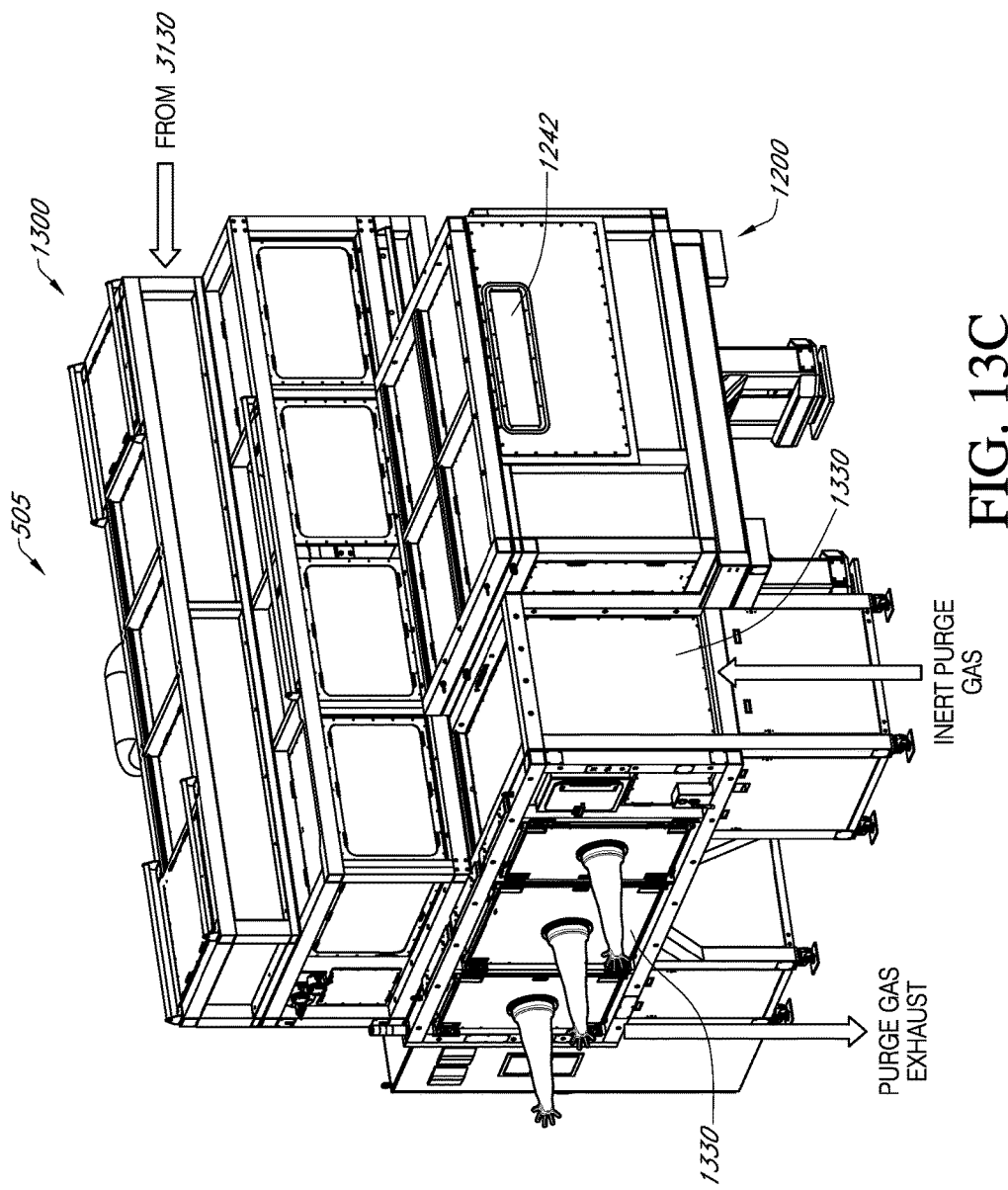
Figure 13D:
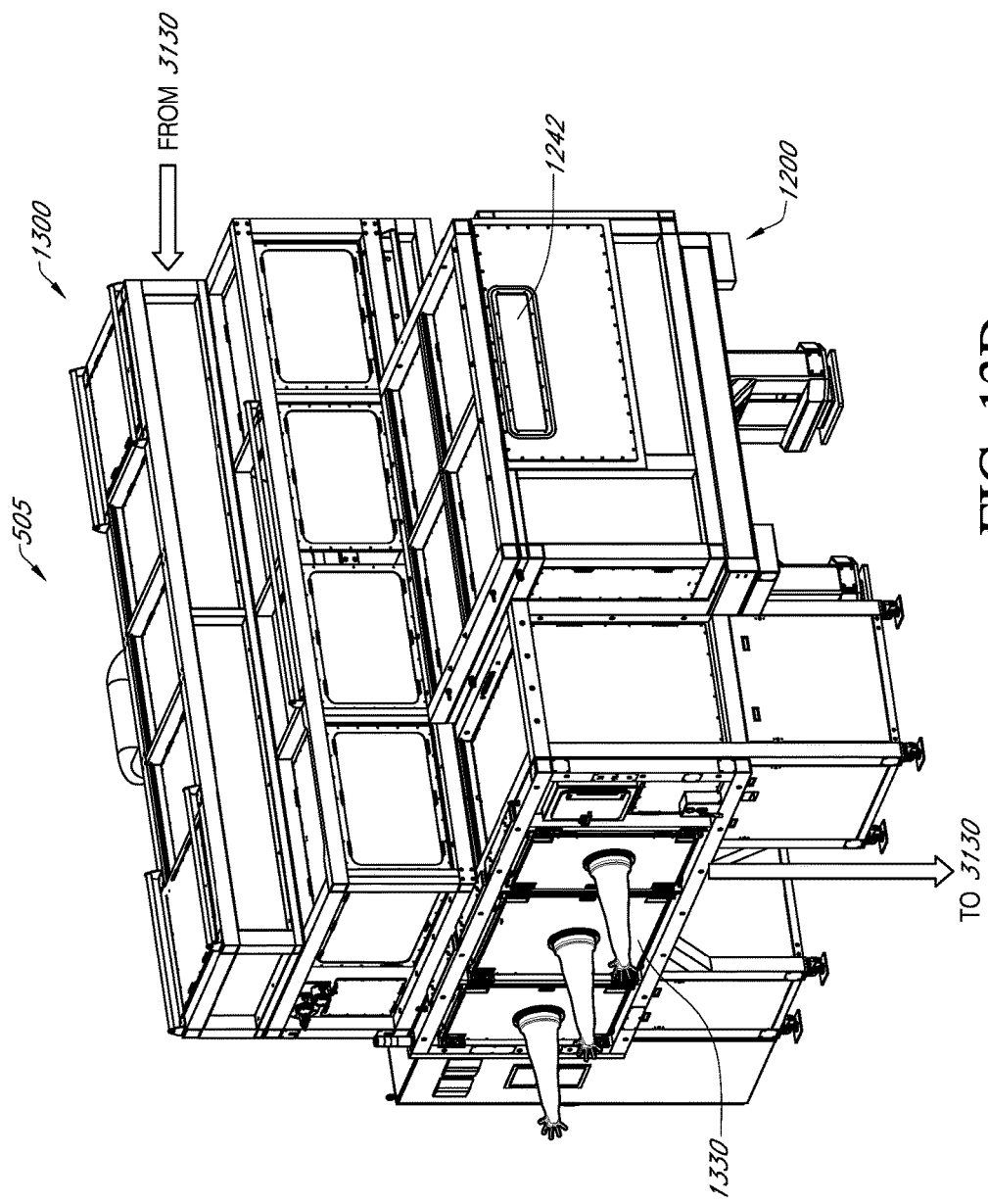

As depicted in FIG. 13C, after a procedure, such as a maintenance procedure, has been completed, auxiliary enclosure 1330 can be isolated from the external environment. During, for example, a recovery procedure for auxiliary enclosure 1330 after it has been opened to the external environment for access, an inert purge gas from an inert gas source, such as inert gas source 3201 of FIG. 10A and FIG. 11A, can be circulated through auxiliary enclosure 1330 while it is still sealably isolated from the remaining volume of gas enclosure system 505. During such a procedure, inert gas can be circulated to a gas purification system, such as purification system 3130 of FIG. 8 and FIG. 9, from a gas purification outlet line, such as gas purification outlet line 3131B of FIG. 3B. Purified inert gas can be returned to gas enclosure system 505 from a gas purification system, such as purification system 3130 of FIG. 8 and FIG. 9, from a gas purification inlet line, such as gas purification inlet line 3133 of FIG. 3A, FIG. 3B, FIG. 8 and FIG. 9. Finally, as depicted in FIG. 13D, once auxiliary enclosure 1330 has been fully recovered, as depicted in gas enclosure system 505 can be returned to the same flow communication path as described for FIG. 13A.

It should be understood that various alternatives to the embodiments of the disclosure described herein may be employed in practicing the disclosure. For example, while vastly different arts such as chemistry, biotechnology, high technology and pharmaceutical arts may benefit from the present teachings. OLED printing is used to exemplify the utility of various embodiments of a gas enclosure system according to the present teachings. Various embodiments of a gas enclosure system that may house an OLED printing system can provide features such as, but not limited by, a controlled, low-particle environment in a contoured enclosure volume, and ready access from the exterior to the interior during processing, as well as during maintenance. Such features of various embodiments of a gas enclosure system may have an impact on functionality, such as, but not limited by, structural integrity providing ease of maintaining low levels of reactive species during processing, as well as rapid enclosure-volume turnover minimizing downtime during maintenance cycles. As such, various features and specifications providing utility for OLED panel printing may also provide benefit to a variety of technology areas.

While embodiments of the present disclosure have been shown and described herein, it will be obvious to those skilled in the art that such embodiments are provided by way of example only. Numerous variations, changes, and substitutions will now occur to those skilled in the art without departing from the disclosure. It is intended that the following claims define the scope of the disclosure and that methods and structures within the scope of these claims and their equivalents be covered thereby.

What is claimed is:

1. A system for printing a substrate, comprising:
    a gas enclosure comprising a tunnel enclosure section and a bridge enclosure section;
    a substrate support apparatus positioned within the tunnel enclosure section;
    a printing system bridge extending over the substrate support apparatus and positioned within the bridge enclosure section;
    a first gas circulation and filtration system operably coupled to the tunnel enclosure section; and
    a second gas circulation and filtration system operably coupled to the bridge enclosure section.

2. The system of claim 1, wherein the first gas circulation and filtration system comprises flow guiding structures arranged to define a gas flow path along a surface of the substrate support apparatus facing toward the printing system bridge.

3. The system of claim 1, further comprising a gas purification system operably coupled to the gas enclosure.

4. The system of claim 1, wherein the tunnel enclosure section and the bridge enclosure section are in flow communication with each other through an opening connecting the tunnel enclosure section and the bridge enclosure section.

5. The system of claim 1, wherein each of the first gas circulation and filtration system and the second gas circulation and filtration system comprises a fan and a filter unit disposed downstream of the fan.

6. The system of claim 5, wherein each of the first gas circulation and filtration system and the second gas circulation and filtration system further comprises a heat exchanger.

7. The system of claim 5, wherein each of the first gas circulation and filtration system and the second gas circulation and filtration system further comprises a diffuser.

8. The system of claim 1, further comprising a printhead assembly movably mounted to the printing system bridge.

9. The system of claim 1, further comprising a gas source fluidically coupled to an interior of the gas enclosure.

10. The system of claim 9, wherein the gas source comprises an inert gas source.

11. The system of claim 1, wherein the gas enclosure is configured to contain a controlled processing environment established in an interior of the gas enclosure.

12. The system of claim 1, wherein the substrate support apparatus comprises a floatation table.

13. The system of claim 1, wherein the substrate support apparatus comprises a vacuum chuck.

14. The system of claim 1, wherein the second gas circulation and filtration system comprises a service bundle housing exhaust system fluidically coupled to service bundle housing through which a service bundle for the printing system is routed.

15. The system of claim 1, wherein the first gas circulation and filtration system comprises one or more baffles arranged to directing gas through the tunnel enclosure section and one or more filters disposed in the tunnel enclosure section.

16. The system of claim 1, wherein the second gas circulation and filtration system comprises ductwork arranged to direct gas through the bridge enclosure section and one or more filters in flow communication with the ductwork.

17. The system of claim 1, further comprising a pressurized gas recirculation system operably coupled to the gas enclosure.

18. A system for printing a substrate, comprising:
a gas enclosure;
a substrate support apparatus positioned in an interior of the gas enclosure;
a printing system bridge positioned in the interior of the gas enclosure, the printing system bridge extending over the substrate support apparatus; and
a multi-zone gas circulation system comprising a plurality of flow control structures arranged to circulate gas along a first defined path relative to the substrate support apparatus and to circulate gas along a second defined path relative to the printing system bridge.

19. The system of claim 18, wherein the substrate support apparatus is positioned in an interior of a tunnel enclosure section of the gas enclosure, the first defined path being located in the interior of the tunnel enclosure section.

20. The system of claim 18, wherein the printing system bridge is positioned in an interior of a bridge enclosure section of the gas enclosure, the second defined path being located in the interior of the bridge enclosure section.

21. The system of claim 18, wherein the first defined path follows a direction in which the printing system bridge extends.

22. The system of claim 18, wherein the plurality of flow control structures are further arranged to circulate gas along a transition zone flow path from the first defined path to the second defined path.

23. The system of claim 18, wherein each of the first defined path and the second defined path pass through one or more filters.

24. The system of claim 18, wherein the flow control structures are chosen from at least one of ducts, plenums, baffles, blowers, and fans.

25. The system of claim 18, wherein the substrate support apparatus comprises a floatation table.

26. The system of claim 18, wherein the substrate support apparatus comprises a vacuum chuck.

27. The system of claim 18, further comprising a gas purification system operably coupled to the gas enclosure.

28. The system of claim 18, further comprising a pressurized gas recirculation system operably coupled to the gas enclosure.

29. The system of claim 18, further comprising a gas source fluidically coupled to an interior of the gas enclosure.

30. The system of claim 29, wherein the gas source comprises an inert gas source.

31. The system of claim 18, wherein the gas enclosure is configured to contain a controlled processing environment established in an interior of the gas enclosure.

* * * * *